(12) United States Patent
Iizuka et al.

(10) Patent No.: US 8,279,610 B2
(45) Date of Patent: Oct. 2, 2012

(54) ELECTRONIC COMPONENT PACKAGE, BASE OF ELECTRONIC COMPONENT PACKAGE, AND JUNCTION STRUCTURE OF ELECTRONIC COMPONENT PACKAGE AND CIRCUIT SUBSTRATE

(75) Inventors: Minoru Iizuka, Kakogawa (JP); Koichi Kishimoto, Kakogawa (JP); Kozo Shibutani, Kakogawa (JP); Kentaro Nakanishi, Kakogawa (JP)

(73) Assignee: Daishinku Corporation, Kakogawa-shi (JP)

( * ) Notice: Subject to any disclaimer, the term of this patent is extended or adjusted under 35 U.S.C. 154(b) by 311 days.

(21) Appl. No.: 12/674,505

(22) PCT Filed: Aug. 21, 2008

(86) PCT No.: PCT/JP2008/064914
§ 371 (c)(1),
(2), (4) Date: Feb. 22, 2010

(87) PCT Pub. No.: WO2009/025320
PCT Pub. Date: Feb. 26, 2009

(65) Prior Publication Data
US 2011/0114353 A1    May 19, 2011

(30) Foreign Application Priority Data

Aug. 23, 2007 (JP) .................. 2007-216859
Sep. 14, 2007 (JP) .................. 2007-238742
Sep. 21, 2007 (JP) .................. 2007-246280

(51) Int. Cl.
*H05K 1/00* (2006.01)
*H05K 1/18* (2006.01)

(52) U.S. Cl. .................. 361/748; 361/760; 361/734

(58) Field of Classification Search .................. 361/748, 361/816, 818, 508, 734, 738, 759–760, 766, 361/728–730; 310/313 R, 313 A, 313 B, 310/320, 365, 366
See application file for complete search history.

(56) References Cited

U.S. PATENT DOCUMENTS

| | | | |
|---|---|---|---|
| 5,585,687 A * | 12/1996 | Wakabayashi et al. | 310/366 |
| 5,966,052 A * | 10/1999 | Sakai | 331/68 |
| 6,229,404 B1 * | 5/2001 | Hatanaka | 331/68 |
| 6,576,999 B2 * | 6/2003 | Sakai et al. | 257/730 |
| 6,760,227 B2 * | 7/2004 | Sakai et al. | 361/736 |

(Continued)

FOREIGN PATENT DOCUMENTS

JP   2002-076813 A   3/2002

(Continued)

*Primary Examiner* — Hung S Bui
(74) *Attorney, Agent, or Firm* — Marvin A. Motsenbocker; Mots Law, PLLC

(57) ABSTRACT

An electronic component package has a base in the shape of a rectangle as viewed from the top, and a metal lid. A terminal electrode on a base bottom surface and a circuit substrate are joined using a conductive adhesive material. In the electronic component package, a first terminal electrode group including two or more terminal electrodes formed in parallel is formed eccentrically to one corner position of the base bottom surface, and a single second terminal electrode, or a second terminal electrode group including two or more terminal electrodes formed in parallel, is formed eccentrically only to a first diagonal position diagonally opposite the one corner position. Also, no-electrode regions in which no terminal electrode is formed along a short side of the base are provided at another corner position facing the one corner position in a short side direction of the base, and a second diagonal position diagonally opposite the other corner position. At least one of the terminal electrodes is a ground terminal electrode connected to the metal lid.

22 Claims, 18 Drawing Sheets

U.S. PATENT DOCUMENTS

| | | | |
|---|---|---|---|
| 6,998,926 B2 * | 2/2006 | Miyazaki et al. | 331/68 |
| 7,132,737 B2 * | 11/2006 | Miyazaki | 257/678 |
| 7,427,822 B2 * | 9/2008 | Kusai | 310/344 |
| 7,748,184 B1 * | 7/2010 | Wheeler et al. | 52/309.1 |
| 7,928,635 B2 * | 4/2011 | Nagano et al. | 310/344 |
| 2004/0135645 A1 * | 7/2004 | Koyama et al. | 331/158 |
| 2005/0184625 A1 * | 8/2005 | Miyazaki | 310/348 |

FOREIGN PATENT DOCUMENTS

| | | |
|---|---|---|
| JP | 2005-108923 A | 4/2005 |
| JP | 2005-244939 A | 9/2005 |
| JP | 2006-196702 A | 7/2006 |

* cited by examiner

ELECTRONIC COMPONENT PACKAGE, BASE OF ELECTRONIC COMPONENT PACKAGE, AND JUNCTION STRUCTURE OF ELECTRONIC COMPONENT PACKAGE AND CIRCUIT SUBSTRATE

TECHNICAL FIELD

The present invention relates to an electronic component package used in an electronic apparatus or the like, a base of the electronic component package, and a junction structure of the electronic component package and a circuit substrate.

BACKGROUND ART

There are electronic components that require hermetic enclosure, including, for example, piezoelectric resonator devices, such as a crystal resonator, a crystal filter, a crystal oscillator and the like. In each product, a metal thin film electrode is formed on a surface of a crystal resonator plate, and the crystal resonator plate (specifically, the metal thin film electrode) is hermetically enclosed so as to protect the metal thin film electrode from ambient air.

Since components are typically surface-mounted, these piezoelectric resonator devices are increasingly often hermetically accommodated in a package made of a ceramic material. For example, Patent Document 1 discloses a configuration which includes a base (mounting substrate) having a crystal resonator plate mounting portion, and a lid (cover) having an inverted U-shaped cross-section, where a package made of a ceramic material that hermetically encloses the base and the lid is mounted on a circuit substrate and joined thereto using a conductive adhesive material, such as solder or the like.

In a conventional piezoelectric resonator device, a terminal electrode is formed on a bottom surface of the base. The terminal is extended from the bottom surface to a side surface of the base by a castellation formed on the side surface of the base so as to confirm a connection state depending on the migration of solder (conductive adhesive material).

Incidentally, for a circuit substrate on which a conventional piezoelectric resonator device is mounted, a so-called glass epoxy substrate is widely used, which is obtained by impregnating a glass fiber mesh with an epoxy resin material. The glass epoxy substrate is advantageous in terms of machinability and cost. Also, a solder paste is applied on an electrode pattern of the circuit substrate using screen printing or the like. Thereafter, the piezoelectric resonator device package is mounted on the circuit substrate with the terminal electrode of the piezoelectric resonator device package being overlaid on the electrode pattern of the circuit substrate. The solder paste is melted in a melting furnace (a heating furnace, etc.), so that the piezoelectric resonator device is joined to the circuit substrate by the solder.

Patent Document 1: JP 2002-76813 A

DISCLOSURE OF INVENTION

Problem to be Solved by the Invention

However, a difference in thermal expansion between the package and the circuit substrate may cause stress on the solder that joins the package and the circuit substrate, resulting in a crack. In particular, a package made of a ceramic material (e.g., alumina, etc.) and a circuit substrate made of a glass epoxy substrate may be used in combination for heat resistant applications (e.g., in-car use, etc.). In this case, the package and the circuit substrate are used in a high temperature environment. Therefore, the thermal expansion coefficient of the circuit substrate becomes larger than the thermal expansion coefficient of the package, so that a fatigue fracture is likely to occur in the solder. Thus, a significant solder crack problem arises in a high temperature environment, though it is not serious in normal temperature environments. If there is an impact on the package and the circuit substrate, the package will fall off the circuit substrate at a solder crack portion.

The present invention has been made to solve the aforementioned problems. An object of the present invention is to provide an electronic component package that can be more reliably mounted on a circuit substrate, a base of the electronic component package, and a junction structure of the electronic component package and a circuit substrate.

Means for Solving the Problem

To achieve the object, a base of an electronic component package for holding an electronic component element according to the present invention is provided. The base has a bottom surface having a rectangular shape as viewed from above, and on the bottom surface, a plurality of terminal electrodes that are to be joined to an external circuit substrate using a conductive adhesive material are formed. A first terminal electrode group including two or more of the terminal electrodes formed in parallel is formed eccentrically to one corner position of the bottom surface. A second terminal electrode including one of the terminal electrodes or a second terminal electrode group including two or more of the terminal electrodes formed in parallel is formed eccentrically to a first diagonal position diagonally opposite the one corner position of the bottom surface. Another corner position facing the one corner position in a short side direction of the bottom surface, and a second diagonal position diagonally opposite the other corner position of the bottom surface, are no-electrode regions in which none of the terminal electrodes is formed. At least one of the plurality of terminal electrodes is a ground terminal electrode. Moreover, an electronic component package according to the present invention has the base for holding the electronic component element according to the present invention, and a metal lid for hermetically enclosing the electronic component element. The ground terminal electrode is electrically connected to the metal lid. Specifically, when the electronic component package of the present invention is applied to a surface mount-type crystal resonator, the ground terminal electrode is used as a member electrically connected to the metal lid. When the electronic component package of the present invention is applied to a crystal filter, the ground terminal electrode may be used as a ground electrode for the filter. When the electronic component package of the present invention is applied to a crystal oscillator, the ground terminal electrode may be used as a member electrically connected to the metal lid, or when an IC is used as an electronic component element, it may be used as a ground terminal electrode for the IC.

Since the first terminal electrode group and the second terminal electrode or the second terminal electrode group are formed with this configuration, when the electronic component package is electrically and mechanically joined to the circuit substrate using the conductive adhesive material, such as solder or the like, the connectivity is not reduced. Also, when the electronic component package is electrically and mechanically joined to the circuit substrate using a conductive adhesive material, a thermal expansion difference may occur between the electronic component package (specifically, the base) and the circuit substrate. Even in this case, since another corner position facing the one corner position in the short side direction of the bottom surface of the base, and a second diagonal position diagonally opposite the other corner position of the bottom surface of the base, are to be no-electrode regions in which none of the terminal electrodes is formed, stress generated at the junction of the electronic component package (specifically, the base) can be relieved toward the no-electrode regions. As a result, it is possible to prevent stress from being concentrated at the conductive adhesive material interposed between the electronic component package and the circuit substrate, thereby making it difficult for a fatigue fracture to occur in the conductive adhesive material. Also, by dividing at least one of the first terminal electrode group and the second terminal electrode or the second terminal electrode group that are diagonally opposite each other, the total perimeter of the terminal electrodes is increased, thereby making it difficult for a crack opening (e.g., a solder crack) to occur in the conductive adhesive material.

In particular, if a base that is made of a ceramic material is used with respect to the circuit substrate that is made of a glass epoxy substrate, then when the electronic component package, in which the terminal electrodes are formed by metallization, is joined to the circuit substrate using a conductive adhesive material, a significant difference between their thermal expansions is likely to occur, which leads to the adverse influence of a crack (e.g., a solder crack) in the conductive adhesive material. By contrast, according to the present invention, even for a combination of these members (configuration), stress on the electronic component package (specifically, the base) is reduced, thereby preventing the occurrence of a crack in the conductive adhesive material interposed between the electronic component package and the circuit substrate. Also, a terminal electrode structure that can reduce stress caused by thermal expansion can be obtained by a conventional metallization technique without a particular processing step, resulting in a considerably easy and low-cost formation.

In Patent Document 1, a two-terminal configuration is provided with respect to the terminal electrodes on the bottom surface of the base. The terminals have a region in which portions of the terminal electrodes on sides facing each other are formed facing each other and a region in which the terminal electrodes do not face each other. Conventionally, this terminal configuration cannot support an electronic component that includes a terminal electrode that is not directly connected to an electronic component element. In particular, this terminal configuration does not support an electronic component that includes a ground terminal electrode. Therefore, additionally, it is not possible to take measures against electromagnetic noise.

By contrast, the present invention not only achieves the object, but also can solve this additional problem. Therefore, the reliability of the mounting and the junction of an electronic component package and a circuit substrate can be improved, and moreover, a more reliable electronic component package for which measures against electromagnetic susceptibility (EMS) can be easily taken can be achieved.

Specifically, according to the present invention, as described above, one of the three or more terminal electrodes formed can be set as the ground terminal electrode electrically connected to the metal lid. Therefore, electromagnetic noise occurring in an external circuit substrate can be captured by the metal lid and removed via the ground terminal electrode. As a result, it is possible to eliminate the adverse influence of electromagnetic noise on an electronic component element in the electronic component package.

Therefore, the adverse influence of a crack (e.g., a solder crack) or the like in the conductive adhesive material is suppressed, so that the reliability of the mounting and junction of the electronic component package to the circuit substrate can be improved, and moreover, a more reliable electronic component package for which measures against EMS can be easily taken can be achieved.

Also, in addition to the aforementioned configuration, the first terminal electrode group may be formed eccentrically to one corner position of the bottom surface of the base. A second terminal electrode group may be formed eccentrically to a first diagonal position diagonally opposite the one corner position of the bottom surface of the base. The first and second terminal electrode groups may be symmetrically formed about a center point as viewed from above of the bottom surface of the base.

With such a configuration, in addition to the aforementioned operational effect, the directionality of each terminal electrode group (the first and second terminal electrode groups) is removed, so that stress can be efficiently reduced in a uniform manner with respect to the center point (as viewed from above) of the bottom surface of the base. As a result, it is possible to dramatically suppress the occurrence of a crack (e.g., a solder crack) in the conductive adhesive material.

Also, in the configuration, in the first terminal electrode group, the terminal electrode closest to the one corner position (the one corner position of the bottom surface of the base) may have a larger area or a broader width than those of the other terminal electrodes. In the second terminal electrode group, the terminal electrode closest to the first diagonal position (one corner position of the bottom surface of the base) may have a larger area or a broader width than those of the other terminal electrodes.

In this case, in addition to the aforementioned operational effect, while regions close to the one corner position and the first diagonal position of the base are set so as to be junction regions having the greatest junction strength between the electronic component package and the circuit substrate due to the conductive adhesive material, the junction strength can be stepwise reduced from the terminal electrodes formed in parallel (the first and second terminal electrode groups) toward the no-electrode regions. As a result, even if a thermal expansion difference between the electronic component package (specifically, the base) and the circuit substrate occurs, the action of relieving the stress on the electronic component package (specifically, the base) from the terminal electrode forming region of the base (specifically, the first and second terminal electrode groups) toward the no-electrode regions is further improved. In other words, the reduction of stress from two-dimensional rotation about the center point (as viewed from above) of the electronic component package (specifically, the base) is improved, so that stress can be efficiently reduced in a uniform manner, thereby making it possible to dramatically suppress the occurrence of a crack (e.g., a solder crack) or the like in the conductive adhesive material.

Also, in the aforementioned configuration, in the first terminal electrode group, one of the terminal electrodes may have a larger area or a broader width than those of the other terminal electrodes, and may be electrically connected to an electronic component element. In the second terminal electrode group, one of the terminal electrodes may have a larger area or a broader width than those of the other terminal electrodes, and may be electrically connected to an electronic component element.

In this case, in addition to the aforementioned operational effect, a deterioration in electrical connectivity between the electronic component package (specifically, the base) and the circuit substrate due to the conductive adhesive material is avoided. In addition, the risk of a poor electrical connection in a measuring probe for testing or the like with respect to the terminal electrodes for an electronic component element is eliminated, so that more correct and highly reliable testing can be achieved, leading to a contribution that improves the electrical performance or yield of an electronic component.

Also, in this configuration, in the first and second terminal electrode groups, a gap dimension between the adjacent terminal electrodes may be set to 0.1 mm or more, and a dimension in the short side direction of the bottom surface of the base of the no-electrode region may be set to 15% to 40% of a dimension in the short side direction of the bottom surface of the base.

In this case, in addition to the aforementioned operational effect, while the risk of a short circuit between the terminal electrodes formed in parallel (adjacent) in the first and second terminal electrode groups is avoided, performance in the reduction of stress on the electronic component package (specifically, the base) from the terminal electrode forming regions of the base (specifically, the first and second terminal electrode groups) toward the no-electrode regions is not reduced. Specifically, by setting a gap dimension between the terminal electrodes formed in parallel to 0.1 mm or more, the risk of a short circuit between the terminal electrodes formed in parallel can be eliminated.

In addition, if the dimension of each of the no-electrode regions is set to less than 15% of the full dimension in the short side direction of the bottom surface of the base, the action of reducing stress from two-dimensional rotation about the center point (as viewed from above) of the electronic component package (specifically, the base) is not likely to work effectively, so that the occurrence of a crack or the like in the conductive adhesive material cannot be suppressed. Also, if the dimensions of each of the no-electrode regions is set to more than 40% of the full dimension in the short side direction of the bottom surface of the base, it is difficult to secure a sufficient gap dimension between the terminal electrodes formed in parallel. In this case, not only will the risk of a short circuit between the terminal electrodes formed in parallel increase, but the dimensions (the area or the width) of the terminal electrodes will have to be reduced more than necessary. In particular, if the sizes of the terminal electrodes are reduced, the junction strength between the electronic component package and the circuit substrate of the conductive adhesive material may be reduced or the electrical connectivity of the electronic component element may deteriorate.

Also, another base of an electronic component package for holding an electronic component element according to the present invention is provided so as to achieve the object. The base has a bottom surface having a rectangular shape as viewed from above, and on the bottom surface, a plurality of terminal electrodes that are to be joined to an external circuit substrate using a conductive adhesive material are formed. A first terminal electrode including one of the terminal electrodes is formed eccentrically to one corner position of the bottom surface. A second terminal electrode including one of the terminal electrodes is formed eccentrically to a first diagonal position diagonally opposite the one corner position of the bottom surface. Another corner position facing the one corner position in a short side direction of the bottom surface, and a second diagonal position diagonally opposite the other corner position of the bottom surface, are no-electrode regions in which none of the terminal electrodes is formed. A ground terminal electrode is formed at a center point as viewed from above of the bottom surface, and the area of the ground terminal electrode is smaller than the area of the first terminal electrode and the area of the second terminal electrode. Moreover, an electronic component package according to the present invention has the base for holding the electronic component element according to the present invention, and a metal lid for hermetically enclosing the electronic component element. The ground terminal electrode is electrically connected to the metal lid. Specifically, when the electronic component package of the present invention is applied to a surface mount-type crystal resonator, the ground terminal electrode is used as a member electrically connected to the metal lid. When the electronic component package of the present invention is applied to a crystal filter, the ground terminal electrode may be used as a ground electrode for the filter. When the electronic component package of the present invention is applied to a crystal oscillator, the ground terminal electrode may be used as a member electrically connected to the metal lid, or when an IC is used as an electronic component element, it may be used as a ground terminal electrode for the IC.

Since the first and second terminal electrodes are formed with this configuration, when the electronic component package is electrically and mechanically joined to the circuit substrate using a conductive adhesive material, such as solder or the like, the connectivity is not reduced. Also, when the electronic component package is electrically and mechanically joined to the circuit substrate using the conductive adhesive material, a thermal expansion difference may occur between the electronic component package (specifically, the base) and the circuit substrate. Even in this case, since another corner position facing the one corner position in the short side direction of the bottom surface of the base, and a second diagonal position diagonally opposite the other corner position of the bottom surface of the base, are no-electrode regions in which none of the terminal electrodes is formed, stress generated at the junction of the electronic component package (specifically, the base) can be relieved toward the no-electrode regions. As a result, it is possible to prevent stress from being concentrated at the conductive adhesive material interposed between the electronic component package and the circuit substrate, thereby making it difficult for a fatigue fracture to occur in the conductive adhesive material.

In particular, if a base that is made of a ceramic material is used with respect to the circuit substrate that is made of a glass epoxy substrate, then when the electronic component package in which the terminal electrodes are formed by metallization is joined to the circuit substrate using the conductive adhesive material, a significant difference between their thermal expansions is likely to occur, which leads to the adverse influence of a crack (e.g., a solder crack) in the conductive adhesive material. By contrast, according to the present invention, even for a combination of these members (configuration), stress on the electronic component package (specifically, the base) is reduced, thereby preventing the occurrence of a crack in the conductive adhesive material interposed between the electronic component package and the circuit substrate. Also, a structure of the terminal electrodes that can reduce stress caused by thermal expansion can be obtained by a conventional metallization technique without a particular processing step, resulting in a considerably easy and low-cost formation.

In Patent Document 1, a two-terminal configuration is provided with respect to the terminal electrodes on the bottom surface of the base. The terminals have a region in which portions of the terminal electrodes on sides facing each other are formed facing each other and a region in which the terminal electrodes do not face each other. Conventionally, this terminal configuration cannot support an electronic component that includes a terminal electrode that is not directly connected to an electronic component element. In particular, this terminal configuration does not support an electronic component that includes a ground terminal electrode. Therefore, additionally, it is not possible to take measures against electromagnetic noise.

By contrast, the present invention not only achieves the object, but also can solve this additional problem. Therefore, the reliability of the mounting and the junction of an electronic component package and a circuit substrate can be improved, and moreover, a more reliable electronic component package for which measures against electromagnetic susceptibility (EMS) can be easily taken can be achieved.

Specifically, according to the present invention, as described above, the ground terminal electrode electrically connected to the metal lid is formed at the center point as viewed from above of the bottom surface of the base, and the area of the ground terminal electrode is smaller than the area of the first terminal electrode and the area of the second terminal electrode. Therefore, electromagnetic noise occurring in an external circuit substrate can be captured by the metal lid and removed via the ground terminal electrode, without hindering stress reduction. As a result, it is possible to eliminate the adverse influence of electromagnetic noise on an electronic component element in the electronic component package.

Therefore, the adverse influence of a crack or the like in the conductive adhesive material is suppressed, so that the reliability of mounting and junction of the electronic component package to the circuit substrate can be improved, and moreover, a more reliable electronic component package for which measures against EMS can be easily taken can be achieved.

Also, to achieve the object, another base of an electronic component package for holding an electronic component element according to the present invention is provided. The base has a bottom surface having a rectangular shape as viewed from above, and on the bottom surface, a plurality of terminal electrodes that are to be joined to an external circuit substrate using a conductive adhesive material are formed. A first terminal electrode including one of the terminal electrodes or a first terminal electrode group including two or more of the terminal electrodes formed in parallel is formed eccentrically to one corner position of the bottom surface. A second terminal electrode including one of the terminal electrodes or a second terminal electrode group including two or more of the terminal electrodes formed in parallel is formed eccentrically to a first diagonal position diagonally opposite the one corner position of the bottom surface. Another corner position facing the one corner position in a short side direction of the bottom surface, and a second diagonal position diagonally opposite the other corner position of the bottom surface, are no-electrode regions in which none of the terminal electrodes is formed. A castellation is formed from at least a side surface to the bottom surface of the base. A side-surface terminal electrode connected to the terminal electrode is formed on the castellation. Moreover, an electronic component package according to the present invention has the base for holding the electronic component element according to the present invention, and a lid for hermetically enclosing the electronic component element. Specifically, when the electronic component package of the present invention is applied to a surface mount-type crystal resonator, the ground terminal electrode is used as a member electrically connected to the metal lid. When the electronic component package of the present invention is applied to a crystal filter, the ground terminal electrode may be used as a ground electrode for the filter. When the electronic component package of the present invention is applied to a crystal oscillator, the ground terminal electrode may be used as a member electrically connected to the metal lid, or when an IC is used as an electronic component element, it may be used as a ground terminal electrode for the IC.

Since the first terminal electrode or the first terminal electrode group, and a second terminal electrode or the second terminal electrode group are formed with this configuration, when the electronic component package is electrically and mechanically joined to the circuit substrate using the conductive adhesive material, such as solder or the like, the connectivity is not reduced. Also, when the electronic component package is electrically and mechanically joined to the circuit substrate using the conductive adhesive material, a thermal expansion difference may occur between the electronic component package (specifically, the base) and the circuit substrate. Even in this case, since another corner position facing the one corner position in the short side direction of the bottom surface of the base, and a second diagonal position diagonally opposite the other corner position of the bottom surface of the base, are no-electrode regions in which none of the terminal electrodes is formed, stress generated during junction of the electronic component package (specifically, the base) can be relieved toward the no-electrode regions. As a result, it is possible to prevent the stress from being concentrated on the conductive adhesive material interposed between the electronic component package and the circuit substrate, thereby making it difficult for a fatigue fracture to occur from the conductive adhesive material.

In particular, if a base that is made of a ceramic material is used with respect to the circuit substrate that is made of a glass epoxy substrate, then when the electronic component package in which the terminal electrodes are formed by metallization is joined to the circuit substrate using the conductive adhesive material, a significant difference between their thermal expansions is likely to occur, which leads to the adverse influence of a crack (e.g., a solder crack) in the conductive adhesive material. By contrast, according to the present invention, even for a combination of these members (configuration), stress on the electronic component package (specifically, the base) is reduced, thereby preventing the occurrence of a crack in the conductive adhesive material interposed between the electronic component package and the circuit substrate. Also, a structure of the terminal electrodes that can reduce stress caused by thermal expansion can be obtained by a conventional metallization technique without a particular processing step, resulting in a considerably easy and low-cost formation.

Incidentally, in recent years, a surface mount-type electronic component is mounted onto a circuit substrate by reflow soldering. Specifically, a solder paste is applied to an interconnection pad of the circuit substrate, and a terminal electrode of the surface mount type electronic component is overlaid and mounted on the interconnection pad and, thereafter, the solder paste is melted in a heating furnace or the like, thereby soldering.

By contrast, in the terminal configuration of Patent Document 1 described above, when an electronic component package (specifically, a base) is mounted on a circuit substrate by reflow soldering, the electronic component package (specifically, a base) may be two-dimensionally rotated, depending on the shape or area of the interconnection pad of the circuit substrate. Such a phenomenon is likely to appear when terminal electrodes are arranged at diagonal positions of the base as in Patent Document 1. Therefore, an improvement is required for an electronic component package in which terminal electrodes are arranged at diagonal positions.

By contrast, the present invention not only can achieve the object, but also can solve this problem. The present invention can provide a more reliable electronic component package in which the reliability of the mounting and junction of an electronic component package and a circuit substrate is improved.

Specifically, according to the present invention, as described above, a castellation is formed from at least a side surface to the bottom surface of the base. A side-surface terminal electrode connected to the terminal electrode is formed on the castellation. Therefore, the formation of a fillet of the conductive adhesive material is promoted with respect to the side-surface terminal electrode, so that the fillet of the conductive adhesive material enters the castellation, resulting in an anchoring effect. As a result, not only is the junction strength between the electronic component package and the circuit substrate improved, but also any force that two-dimensionally rotates the electronic component package (specifically, the base) is prevented by the fillet of the conductive adhesive material.

Also, by forming the castellation at a side of the bottom surface of the base, the area of the castellation can be increased as compared to when the castellation is formed at a corner portion of the bottom surface of the base. Therefore, the strength of the electronic component package (specifically, the base) is not decreased.

Therefore, not only the adverse influence of a crack or the like in the conductive adhesive material is suppressed, but also the electronic component package (specifically, the base) is not two-dimensionally rotated when it is mounted. Therefore, the reliability of the mounting and junction of the electronic component package to the circuit substrate is improved, resulting in a more reliable electronic component package.

Also, in the configuration, the castellation may be formed at middle portions of both short sides of the bottom surface of the base.

In this case, in addition to the aforementioned operational effect, tension forces can be generated in opposite directions along the long side direction of the electronic component package (specifically, the base). Therefore, not only is the junction strength of the electronic component package and the circuit substrate can be further improved, but also a force that two-dimensionally rotates the electronic component package (specifically, the base) can be further suppressed. In particular, the castellations formed at the middle portions of both the short sides of the base preferably have the same shape and face each other. With this configuration, uniform fillet formation of the conductive adhesive material is promoted on the side-surface terminal electrodes facing each other. Therefore, the fillet of the conductive adhesive material enters the castellations, resulting in an anchoring effect. As a result, tension is generated, pulling the electronic component package (specifically, the base) equally in opposite directions along the long side direction, so that a force that two-dimensionally rotates the electronic component package (specifically, the base) can be further suppressed.

Also, in the configuration, the castellation may be formed at both the long sides of the bottom surface of the base.

In this case, in addition to the aforementioned operational effect, tension forces can be generated in opposite directions along the short side direction of the electronic component package (specifically, the base). Therefore, not only can the junction strength of the electronic component package and the circuit substrate be further improved, but also a force that two-dimensionally rotates the electronic component package (specifically, the base) can be further suppressed. In particular, the castellations formed at the middle portions of both the long sides of the base preferably have the same shape and face each other. With this configuration, uniform fillet formation of the conductive adhesive material is promoted on the side-surface terminal electrodes facing each other. Therefore, the fillet of the conductive adhesive material enters the castellations, resulting in an anchoring effect. As a result, tension is generated, pulling the electronic component package (specifically, the base) equally in opposite directions along the long side direction, so that a force that two-dimensionally rotates the electronic component package (specifically, the base) can be further suppressed.

Also, in the configuration, the side-surface terminal electrode may be elongated (extended) to an upper edge portion (upper surface) of the base. Specifically, the side-surface terminal electrode is extended from a bottom surface portion (bottom surface) of the base to the upper edge portion. Therefore, in addition to the aforementioned operational effect, the migration capabilities of the fillet of the conductive adhesive material formed on the side-surface terminal electrode can be improved. Therefore, it can be expected that the junction strength of the electronic component package and the circuit substrate is improved, and the suppression of two-dimensional rotation of the electronic component package (specifically, the base) is improved. In addition, since the visibility of the fillet of the conductive adhesive material is improved, inspection can be more reliably conducted, so that the reliability of the mounting and junction of the electronic component package to the circuit substrate can be further improved.

Also, in this configuration, bumps made from the same metallization material are formed on a part of the terminal electrodes.

In this case, in addition to the aforementioned operational effect, stress can be more efficiently reduced, and a high buffering effect is obtained. In addition, the conductive adhesive material is accumulated in a gap portion created by the bump. As a result, the area where the terminal electrode on which the bump is formed and the circuit substrate are joined is increased, thereby making it possible to enhance the junction strength between the electronic component package (specifically, the base) and the circuit substrate. Also, the bump can be formed with considerable ease and low cost by laminating the same metallization material.

Also, in the configuration, the bump may be formed on the first terminal electrode or the first terminal electrode group. The bump may be formed on the second terminal electrode or the second terminal electrode group. The bump formed on the first terminal electrode or the first terminal electrode group, and the bump formed on the second terminal electrode or the second terminal electrode group, may be separated in the long side direction of the bottom surface of the base.

In this case, preferably, when the electronic component package is joined to the circuit substrate via the conductive adhesive material, stress generated in the circuit substrate due to a difference in thermal expansion coefficient between the electronic component package (specifically, the base) and the circuit substrate can be relieved in a thickness direction, so that the stress can be reduced.

Also, in the configuration, the bump may be formed on the first terminal electrode or the first terminal electrode group. The bump may be formed on the second terminal electrode or the second terminal electrode group. The bump formed on the first terminal electrode or the first terminal electrode group, and the bump formed on the second terminal electrode or the second terminal electrode group, may be provided close to each other in a long side direction of the bottom surface of the base.

In this case, preferably, when the electronic component package is joined to the circuit substrate via the conductive adhesive material, stress generated in the circuit substrate due to a difference in thermal expansion coefficient between the electronic component package (specifically, the base) and the circuit substrate can be relieved in a plane direction (by expansion or contraction), so that the stress can be reduced.

Also, to achieve the object, a junction structure between an electronic component package and a circuit substrate according to the present invention is provided. A rectangular interconnection pad is formed on the circuit substrate. The electronic component package has a base for holding an electronic component element, and a lid for hermetically enclosing the electronic component element. The base has a bottom surface having a rectangular shape as viewed from above. A plurality of rectangular terminal electrodes that are to be joined to the interconnection pad on the circuit substrate using a conductive adhesive material are formed on the bottom surface of the base. A first terminal electrode including one of the terminal electrodes is formed eccentrically to one corner position of the bottom surface of the base. A second terminal electrode including one of the terminal electrodes is formed eccentrically to a first diagonal position diagonally opposite the one corner position of the bottom surface of the base. The first terminal electrode and the second terminal electrode are symmetrically formed about a center point as viewed from above of the bottom surface of the base. Another corner position facing the one corner position in a short side direction of the bottom surface of the base, and a second diagonal position diagonally opposite the other corner position of the bottom surface of the base, are no-electrode regions in which none of the terminal electrodes is formed. When the terminal electrode is overlaid on and joined to the interconnection pad, a smallest gap dimension from a plan view near a no-electrode-region edge portion of the first terminal electrode in the short side direction of the bottom surface of the base to an edge portion as viewed from above of the interconnection pad, and a smallest gap dimension from an edge portion in a plan view near a no-electrode region of the second terminal electrode in the short side direction of the bottom surface of the base to an edge portion as viewed from above of the interconnection pad, are the same smallest gap dimension G1. When the terminal electrode is overlaid on and joined to the interconnection pad, a smallest gap dimension from an edge portion near a one corner in a plan view of the first terminal electrode in the short side direction of the bottom surface of the base to an edge portion as viewed from above of the interconnection pad, and a smallest gap dimension from an edge portion near a one corner in a plan view of the second terminal electrode in the short side direction of the bottom surface of the base to an edge portion as viewed from above of the interconnection pad, are the same smallest gap dimension G2. When the terminal electrode is overlaid on and joined to the interconnection pad, a smallest gap dimension from an edge portion near a no-electrode region in a plan view of the first terminal electrode in a long side direction of the bottom surface of the base to an edge portion as viewed from above of the interconnection pad, and a smallest gap dimension from an edge portion near a no-electrode region in a plan view of the second terminal electrode in the long side direction of the bottom surface of the base to an edge portion as viewed from above of the interconnection pad, are the same smallest gap dimension G3. The smallest gap dimension G1 and the smallest gap dimension G3 are the same.

Since the first and second terminal electrodes are formed with this configuration, when the electronic component package is electrically and mechanically joined to the circuit substrate using the conductive adhesive material, such as solder or the like, the connectivity is not reduced. Also, when the electronic component package is electrically and mechanically joined to the circuit substrate using the conductive adhesive material, a thermal expansion difference may occur between the electronic component package (specifically, the base) and the circuit substrate. Even in this case, since another corner position facing the one corner position in the short side direction of the bottom surface of the base, and a second diagonal position diagonally opposite the other corner position of the bottom surface of the base, are no-electrode regions in which none of the terminal electrodes is formed, stress generated during junction of the electronic component package (specifically, the base) can be relieved toward the no-electrode regions. As a result, it is possible to prevent the stress from being concentrated on the conductive adhesive material interposed between the electronic component package and the circuit substrate, thereby making it difficult for a fatigue fracture to occur from the conductive adhesive material.

In particular, if a base that is made of a ceramic material is used with respect to the circuit substrate that is made of a glass epoxy substrate, then when the electronic component package in which the terminal electrodes are formed by metallization is joined to the circuit substrate using the conductive adhesive material, a significant difference between their thermal expansions is likely to occur, which leads to the adverse influence of a crack (e.g., a solder crack) in the conductive adhesive material. By contrast, according to the present invention, even for a combination of these members (configuration), stress on the electronic component package (specifically, the base) is reduced, thereby preventing the occurrence of a crack in the conductive adhesive material interposed between the electronic component package and the circuit substrate. Also, a structure of the terminal electrodes that can reduce stress caused by thermal expansion can be obtained by a conventional metallization technique without a particular processing step, resulting in a considerably easy and low-cost formation.

Incidentally, in recent years, a surface mount type electronic component is mounted onto a circuit substrate by reflow soldering. Specifically, a solder paste is applied to an interconnection pad of the circuit substrate, and a terminal electrode of the surface mount type electronic component is overlaid and mounted on the interconnection pad, and thereafter, the solder paste is melted in a heating furnace or the like, thereby soldering.

By contrast, in the terminal configuration of Patent Document 1 described above, when an electronic component package (specifically, a base) is mounted on a circuit substrate by reflow soldering, the electronic component package (specifically, a base) may be two-dimensionally rotated, depending on the shape or area of the interconnection pad of the circuit substrate. Such a phenomenon is likely to appear when terminal electrodes are arranged at diagonal positions of the base as in Patent Document 1. Therefore, an improvement is required for an electronic component package in which terminal electrodes are arranged at diagonal positions.

By contrast, the present invention not only can achieve the object, but also can solve this problem. The present invention can provide a more reliable electronic component package in which the reliability of the mounting and the junction of an electronic component package and a circuit substrate is improved.

Specifically, according to the present invention, as described above, the first and second terminal electrodes are symmetrically formed about the center point as viewed from above of the bottom surface of the base. When the terminal electrode is overlaid on and joined to the interconnection pad, a smallest gap dimension from an edge portion near a no-electrode region in a plan view of the first terminal electrode in the short side direction of the bottom surface of the base to an edge portion as viewed from above of the interconnection pad, and a smallest gap dimension from an edge portion near a no-electrode region in a plan view of the second terminal electrode in the short side direction of the bottom surface of the base to an edge portion as viewed from above of the interconnection pad, are the same smallest gap dimension G1. When the terminal electrode is overlaid on and joined to the interconnection pad, a smallest gap dimension from an edge portion near the one corner in a plan view of the first terminal electrode in the short side direction of the bottom surface of the base to an edge portion as viewed from above of the interconnection pad, and a smallest gap dimension from an edge portion near the one corner in a plan view of the second terminal electrode in the short side direction of the bottom surface of the base to an edge portion as viewed from above of the interconnection pad, are the same smallest gap dimension G2. When the terminal electrode is overlaid on and joined to the interconnection pad, a smallest gap dimension from an edge portion near the one corner in a plan view of the first terminal electrode in the long side direction of the bottom surface of the base to an edge portion as viewed from above of the interconnection pad, and a smallest gap dimension from an edge portion near a no-electrode region in a plan view of the second terminal electrode in the long side direction of the bottom surface of the base to an edge portion as viewed from above of the interconnection pad, are the same smallest gap dimension G3. The smallest gap dimension G1 and the smallest gap dimension G3 are the same.

With the configuration of the present invention, a width dimension of a fillet of the conductive adhesive material formed from the plan-view-near-no-electrode-region edge portion of the first terminal electrode in the short side direction of the bottom surface of the base to the edge portion as viewed from above of the interconnection pad, and a width dimension of a fillet of the conductive adhesive material formed from the plan-view-near-no-electrode-region edge portion of the second terminal electrode in the short side direction of the bottom surface of the base to the edge portion as viewed from above of the interconnection pad, are the same fillet width dimension F1. A width dimension of a fillet of the conductive adhesive material formed from the edge portion near the one corner in a plan view of the first terminal electrode in the short side direction of the bottom surface of the base to the plan-view edge portion of interconnection pad, and a width dimension of a fillet of the conductive adhesive material from the plan-view-near-corner edge portion at the first diagonal position of the second terminal electrode in the short side direction of the bottom surface of the base to the plan-view edge portion of the interconnection pad, are the same fillet width dimension F2. A width dimension of a fillet of the conductive adhesive material from the plan-view-near-no-electrode-region edge portion of the first terminal electrode in the long side direction of the bottom surface of the base to the plan-view edge portion of the interconnection pad, and a width dimension of a fillet of the conductive adhesive material from the plan-view-near-no-electrode-region edge portion of the second terminal electrode in the long side direction of the bottom surface of the base to the plan-view edge portion of the interconnection pad, are the same fillet width dimension F3. The fillet width dimension F1 and the fillet width dimension F3 are the same.

Therefore, the tension forces caused by the fillets of the conductive adhesive material of the first and second terminal electrodes are balanced, so that a force that two-dimensionally rotates the electronic component package (specifically, the base) is suppressed. In particular, by setting the gap dimensions G1 and G3 to be the same, the force that two-dimensionally rotates from the first and second terminal electrodes toward the no-electrode regions, respectively, is effectively suppressed.

Therefore, not only the adverse influence of a crack (e.g., a solder crack) or the like in the conductive adhesive material is suppressed, but also the electronic component package (specifically, the base) is not two-dimensionally rotated when it is mounted. Therefore, the reliability of mounting and junction of the electronic component package to the circuit substrate is improved, resulting in a more reliable electronic component package.

Also, in the configuration, when the terminal electrodes are overlaid on and joined to the interconnection pads, a smallest gap dimension from the edge portion near the one corner in a plan view of the first terminal electrode in the long side direction of the bottom surface of the base to the plan-view edge portion of the interconnection pad, and a smallest gap dimension from the edge portion near the one corner in a plan view of the second terminal electrode in the long side direction of the bottom surface of the base to the edge portion near the one corner in a plan view of the interconnection pad, may be the same smallest gap dimension G4.

In this case, in addition to the aforementioned operational effect, a width dimension of a fillet of the conductive adhesive material formed from the edge portion near the one corner in a plan view of the first terminal electrode in the long side direction of the bottom surface of the base to the plan-view edge portion of the interconnection pad, and a width dimension of a fillet of the conductive adhesive material formed from the edge portion near the one corner in a plan view of the second terminal electrode in the long side direction of the bottom surface of the base to the plan-view edge portion of the interconnection pad, are the same width dimension F4. Therefore, tension forces caused by the fillets of the conductive adhesive material of the first and second terminal electrodes are balanced, so that the electronic component package (specifically, the base) is prevented from being displaced in the long side direction. Therefore, the force that two-dimensionally rotates the electronic component package (specifically, the base) due to the displacement can also be suppressed. As a result, the force that two-dimensionally rotates the electronic component package (specifically, the base) can be further suppressed.

Also, in the configuration, the smallest gap dimension G2 and the smallest gap dimension G4 may be the same.

In this case, in addition to the aforementioned operational effect, the fillet width dimensions F2 and F4 of the conductive adhesive material are the same. The fillets of the conductive adhesive material have substantially the same tension force, so that a force that two-dimensionally rotates the electronic component package (specifically, the base) is not generated.

Also, in the configuration, a circumferential gap region (GA1) from the edge portions of the first terminal electrode to the edge portions of the interconnection pad, and a circumferential gap region (GA2) from the edge portions of the terminal electrode to the edge portions of the interconnection pad may be symmetrically formed about the center point (plan-view center point) of the bottom surface of the base.

In this case, in addition to the aforementioned operational effect, the fillets of the conductive adhesive material formed in the first and second terminal electrodes have substantially the same shape as each other. Moreover, the fillets of the conductive adhesive material formed in the first and second terminal electrodes are symmetrically formed about the center point of the bottom surface of the base. Therefore, the fillets of the conductive adhesive material have substantially the same tension force, so that a force that two-dimensionally rotates the electronic component package (specifically, the base) is not generated.

Also, in the configuration, bumps made of the same metallization material may be formed on a part of the terminal electrodes.

In this case, in addition to the aforementioned operational effect, stress can be more efficiently reduced, and a high buffering effect is obtained. In addition, the conductive adhesive material is accumulated in a gap portion created by the bump. As a result, the area where the terminal electrode on which the bump is formed and the circuit substrate are joined is increased, thereby making it possible to enhance the junction strength between the electronic component package (specifically, the base) and the circuit substrate. Also, the bump can be formed with considerable ease and low cost by laminating the same metallization material.

Also, to achieve the object, another base of an electronic component package for holding an electronic component element according to the present invention is provided. The base has a bottom surface having a rectangular shape as viewed from above, and on the bottom surface, a plurality of terminal electrodes that are to be joined to an external circuit substrate using a conductive adhesive material are formed. A first terminal electrode including one of the terminal electrodes is formed eccentrically to one corner position of the bottom surface. A second terminal electrode including one of the terminal electrodes is formed eccentrically to a first diagonal position diagonally opposite the one corner position of the bottom surface. Another corner position facing the one corner position in a short side direction of the bottom surface, and a second diagonal position diagonally opposite the other corner position of the bottom surface, are no-electrode regions in which none of the terminal electrodes is formed. A division line along a side direction of the bottom surface is provided, and at least one of the first and second terminal electrodes is divided by the division line. Moreover, an electronic component package according to the present invention has the base for holding the electronic component element according to the present invention, and a lid for hermetically enclosing the electronic component element. Specifically, when the electronic component package of the present invention is applied to a surface mount-type crystal resonator, the ground terminal electrode is used as a member electrically connected to the metal lid. When the electronic component package of the present invention is applied to a crystal filter, the ground terminal electrode may be used as a ground electrode for the filter. When the electronic component package of the present invention is applied to a crystal oscillator, the ground terminal electrode may be used as a member electrically connected to the metal lid, or when an IC is used as an electronic component element, it may be used as a ground terminal electrode for the IC.

Since the first and second terminal electrodes are formed with this configuration, when the electronic component package is electrically and mechanically joined to the circuit substrate using the conductive adhesive material, such as solder or the like, the connectivity is not reduced. Also, when the electronic component package is electrically and mechanically joined to the circuit substrate using the conductive adhesive material, a thermal expansion difference may occur between the electronic component package (specifically, the base) and the circuit substrate. Even in this case, since another corner position facing the one corner position in the short side direction of the bottom surface of the base, and a second diagonal position diagonally opposite the other corner position of the bottom surface of the base, are no-electrode regions in which none of the terminal electrodes is formed, stress generated during junction of the electronic component package can be relieved toward the no-electrode regions. As a result, it is possible to prevent the stress from being concentrated on the conductive adhesive material interposed between the electronic component package and the circuit substrate, thereby making it difficult for a fatigue fracture to occur from the conductive adhesive material.

Also, a division line in a side direction of the bottom surface of the base is provided so that at least one of the first and second terminal electrodes is divided by the division line. Therefore, the total perimeters of the terminal electrodes are increased, thereby making it difficult for a crack opening (e.g., a solder crack) to occur in the conductive adhesive material.

In particular, if a base that is made of a ceramic material is used with respect to the circuit substrate that is made of a glass epoxy substrate, then when the electronic component package in which the terminal electrodes are formed by metallization is joined to the circuit substrate using the conductive adhesive material, a significant difference between their thermal expansions is likely to occur, which leads to the adverse influence of a crack (e.g., a solder crack) in the conductive adhesive material. By contrast, according to the present invention, even for a combination of these members (configuration), stress on the electronic component package (specifically, the base) is reduced, thereby preventing the occurrence of a crack in the conductive adhesive material interposed between the electronic component package and the circuit substrate. Also, a structure of the terminal electrodes that can reduce stress caused by thermal expansion can be obtained by a conventional metallization technique without a particular processing step, resulting in a considerably easy and low-cost formation.

Specifically, according to the present invention, as described above, at least one of the first and second terminal electrodes is divided by the division line extending in a side direction of the bottom surface of the base. Therefore, an electronic component package is obtained in which the adverse influence of a crack or the like in the conductive adhesive material is suppressed, and the reliability of mounting and junction of the electronic component package to the circuit substrate is improved.

Also, according to the configuration, at least one of the first and second terminal electrodes is divided by the division line extending in a side direction of the bottom surface of the base. Therefore, uniform junction regions of the terminal electrodes are obtained, thereby preventing a variation in their joined state (mounted state), joined to the circuit substrate. As a result, when the base is joined to the circuit substrate, unnecessary expansion and contraction stress in the long side direction or the short side direction of the base does no occur.

Also, according to the configuration, at least one of the first and second terminal electrodes is divided by the division line extending in a side direction of the bottom surface of the base. Therefore, even when the terminal electrodes are formed eccentrically to the one corner position and the first diagonal position, and the other corner position and the second diagonal position are formed as no-electrode regions, three or more terminal electrodes can be formed on the base, so that the characteristic operational effect can be provided. Specifically, when the base is joined to the circuit substrate, stress is relieved to the no-electrode regions, so that unnecessary expansion and contraction stress in the long side direction or the short side direction of the base does not occur. Also, terminal electrode regions of terminal electrodes actually facing each other on the base are formed, so that the three-dimensional twist of the electronic component package (specifically, the base) on the circuit substrate can be suppressed while the junction strength between the base to the circuit substrate can be increased. As a result, it is possible to reduce the influence of a defect, such as warping of the circuit substrate caused by mounting the base on the circuit substrate 4, or the like.

Also, in the configuration, the first and second terminal electrodes may be each divided by the division line. Division electrodes obtained by dividing the first and second terminal electrodes by the division line and closer to the no-electrode regions may be provided at middle portions of both short sides of the bottom surface of the base, facing each other.

In this case, the operational effect by division of at least one of the first and second terminal electrodes with the division line extending in a side direction of the bottom surface of the base, becomes significant. Specifically, the division electrodes obtained by dividing the first and second terminal electrodes with division lines are provided in the no-electrode regions, respectively, facing the respective middle portions of both the short sides of the bottom surface of the base. Therefore, not only the adverse influence of a crack (e.g., a solder crack) or the like in the conductive adhesive material can be suppressed, but also the electronic component package (specifically, the base) is prevented from being two-dimensionally rotated when it is mounted.

Also, in the configuration, the lid may be a metal lid, and the division electrode may be a ground terminal electrode electrically connected to the metal lid.

In this case, the division electrode is set as a ground terminal electrode electrically connected to the metal lid. Therefore, electromagnetic noise occurring in an external circuit substrate can be captured by the metal lid and removed via the ground terminal electrode. As a result, it is possible to eliminate an adverse influence of electromagnetic noise on an electronic component element in the electronic component package without reducing the bond strength of the electronic component package to the circuit substrate.

Effects of the Invention

According to the present invention, the reliability of mounting and junction of the electronic component package to the circuit substrate can be improved.

Figure 1:
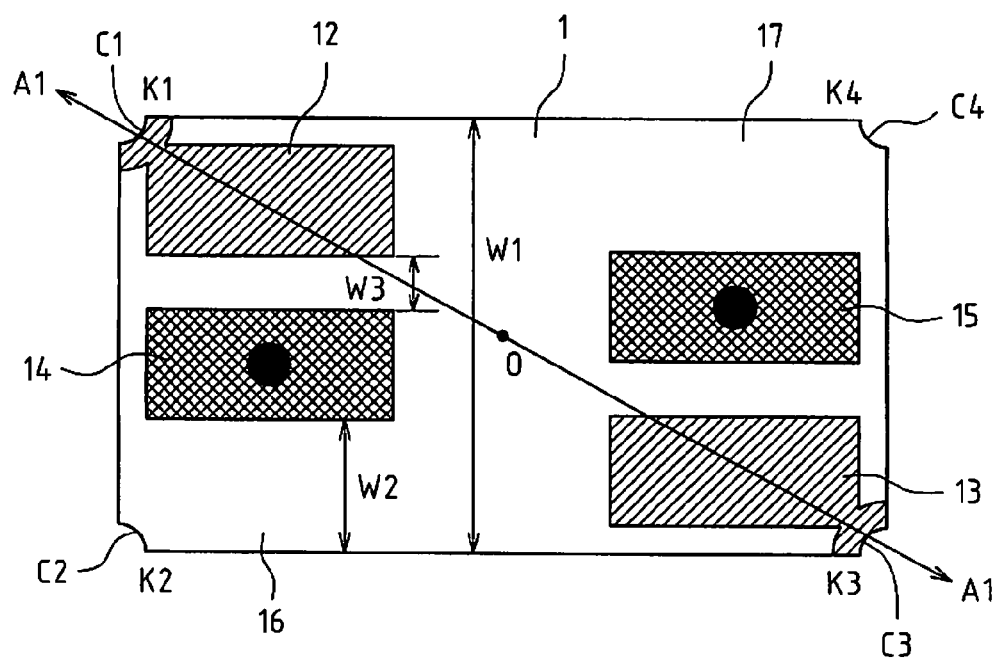
FIG. 1 is a schematic diagram of a surface mount-type crystal resonator according to Example 1 of the present invention as viewed from below.

BRIEF DESCRIPTION OF REFERENCE NUMERALS 1 base
2 lid
3 crystal resonator plate (electronic component element)
4 circuit substrate

DESCRIPTION OF THE INVENTION

Hereinafter, embodiments of the present invention will be described with reference to the accompanying drawings. Note that, in the examples that follow, the present invention is applied to a surface mount-type crystal resonator as an electronic component.

Example 1

Figure 2:
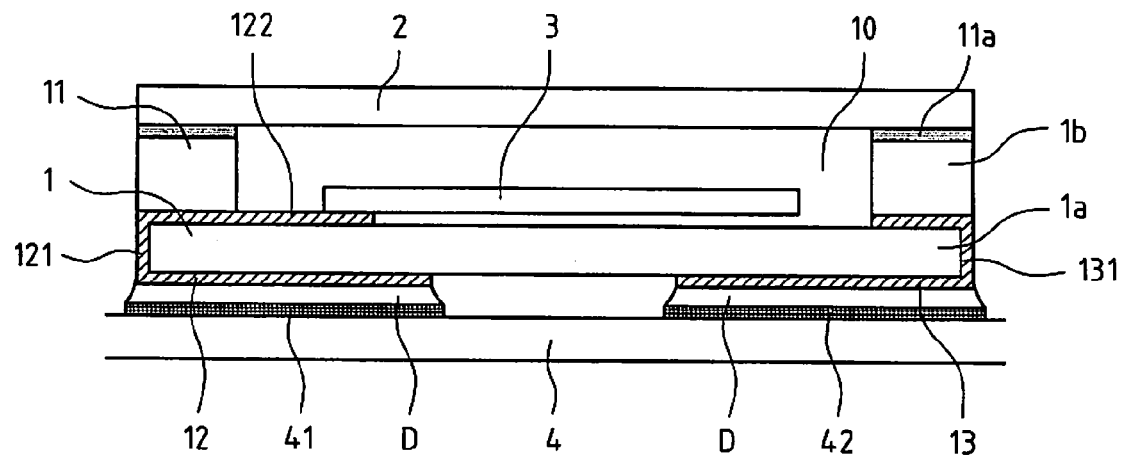
FIG. 2 is a partial cross-sectional view taken along line A1-A1 of FIG. 1, schematically showing the surface mount type crystal resonator mounted on a circuit substrate.
Figure 3:
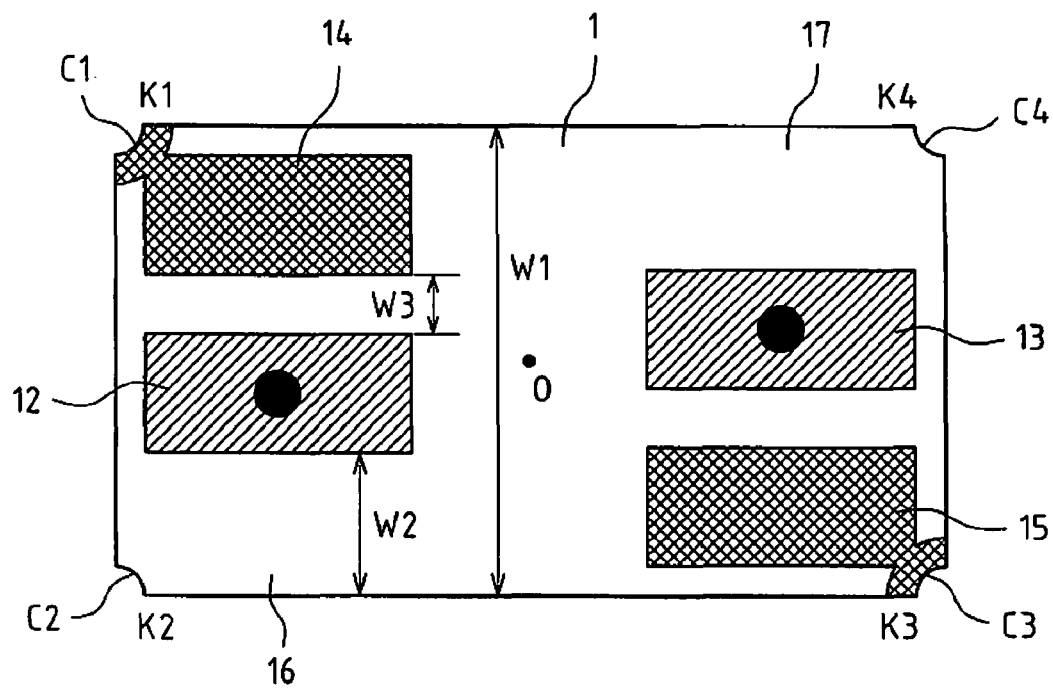
FIG. 3 is a schematic diagram of a surface mount-type crystal resonator according to a variation of Example 1 as viewed from below.
Figure 4:
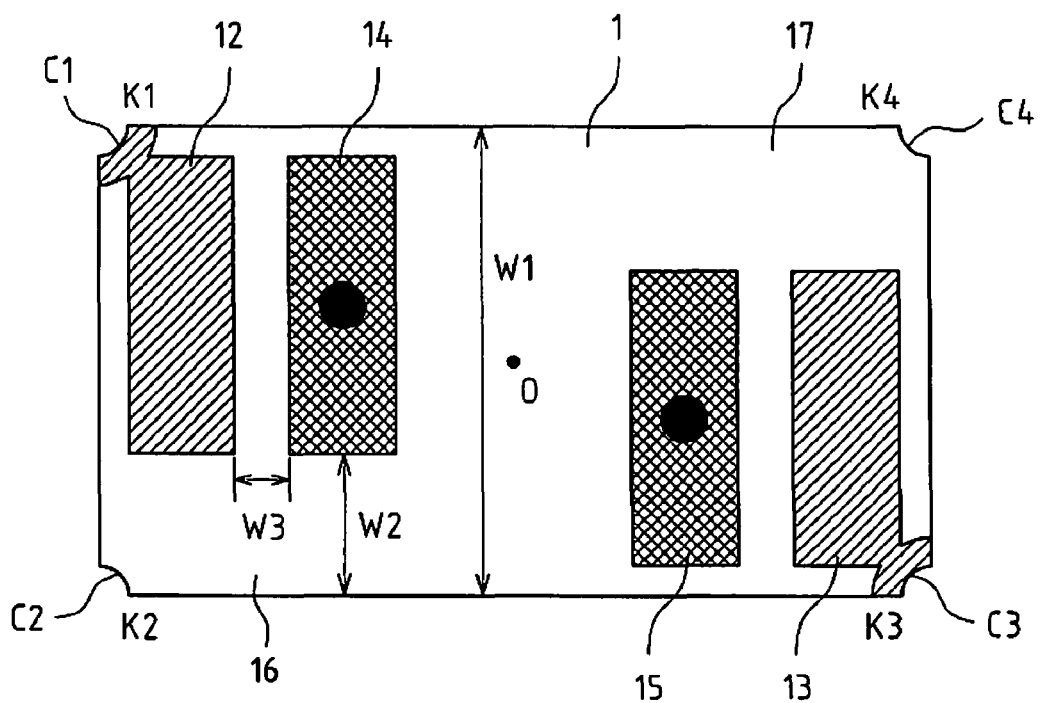
FIG. 4 is a schematic diagram of a surface mount-type crystal resonator according to a variation of Example 1 as viewed from below.
Figure 5:
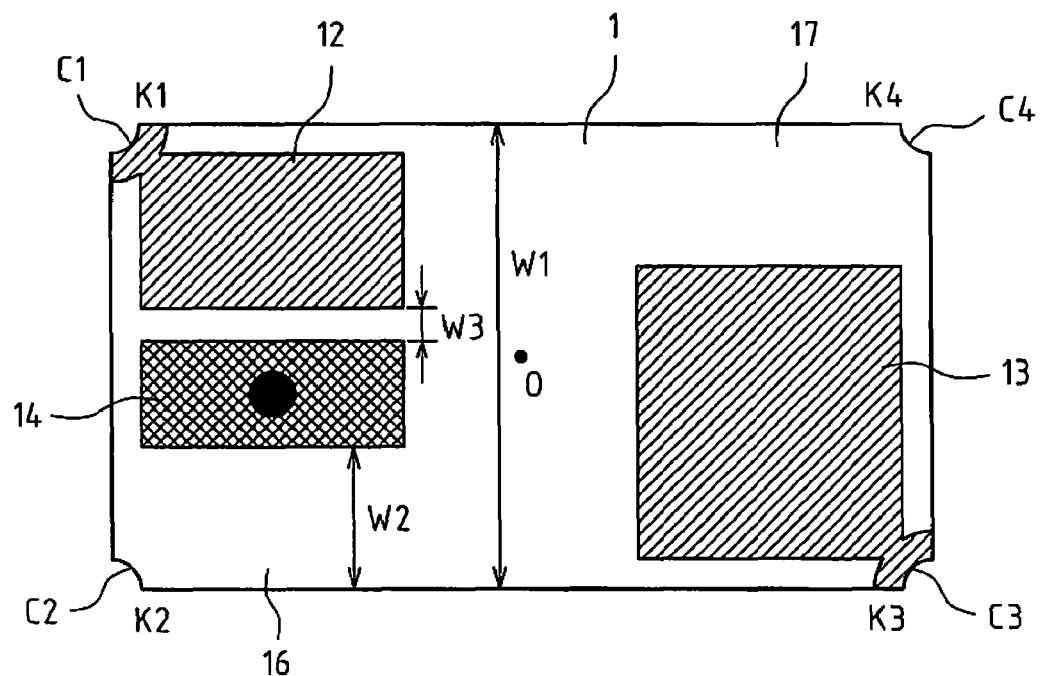
FIG. 5 is a schematic diagram of a surface mount-type crystal resonator according to a variation of Example 1 as viewed from below.

A surface mount-type crystal resonator according to Example 1 of the present invention will be described with reference to the drawings. FIG. 1 is a schematic diagram of the surface mount type crystal resonator of Example 1 as viewed from below. FIG. 2 is a partial cross-sectional view taken along line A1-A1 of FIG. 1, schematically showing the surface mount type crystal resonator mounted on a circuit substrate. FIGS. 3 to 5 are schematic diagrams of a surface mount-type crystal resonator according to a variation of Example 1 as viewed from below.

As shown in FIGS. 1 and 2, the surface mount type crystal resonator of Example 1 includes a crystal resonator plate 3 that is an electronic component element, a base 1 that has a concave portion with an opening at an upper portion thereof and holds (accommodates) the crystal resonator plate 3, and a lid 2 (a metal lid as used herein) that is joined to the opening portion of the base 1 to hermetically enclose the crystal resonator plate 3 held by the base 1.

The base 1 is in the shape of a rectangular prism and is made of an appropriate multilayer of a ceramic (e.g., alumina, etc.) and a conductive material (e.g., tungsten, molybdenum, etc.). As shown in FIG. 2, the base 1 has an accommodation portion 10 having a concave cross-section, and a bank portion 11 that is provided at a periphery of the accommodation portion 10, surrounding the accommodation portion 10. Specifically, the base 1 includes a ceramic base main body 1a in the shape of a rectangular plate (as viewed from above), and a ceramic frame 1b that has a large hollow portion at a middle thereof and has substantially the same outer size (as viewed from above) as that of the base main body 1a. A conductive material 11a is stacked on an upper surface of the frame 1b. The base main body 1a, the frame 1b and the conductive material 11a are integrally baked.

Note that an upper surface of the bank portion 11 is flat, on which a sealing member and a metal layer (not shown) are formed on the bank portion 11. In Example 1, for example, the metal layer is configured by forming a nickel plating layer and a gold plating layer on an upper surface of a metallized layer made of tungsten, molybdenum or the like.

Castellations C1, C2, C3 and C4 are vertically formed at four corners K1, K2, K3 and K4 of an outer circumference (outer periphery as viewed from above) of the base 1. Specifically, the castellations C1, C2, C3 and C4 are formed, extending from a bottom surface to a top surface (upper surface) of the base 1, at the four corners K1, K2, K3 and K4 of the outer circumference (outer periphery as viewed from above) of the base 1 and on side surfaces of the base 1. Side-surface terminal electrodes 121 and 131 that are linking electrodes are formed below the castellation C1 and C3 (extending from the bottom surface to a lower portion of side surfaces of the base 1). The side-surface terminal electrodes 121 and 131 are electrically linked (connected) to terminal electrodes 12 and 13 described below.

The bottom surface of the base 1 is caused to be in the shape of a rectangle as viewed from above. On the bottom surface of the base 1, four terminal electrodes 12, 13, 14 and 15 are formed that are to be joined to an external circuit substrate 4 (see FIG. 2) using a conductive adhesive material D. The terminal electrodes 12 and 13 function as input/output external connection terminals (described below) of the crystal resonator plate 3. The terminal electrodes 12 and 13 are extended and electrically connected to electrode pads 122 and 132 (the electrode pad 132 is not shown) formed on an inner bottom surface of the base 1 via the side-surface terminal electrodes 121 and 131 (the side-surface terminal electrode 131 is not shown) on the castellations C1 and C3. The terminal electrodes 14 and 15 function as ground external connection terminals (ground terminal electrodes) (ground terminal electrodes as used herein) described below that are electrically connected to the lid 2. The terminal electrodes 14 and 15 are electrically extended to the conductive material 11a via through holes (see, for example, closed circles in FIG. 1) and a wiring pattern (not shown). Note that the terminal electrodes 12, 13, 14 and 15, the side-surface terminal electrodes 121 and 131, and the electrode pads 122 and 132 are configured by integrally baking a metallization material (e.g., tungsten, molybdenum, etc.) and the base 1 into a metallized structure, forming nickel plating on the metallized structure, and forming gold plating on the nickel plating.

The crystal resonator plate 3 (electronic component element as used herein) is mounted between the electrode pads 122 and 132. A pair of an driving electrode and a lead electrode is formed on each of the top and bottom surfaces of the crystal resonator plate 3. The pair of the driving electrode and the lead electrode is, for example, formed by laminating on the crystal resonator plate 3: chromium and gold in this stated order; chromium, gold and chromium in this stated order; chromium, silver and chromium in this stated order; or chromium and silver in this stated order (the material firstly stated contacts the crystal resonator plate 3 in each case). These electrodes (the pair of the driving electrode and the lead electrode) can be formed by a thin film forming means (e.g., vacuum deposition, sputtering or the like). Thereafter, the lead electrodes of the crystal resonator plate 3 are conductively joined to the electrode pads 122 and 132 using a conductive adhesive material (not shown). The crystal resonator plate 3 is held by the base 1. For example, the conductive junction of the driving electrodes of the crystal resonator plate 3 and the electrode pads 122 and 123 of the base 1 can be achieved using a conductive adhesive material, such as a conductive resin adhesive, a metal bump, a brazing material or the like.

The lid 2 that hermetically seals the base 1 includes a metal member that is obtained by forming a sealing material, such as a metal brazing material or the like, on a base metal. For example, the lid 2 is a multilayer structure in which a nickel plating layer, a Kovar base material, an intermediate copper layer, and a brazing silver layer are laminated from the upper surface in this stated order. The brazing silver layer is joined to the metal layer of the base 1. The lid 2 has substantially the same or a slightly smaller outer shape (as viewed from above) than that of the base 1. Note that the sealing member is not limited to a silver brazing material, and other brazing materials for sealing may be used. Alternatively, the sealing member may be made of a plating layer, such as gold, gold tin or the like.

The crystal resonator plate 3 is placed in the accommodation portion 10 of the base 1, and is then covered with the lid 2, followed by hermetic sealing by means of welding (e.g., seam welding, beam irradiation or the like), brazing in a heating furnace, or the like. Thus, a surface mount-type crystal resonator is completed. As shown in FIG. 1, the completed crystal resonator product is joined onto interconnection pads 41 and 42 of the circuit substrate 4 made of a glass epoxy material via a conductive adhesive material B, such as solder or the like.

The present invention is characterized by the terminal electrodes 12, 13, 14 and 15 formed on the bottom surface of the base 1, which will be therefore described in greater detail as follows.

In Example 1, the two terminal electrodes 12 and 14 are formed and arranged (shifted) closer to the position of the corner K1 that is one corner position of the bottom surface of the base 1 and in parallel with a short side direction of the bottom surface of the base 1. The two terminal electrodes 12 and 14 constitute a first terminal electrode group. Also, the two terminal electrodes 13 and 15 are formed and arranged (shifted) closer to the position of the corner K3 that is a first diagonal position diagonally opposite the corner K1 of the bottom surface of the base 1 and in parallel with the short side direction of the bottom surface of the base 1. The terminal electrodes 13 and 15 constitute a second terminal electrode group. The position of the corner K2 (another corner position as used herein) that is another corner facing the corner K1 in the short side direction of the bottom surface of the base 1, and the position of the corner K4 that is a second diagonal position diagonally opposite the other corner K2 of the bottom surface of the base 1, are no-electrode regions 16 and 17 in which no terminal electrode is formed along the short sides of the bottom surface of the base 1. In addition, on the bottom surface of the base 1, the first and second terminal electrode groups are symmetrically arranged about a center point O (as viewed from above) of the bottom surface of the base 1. The terminal electrodes 12 and 13 have the same shape, and the terminal electrodes 14 and 15 have the same shape. Moreover, on the bottom surface of the base 1, the shapes of the first and second terminal electrode groups are symmetric about the center point O (as viewed from above) of the bottom surface of the base 1 (point symmetry).

In Example 1, the first terminal electrode group formed at the corner K1 (one corner position), and the second terminal electrode group formed eccentrically to the corner K3 diagonally opposite the corner K1, are provided with this configuration. Therefore, the crystal resonator can be electrically and mechanically joined to the circuit substrate 4 using the conductive adhesive material D (e.g., solder, etc.) without a reduction in connectivity. Also, when the crystal resonator is electrically and mechanically joined to the circuit substrate 4 using the conductive adhesive material D, a thermal expansion difference may occur between the crystal resonator (specifically, the base 1) and the circuit substrate 4. However, the other corner position (the position of the corner K2) facing the one corner position in the short side direction of the bottom surface of the base 1 and the second diagonal position (the position of the corner K4) diagonally opposite the other corner position on the bottom surface of the base 1, are no-electrode regions 16 and 17 in which the terminal electrodes 12 to 15 are not formed. Therefore, stress generated during junction of the crystal resonator (specifically, the base 1) can be relieved from the first and second terminal electrode groups toward the no-electrode regions 16 and 17. As a result, it is possible to prevent the stress from being concentrated on the conductive adhesive material D interposed between the crystal resonator and the circuit substrate 4, thereby making it difficult for a fatigue fracture to occur from the conductive adhesive material D.

Also, the first and second terminal electrode groups diagonally opposite to each other each include separate terminal electrodes. Therefore, the total of the perimeters of the first and second terminal electrode groups is larger than when the first and second terminal electrode groups each include a single terminal electrode, thereby making it difficult for a crack opening (e.g., a solder crack) to occur in the conductive adhesive material D.

In particular, if a base 1 that is made of a ceramic material is used with respect to the circuit substrate that is made of a glass epoxy substrate, then when the crystal resonator package in which the terminal electrodes 12 to 15 are formed by metallization is joined to the circuit substrate using the conductive adhesive material D, a significant difference between their thermal expansions is likely to occur, which leads to the adverse influence of a crack (e.g., a solder crack) in the conductive adhesive material D. By contrast, according to Example 1, even for a combination of these members (configuration), stress on the crystal resonator package (specifically, the base 1) is reduced, thereby preventing the occurrence of a crack in the conductive adhesive material D interposed between the crystal resonator package and the circuit substrate 4. Also, a structure of the terminal electrodes 12 to 15 that can reduce stress caused by thermal expansion can be obtained by a conventional metallization technique without a particular processing step, resulting in a considerably easy and low-cost formation.

In addition, according to Example 1, as described above, the terminal electrodes 14 and 15 can be set as ground terminal electrodes that are electrically connected to the lid 2. Therefore, electromagnetic noise occurring in a circuit (external circuit), such as the external circuit substrate 4 or the like, can be captured by the lid 2 and removed via ground terminals (ground terminal electrodes). As a result, it is possible to eliminate an adverse influence of electromagnetic noise on the crystal resonator plate 3 in the crystal resonator. Note that only one of the terminal electrodes 14 and 15 may be set as a ground terminal electrode.

Therefore, according to Example 1, an adverse influence, such as a crack (e.g., a solder crack) or the like in the conductive adhesive material D, can be suppressed, so that the reliability of mounting and junction of the crystal resonator package to the circuit substrate 4 can be improved, and moreover, a more reliable crystal resonator package for which measures against electromagnetic susceptibility (EMS) can be easily taken can be achieved.

In addition to the aforementioned configuration, the first terminal electrode group may be formed eccentrically to the one corner position of the bottom surface of the base 1, and the second terminal electrode group may be formed eccentrically to the first diagonal position that is diagonally opposite the one corner position of the bottom surface of the base 1. The first and second terminal electrode groups may be symmetrically formed about the center point as viewed from above of the bottom surface of the base 1.

With such a configuration, in addition to the aforementioned operational effect, the directionality of each terminal electrode group (first and second terminal electrode groups) is removed, so that stress can be more efficiently reduced in a uniform manner with respect to the center point (as viewed from above) of the bottom surface of the base. As a result, it is possible to dramatically suppress the occurrence of a crack (e.g., a solder crack) or the like in the conductive adhesive material D.

Also, in Example 1, a gap dimension W3 between the terminal electrodes 12 and 14 formed in parallel (adjacent) is set to 0.1 mm or more. Also, a gap dimension W3 between the terminal electrodes 13 and 15 formed in parallel (adjacent) is set to 0.1 mm or more. Also, the gap dimension W3 between the terminal electrodes 12 and 14 and the gap dimension W3 between the terminal electrodes 13 and 15 are set to be equal to each other, i.e., the same dimension (gap dimension W3). Also, a dimension W2 in the short side direction of the bottom surface of the base 1 of the no-electrode regions 16 and 17 is set to 15% to 40% of a full dimension W1 (a dimension of the short side) in the short side direction of the bottom surface of the base 1. Specifically, in Example 1, the full dimension W1 is set to 2.5 mm, the dimension W2 is set to 0.9 mm, and the gap dimension W3 is set to 0.2 mm. Therefore, the risk of a short circuit between the terminal electrodes 12 and 14 formed in parallel or a short circuit between the terminal electrodes 13 and 15 can be eliminated. Moreover, performance in reduction of stress from the terminal electrode forming regions (regions in which the first and second terminal electrode groups are formed) of the crystal resonator (specifically, the base 1) toward the no-electrode regions 16 and 17 is not reduced.

Note that if the dimension of each of the no-electrode regions 16 and 17 is set to less than 15% of the full dimension in the short side direction of the bottom surface of the base 1, the action of reducing stress from two-dimensional rotation about the center point (as viewed from above) of the crystal resonator package (specifically, the base 1) is not likely to work effectively, so that the occurrence of a crack (e.g., a solder crack) or the like in the conductive adhesive material D cannot be suppressed. Also, if the dimension of each of the no-electrode regions 16 and 17 is set to more than 40% of the full dimension in the short side direction of the bottom surface of the base 1, it is difficult to secure the gap dimension W3. In this case, not only does the risk of a short circuit between the terminal electrodes 12 and 14 formed in parallel (adjacent) or between the terminal electrodes 13 and 15 formed in parallel (adjacent) increase, but also the dimensions (the area or the width) of the terminal electrodes 12 to 15 must be reduced more than necessary. In particular, if the dimensions of the terminal electrodes 12 to 15 are reduced, the junction strength of the crystal resonator package to the circuit substrate 4 using the conductive adhesive material D may be reduced or the electrical connectivity of the crystal resonator plate 3 may deteriorate.

Also, the terminal electrodes 12 to 15 of Example 1 are formed only on the bottom surface of the base 1, and are separated from the sides of the bottom surface of the base 1, except for the castellations C1 and C3. This is in part because, in a pre-baked ceramic green sheet in which the bases 1 are arranged in a matrix with the bases 1 being separated from each other by dicing grooves (cleavage grooves), a metallization pattern for terminal electrodes is formed without contacting the dicing grooves. After baking, when the ceramic green sheet is separated from the individual bases 1 at the dicing grooves, hindering of its ability to separate is prevented by the metallization pattern for terminal electrodes that would otherwise straddle the dicing groove.

Although it has been assumed in Example 1 that the terminal electrodes 12 and 13 closest to the corners K1 and K3 of the bottom surface of the base 1 are set to serve as the input/output external connection terminals of the crystal resonator plate 3, the present invention is not limited to this. For example, as shown in FIG. 3, the terminal electrodes 12 and 13 may be exchanged with the terminal electrodes 14 and 15. In this case, the terminal electrodes 14 and 15 closest to the corners K1 and K3 may be set to serve as ground external connection terminals (ground terminal electrodes). Note that only one of the terminal electrodes 14 and 15 may be set as a ground terminal electrode.

Also, the arrangement of the terminal electrodes 12 to 15 on the bottom surface of the base 1 is not limited to that of Example 1. As shown in FIG. 4, the two terminal electrodes 12 and 14 (first terminal electrode group) may be formed in parallel with the long side direction of the bottom surface of the base 1 and closer to the corner K1 of the bottom surface of the base 1, while the two terminal electrodes 13 and 15 (second terminal electrode group) may be formed in parallel with the long side direction and closer to the corner K3 diagonally opposite the corner K1. Note that only one of the terminal electrodes 14 and 15 may be set as a ground terminal electrode.

Also, as is different from Example 1, terminal electrodes 12, 13 and 14 may be formed on the bottom surface of the base 1 as shown in FIG. 5. In the example of FIG. 5, the terminal electrodes 12 and 13 serve as input/output external connection terminals of the crystal resonator plate 3. Also, only the terminal electrode 14 is set to serve as a ground external connection terminal (ground terminal electrode) connected to the lid 2. Specifically, in the example of FIG. 5, of the terminal electrodes 12, 13 and 14, the two terminal electrodes 12 and 14 constitute the first terminal electrode group that is formed in parallel with the short side direction of the bottom surface of the base 1 and closer to the corner K1 of the bottom surface of the base 1, while the terminal electrode 13 constitutes the second terminal electrode that is formed eccentrically to the corner K3 diagonally opposite the corner K1.

Figure 6:
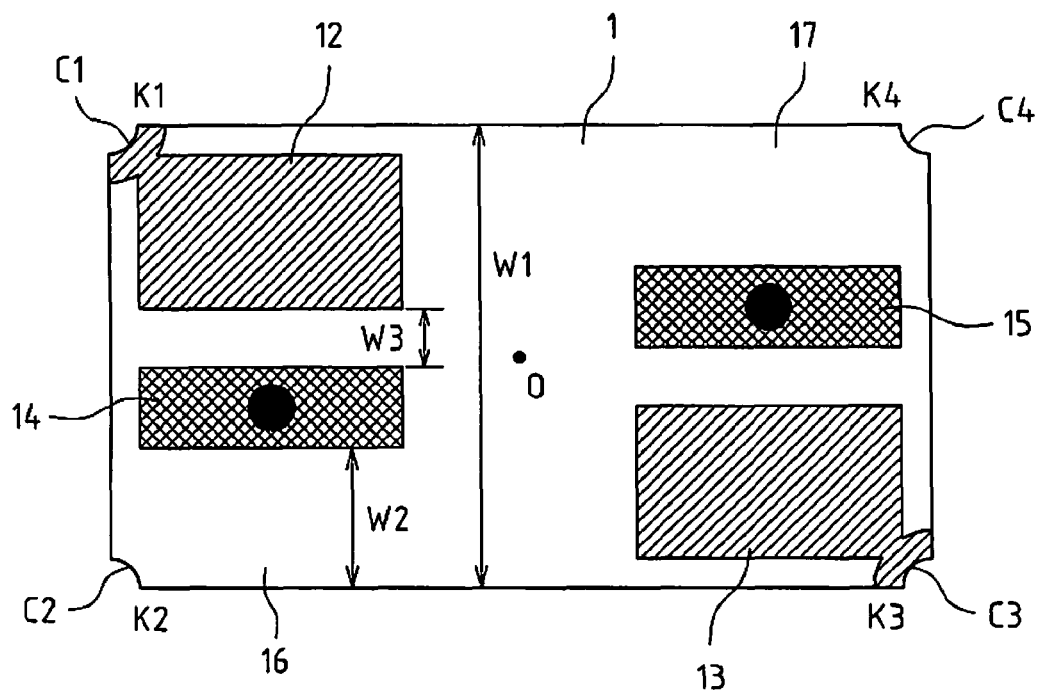
FIG. 6 is a schematic diagram of a surface mount-type crystal resonator according to Example 1.2 of the present invention as viewed from below.

Next, a surface mount-type crystal resonator according to another example (Example 1-2) of Example 1 of the present invention will be described with reference to FIGS. 6 to 11. FIG. 6 is a schematic diagram showing the surface mount type crystal resonator of Example 1-2 as viewed from below. FIGS. 7 to 11 are schematic diagrams showing surface mount type crystal resonators according to variations of Example 1-2 as viewed from below. Note that parts similar to those of Example 1 are indicated with the same reference symbols and will not be described in detail.

As shown in FIG. 6, in the first terminal electrode group of the crystal resonator of Example 1-2, the terminal electrode 12 closest to one corner position (the position of the corner K1) has a larger area and a broader width than those of the other terminal electrode 14. In the second terminal electrode group, the terminal electrode 13 closest to the other corner position (the position of the corner K3) has a larger area and a broader width than those of the other terminal electrode 15. Also, in Example 1-2, the terminal electrodes 12 and 13 are set as input/output external connection terminals connected to the crystal resonator plate 3.

With the configuration of Example 1-2 described above, while regions close to the corners K1 and K3 of the base 1 are set to be junction regions with the greatest junction strength between the crystal resonator package (the base 1) and the circuit substrate 4 due to the conductive adhesive material D, the junction strength can be stepwise reduced from the terminal electrodes formed in parallel (the first and second terminal electrode groups) toward the no-electrode regions 16 and 17. As a result, even if a thermal expansion difference occurs between the crystal resonator package (specifically, the base 1) and the circuit substrate 4 occurs, the action of relieving the stress of the crystal resonator package (the base 1) from the terminal electrode forming region of the base 1 (specifically, regions in which the first and second terminal electrode groups are formed) toward the no-electrode regions 16 and 17 is further improved. In other words, the reduction of stress from two-dimensional rotation about the center point of the bottom surface of the crystal resonator package (specifically, the base 1) is improved, so that stress can be efficiently reduced in a uniform manner, thereby making it possible to dramatically suppress the occurrence of a crack (e.g., a solder crack) in the conductive adhesive material D. Also, deterioration in electrical connectivity between the circuit substrate 4 and the crystal resonator plate 3 (electronic component element) due to the conductive adhesive material D is avoided. In addition, the risk of a poor electrical connection in a measuring probe for testing or the like with respect to the input/output external connection terminals 12 and 13 of the crystal resonator plate 3 is eliminated, so that more correct and highly reliable testing can be achieved, leading to a contribution to an improvement in the electrical performance or yield of the crystal resonator.

Note that, in each of the first and second terminal electrode groups, the terminal electrodes 12 and 13 are configured to have a larger area or a broader width than those of the terminal electrodes 14 and 15, and are set as the input/output external connection terminals connected to the crystal resonator plate 3. Alternatively, the terminal electrodes 12 and 13 may not be set as the input/output external connection terminals. However, as shown in Example 1-2, it is preferable that the terminal electrodes 12 and 13 be configured to have a larger area or a broader width than those of the terminal electrodes 14 and 15, and be set as the input/output external connection terminals connected to the crystal resonator plate 3.

Also, in the first and second terminal electrode groups of Example 1-2, the terminal electrodes 12 and 13 have a larger area and a broader width than those of the terminal electrodes 14 and 15, the present invention is not limited to this. If, in either of the first and second terminal electrode groups, one of the terminal electrodes has a larger area or a broader width than that of the other terminal electrode, and is electrically connected to an electronic component element, the aforementioned effect is obtained.

Specifically, as shown in FIG. 6, in the first terminal electrode group, the two terminal electrodes 12 and 14 are formed and arranged closer to the corner K1 on the bottom surface of the base 1 and in parallel with the short side direction of the bottom surface of the base 1. In the second terminal electrode group, the two terminal electrodes 13 and 15 are formed and arranged closer to the position of the corner K3 (the first diagonal position) diagonally opposite the corner K1 on the bottom surface of the base 1 and in parallel with the short side direction of the bottom surface of the base 1.

In addition, the terminal electrodes 12 and 13 are input/output external connection terminals connected to the crystal resonator plate 3, and the terminal electrodes 14 and 15 are ground external connection terminals (ground terminal electrodes). Also, the terminal electrodes 12 and 13 are provided closer to the corners K1 and K3 of the bottom surface of the base 1 than the terminal electrodes 14 and 15 that are arranged along with the terminal electrodes 12 and 13 in parallel with the short side direction of the bottom surface of the base 1, respectively. The terminal electrodes 12 and 13 also have a large (broader) width dimension than that of the terminal electrodes 14 and 15. Note that only one of the terminal electrodes 14 and 15 may be set as a ground terminal electrode.

Figure 7:
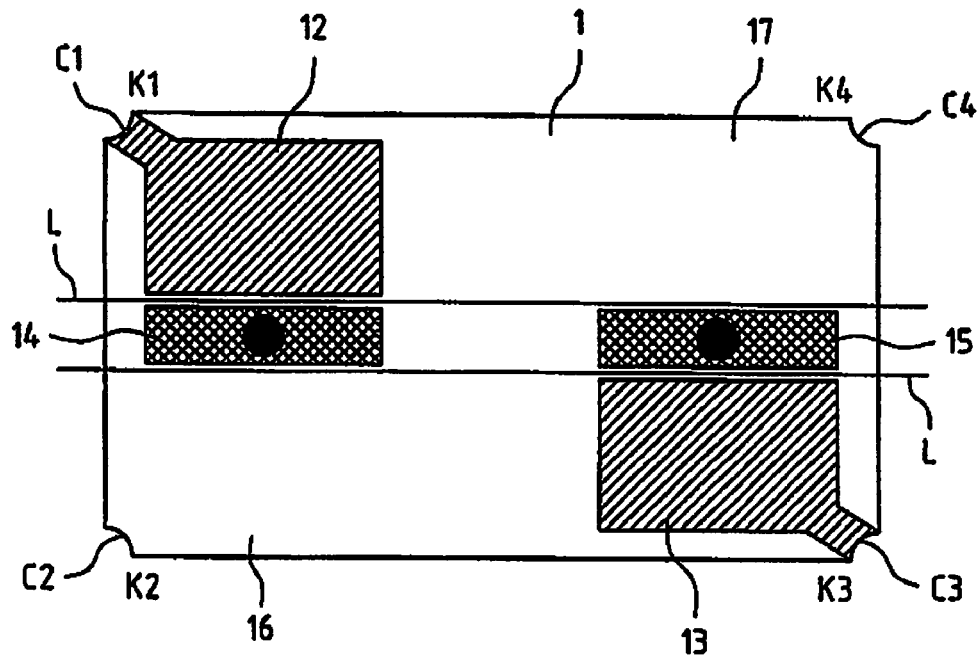
FIG. 7 is a schematic diagram of a surface mount-type crystal resonator according to a variation of Example 1-2 as viewed from below.

Note that, in the example of FIG. 6 described above, the terminal electrodes 14 and 15 that are ground terminal electrodes are not symmetrically formed about a line in terms of their positions in the short side direction of the bottom surface of the base 1. This is only for illustrative purposes. As shown in FIG. 7, the terminal electrodes 14 and 15 that are ground terminal electrodes electrically connected to the lid 2 may be symmetrically formed about a line in terms of their positions in the short side direction of the bottom surface of the base 1.

In the example of FIG. 7, division lines L that extend in the long side direction of the bottom surface of the base 1 are provided. The terminal electrodes (division electrodes) 12 and 14 are formed by division with one division line L. Similarly, the terminal electrodes (division electrodes) 13 and 15 are formed by division with the other division line L. The terminal electrodes 14 and 15 that are located closer to the no-electrode regions 16 and 17, respectively, by division with the first and second terminal electrode division lines L, are formed at respective middle portions of both the short sides of the bottom surface of the base 1, facing each other. Note that the areas on the bottom surface of the base 1 of the terminal electrodes (ground terminal electrodes) 14 and 15 are set to 50% or less of the area on the bottom surface of the base 1 of the terminal electrodes (input/output external connection terminals) 12 and 13, respectively. An area of 50% or less can suppress the reduction of junction strength.

Moreover, specifically, in the example of FIG. 7, two terminal electrodes that are to be joined to the external circuit substrate 4 using the conductive adhesive material D are formed on the bottom surface of the base 1. A first terminal electrode (one terminal electrode) is formed eccentrically to the corner K1 that is one corner position of the bottom surface of the base 1, and a second terminal electrode (the other terminal electrode) is formed eccentrically to the corner K3 that is a first diagonal position diagonally opposite the corner K1 on the bottom surface of the base 1. The first and second terminal electrodes are divided by the division lines L, so that the terminal electrodes 12 and 14 are formed from the first terminal electrode, and the terminal electrodes 13 and 15 are formed from the second terminal electrode. Note that the position of the corner 12 that is another corner position facing the corner K1 in the short side direction of the bottom surface of the base 1, and a position of the corner K4 that is a second diagonal position diagonally opposite the corner K2 of the bottom surface of the base 1, are no-electrode regions in which no terminal electrode is formed.

According to the configuration of the example of FIG. 7 described above, the division lines L in a side direction of the bottom surface of the base 1 are provided so that the first terminal electrode (the terminal electrodes 12 and 14) and the second terminal electrode (the terminal electrodes 13 and 15) are divided by the respective division lines L. Therefore, the total perimeters of the terminal electrodes are increased, thereby making it difficult for a crack opening (e.g., a solder crack) to occur in the conductive adhesive material D. Also, the adverse influence of a crack or the like in the conductive adhesive material D can be suppressed, so that the reliability of mounting and junction of the crystal resonator package (specifically, the base 1) to the circuit substrate 4 is improved.

Also, according to the configuration of the example of FIG. 7, the first terminal electrode (the terminal electrodes 12 and 14) and the second terminal electrode (the terminal electrodes 13 and 15) are divided by the respective division lines L. Therefore, the uniform junction regions of the terminal electrodes 12, 13, 14 and 15 are obtained, thereby preventing a variation in joined state (mounted state) thereof to the circuit substrate 4. As a result, when the base 1 is joined to the circuit substrate 4, unnecessary expansion and contraction stress in the long side direction or the short side direction of the base 1 does not occur.

Also, according to the configuration of the example of FIG. 7, the first terminal electrode (the terminal electrodes 12 and 14) and the second terminal electrode (the terminal electrodes 13 and 15) are divided by the respective division lines L. Therefore, the terminal electrodes 12 and 14 are formed eccentrically to the one corner position (the position of the corner K1) and the terminal electrodes 13 and 15 are formed eccentrically to the first diagonal position (the position of the corner K3), and the other corner position (the position of the corner K2) and the second diagonal position (the position of the corner K4) are caused to be the no-electrode regions 16 and 17. Even in this case, three or more terminal electrodes can be formed on the base 1, so that the characteristic operational, effect can be provided. Specifically, when the base 1 is joined to the circuit substrate 4, stress is relieved to the no-electrode regions 16 and 17, so that unnecessary expansion and contraction stress in the long side direction or the short side direction of the base 1 does not occur. Also, terminal electrode regions of terminal electrodes actually facing each other on the base 1 (the terminal electrodes 14 and 15 in this example) are formed, so that the three-dimensional twist of the crystal resonator (specifically, the base 1) on the circuit substrate 4 can be suppressed while the strength of the junction between the base 1 and the circuit substrate 4 can be increased. As a result, it is possible to reduce the influence of a defect, such as warping of the circuit substrate 4 caused by mounting the base 1 on the circuit substrate 4, or the like.

Also, according to the configuration of the example of FIG. 7, the terminal electrodes 14 and 15 obtained by dividing the first and second terminal electrodes with the division lines L are provided closer to the no-electrode regions 16 and 17, respectively. The terminal electrodes 14 and 15 are provided at the respective middle portions of both the short sides of the bottom surface of the base 1, facing each other. Therefore, the operational effect by division of the first terminal electrode (the terminal electrodes 12 and 14) and the second terminal electrode (the terminal electrodes 13 and 15) with the division lines L becomes significant. Specifically, not only the adverse influence of a crack or the like in the conductive adhesive material D can be suppressed, but also the crystal resonator package (specifically, the base 1) is prevented from being two-dimensionally rotated when it is mounted. In particular, as shown in FIG. 7, by forming the terminal electrodes (ground terminal electrodes) 14 and 15 between the two division lines L, the crystal resonator package (specifically, the base 1) is prevented from being two-dimensionally rotated when it is mounted.

Also, according to the configuration of the example of FIG. 7, the terminal electrodes 14 and 15 are set as ground terminal electrodes electrically connected to the lid 2. Therefore, electromagnetic noise occurring in the external circuit substrate 4 can be captured by the lid 2 and removed via the terminal electrodes 14 and 15. As a result, it is possible to eliminate an adverse influence of electromagnetic noise on an electronic component element (the crystal resonator plate 3) in the crystal resonator without reducing the junction strength when the crystal resonator package is joined to the circuit substrate 4.

Note that, the line symmetry in terms of positions in the short side direction of the bottom surface of the base 1 is not limited to the example of FIG. 7. An example shown in FIG. 8 may also be applicable.

Figure 8:
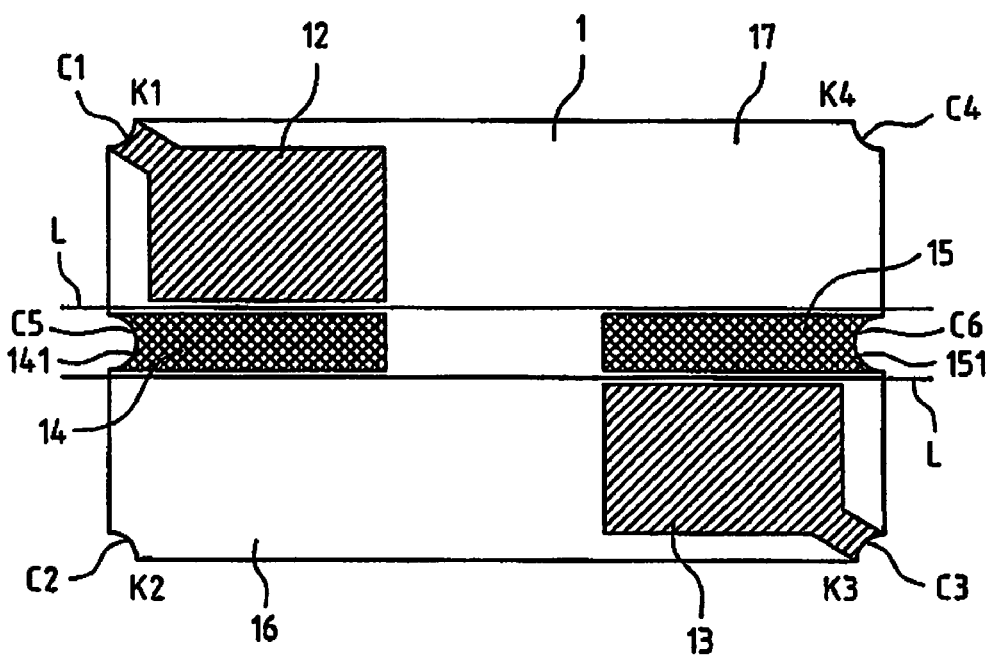
FIG. 8 is a schematic diagram of a surface mount-type crystal resonator according to a variation of Example 1-2 as viewed from below.

In the example of FIG. 8, castellations C5 and C6 that have the same dimensions and the same shape and perfectly face each other are vertically formed at middle portions of both the short sides of the bottom surface of the base 1. Side-surface terminal electrodes 141 and 151 are formed vertically across C5 and C6 (from the bottom surface via the side surface to the upper surface of the base 1). The terminal electrodes 14 and 15 are formed and extended to the castellations C5 and C6, respectively. The terminal electrodes 14 and 16 are electrically linked (connected) to the side-surface terminal electrode 141 and 151, respectively.

Also, as is similar to the example of FIG. 7, the terminal electrodes (ground terminal electrodes) 14 and 15 are formed between two division lines L, so that the crystal resonator package (specifically, the base 1) is prevented from being two-dimensionally rotated when it is mounted. In addition, in FIG. 8, not only the terminal electrodes 14 and 15, but also the castellations C5 and C6 and the side-surface terminal electrodes 141 and 151 are provided between the two division lines L. The castellations C5 and C6 and the side-surface terminal electrodes 141 and 151 are also formed on an extension between the terminal electrodes 14 and 15. Therefore, as compared to the example of FIG. 7, fillet formation in the conductive adhesive material D improves the strength of the junction between the base 1 and the circuit substrate 4, and the effect of suppressing the two-dimensional rotation of the base 1 on the circuit substrate 4 when the base 1 is mounted on the circuit substrate 4 is enhanced.

Note that, in the examples of FIGS. 7 and 8, the first terminal electrode and the second terminal electrode are each divided into two terminal electrodes (the terminal electrodes 12 and 14 and the terminal electrodes 13 and 15, respectively) by the division lines L extending in the long side direction of the bottom surface of the base 1. The direction of the division lines L may be set to any side direction of the bottom surface of the base 1, and may be the short side direction of the bottom surface of the base 1.

Figure 9:
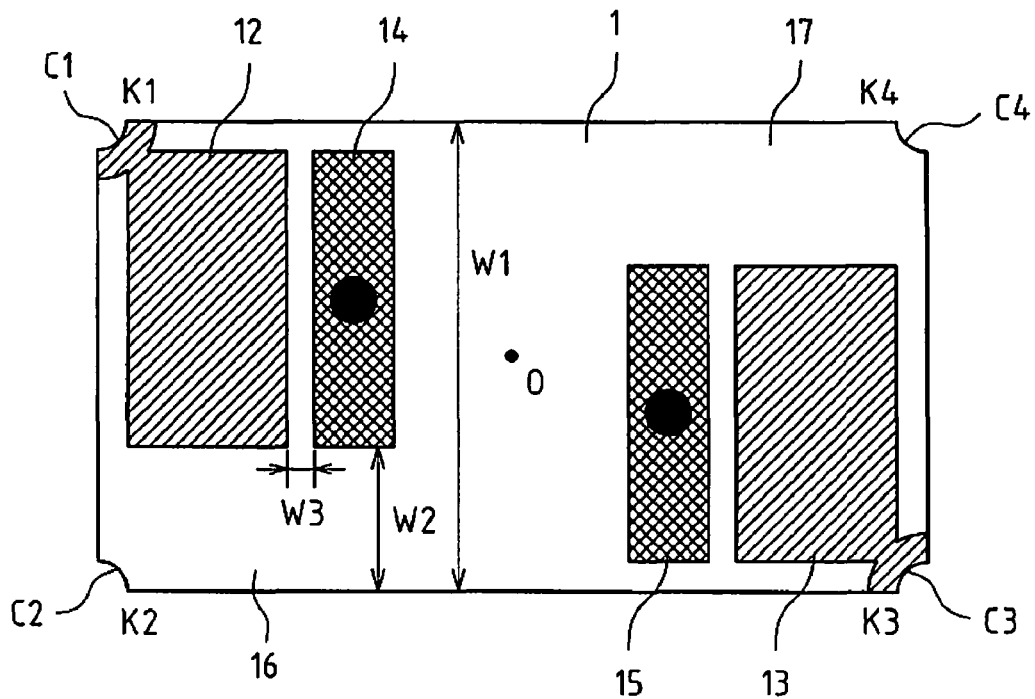
FIG. 9 is a schematic diagram of a surface mount-type crystal resonator according to a variation of Example 1-2 as viewed from below.

Also, a specific example other than the examples of FIGS. 6 to 8 is shown in FIG. 9. As shown in FIG. 9, in a first terminal electrode group, two terminal electrodes 12 and 14 are formed and arranged closer to the corner K1 of the bottom surface of the base 1 and in parallel with the long side direction of the bottom surface of the base 1. In a second terminal electrode group, two terminal electrodes 13 and 15 are formed and arranged closer to the corner K3 diagonally opposite the corner K1 and in parallel with the long side direction of the bottom surface of the base 1.

In addition, the terminal electrodes 12 and 13 are input/output external connection terminals connected to the crystal resonator plate 3, and the terminal electrodes 14 and 15 are ground external connection terminals (ground terminal electrodes). Also, the terminal electrodes 12 and 13 are provided closer to the corners K1 and K3 of the base 1 than the terminal electrodes 14 and 15, which are arranged in parallel with the terminal electrodes 12 and 13, respectively. The terminal electrodes 12 and 13 also have a larger width dimension than that of the terminal electrodes 14 and 15. Note that only one of the terminal electrodes 14 and 15 may be set as a ground terminal electrode.

Figure 10:
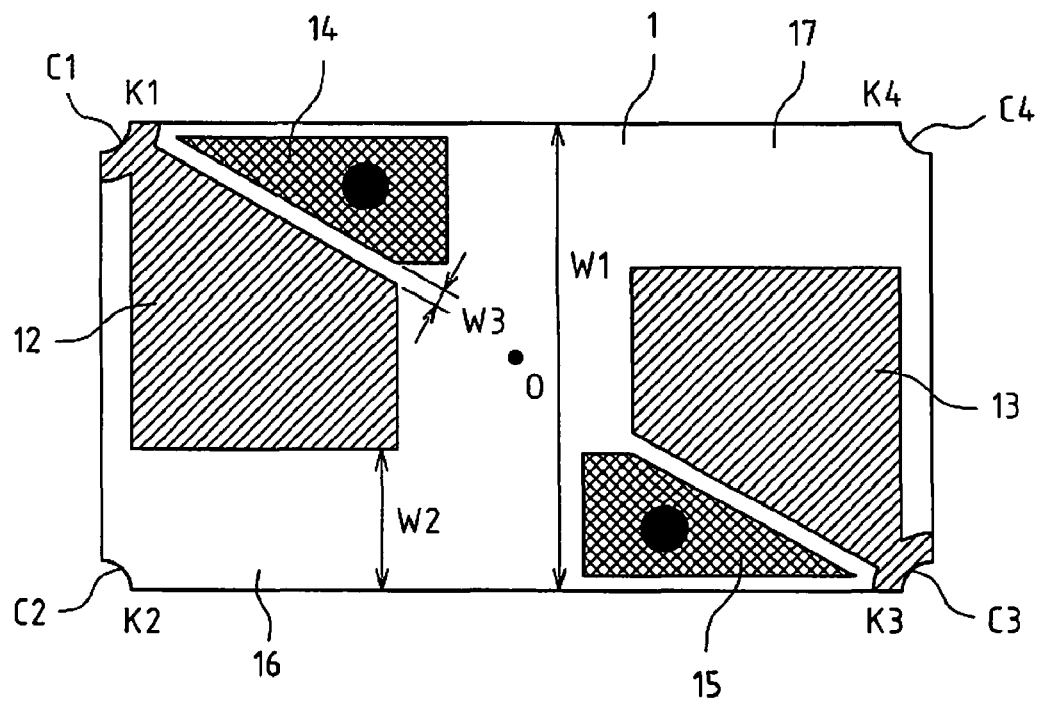
FIG. 10 is a schematic diagram of a surface mount-type crystal resonator according to a variation of Example 1-2 as viewed from below.

Also, another specific example is shown in FIG. 10. As shown in FIG. 10, two terminal electrodes 12 and 14 are formed and arranged closer to the corner K1 of the bottom surface of the base 1. A first terminal electrode group in which the terminal electrodes 12 and 14 are separated by a diagonal line linking the corners K1 and K3 and are arranged in parallel, is formed on the bottom surface of the base 1. Also, two terminal electrodes 13 and 15 are formed and arranged closer to the corner K3 diagonally opposite the corner K1 of the bottom surface of the base 1. A second terminal electrode group in which the terminal electrodes 13 and 15 are separated by the diagonal line linking the corners K1 and K3 and are arranged in parallel, is formed on the bottom surface of the base 1.

In addition, the terminal electrodes 12 and 13 are input/output external connection terminals connected to the crystal resonator plate 3, and the terminal electrodes 14 and 15 are ground external connection terminals (ground terminal electrodes). Also, the terminal electrodes 12 and 13 have a larger area than that of the terminal electrodes 14 and 15, which are arranged in parallel with the terminal electrodes 12 and 13, respectively. Note that only one of the terminal electrodes 14 and 15 may be set as a ground terminal electrode.

Figure 11:
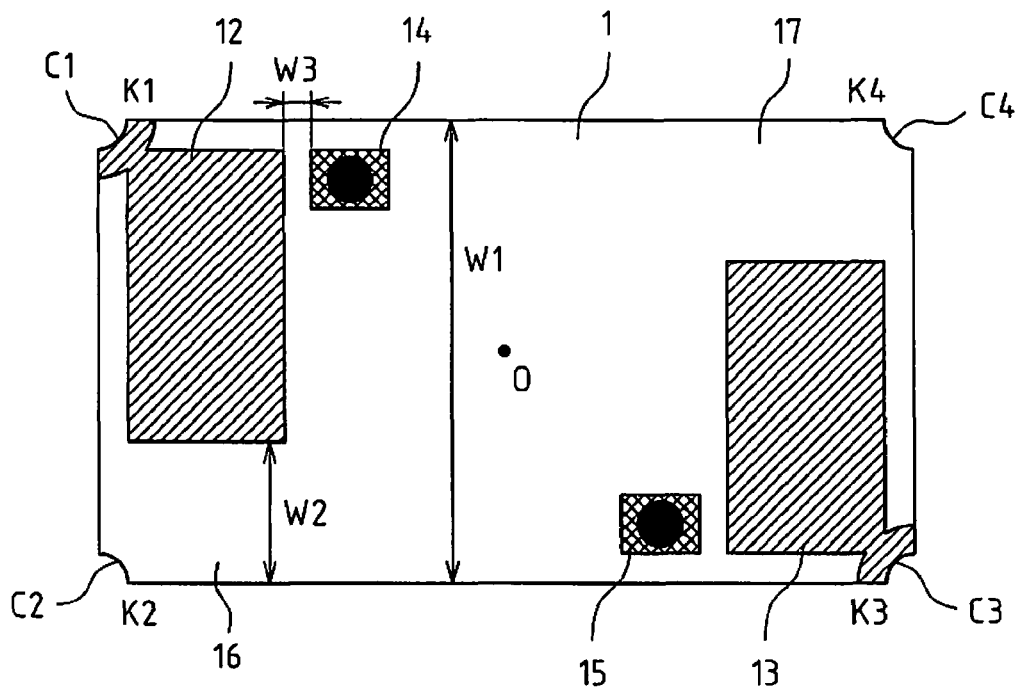
FIG. 11 is a schematic diagram of a surface mount-type crystal resonator according to a variation of Example 1.2 as viewed from below.

Also, another specific example is shown in FIG. 11. As shown in FIG. 11, in a first terminal electrode group, two terminal electrodes 12 and 14 are formed and arranged closer to the corner K1 of the bottom surface of the base 1 and in parallel with the long side direction of the bottom surface of the base 1. In a second terminal electrode group, two terminal electrodes 13 and 15 are formed and arranged closer to the corner K3 diagonally opposite the corner K1 of the bottom surface of the base 1 and in parallel with the long side direction of the bottom surface of the base 1.

In addition, the terminal electrodes 12 and 13 are input/output external connection terminals connected to the crystal resonator plate 3, and the terminal electrodes 14 and 15 are ground external connection terminals (ground terminal electrodes). Also, the terminal electrodes 12 and 13 are provided closer to the corners K1 and K3 of the base 1 than the terminal electrodes 14 and 15, which are arranged in parallel with the terminal electrodes 12 and 13. The terminal electrodes 12 and 13 also have a larger area than that of the terminal electrodes 14 and 15. Note that only one of the terminal electrodes 14 and 15 may be set as a ground terminal electrode.

Figure 12:
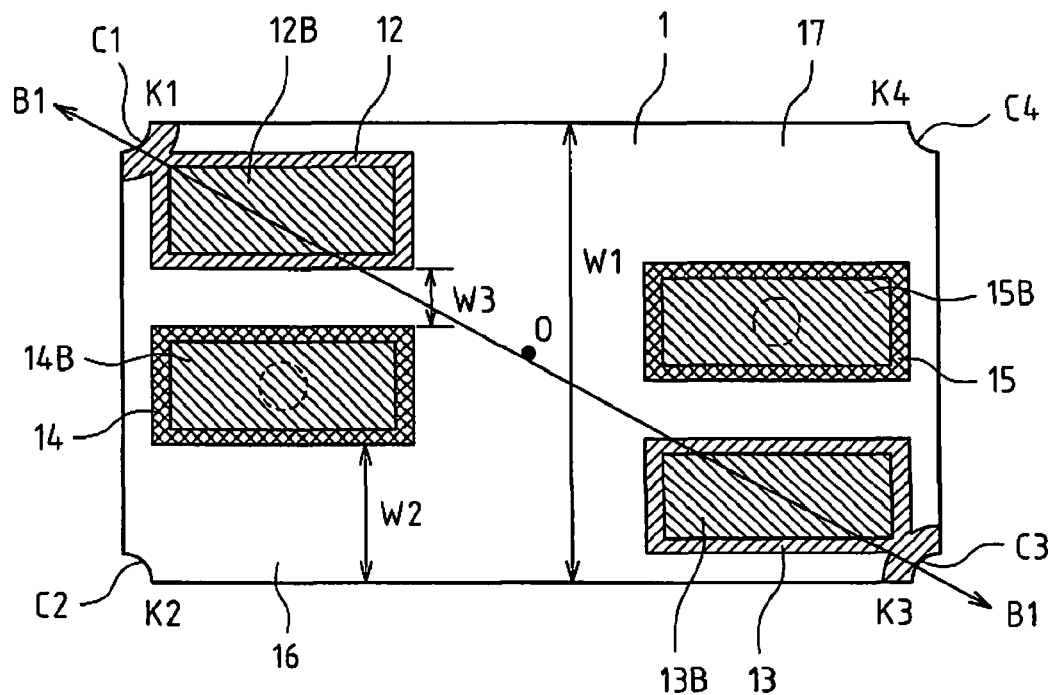
FIG. 12 is a schematic diagram of a surface mount-type crystal resonator according to Example 1.3 of the present invention as viewed from below.
Figure 13:
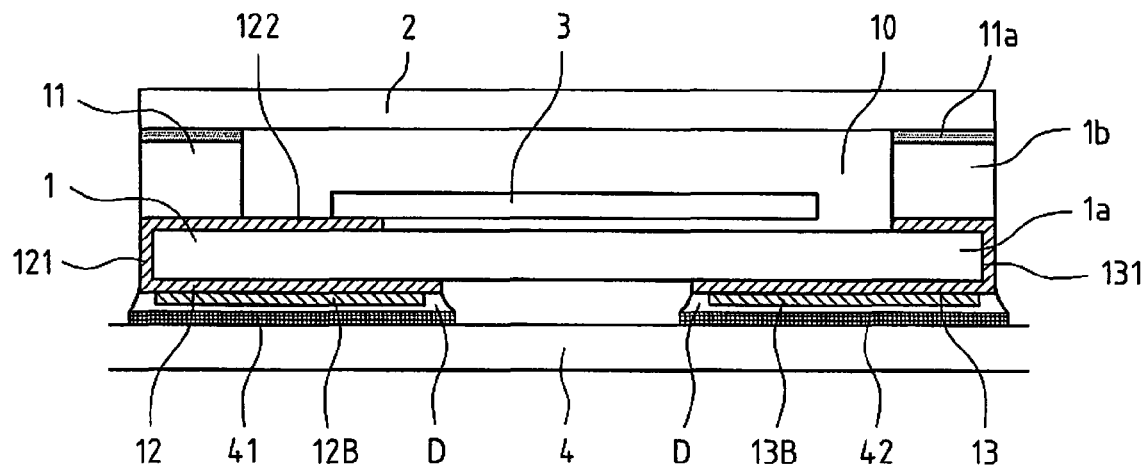
FIG. 13 is a partial cross-sectional view taken along line B1-B1 of FIG. 12, schematically showing the surface mount type crystal resonator mounted on a circuit substrate.

Next, a surface mount-type crystal resonator according to another example (Example 1-3) of Example 1 of the present invention will be described with reference to FIGS. 12 and 13. FIG. 12 is a schematic diagram showing the surface mount type crystal resonator of Example 1-3 as viewed from below. FIG. 13 is a partial cross-sectional view taken along line B-B of FIG. 12, schematically showing the surface mount type crystal resonator mounted on a circuit substrate. Note that, parts similar to those of Example 1 are indicated with the same reference symbols and will not be described in detail.

As shown in FIG. 12, in the crystal resonator of Example 1-3, in a first terminal electrode group, two terminal electrodes 12 and 14 are formed and arranged closer to the corner K1 of the bottom surface of the base 1 and in parallel with the short side direction of the bottom surface of the base 1. In a second terminal electrode group, two terminal electrodes 13 and 15 are formed and arranged closer to the corner K3 diagonally opposite the corner K1 and in parallel with the short side direction of the bottom surface of the base 1.

In addition, bumps 12B, 13B, 14B and 15B that are slightly smaller than the terminal electrodes 12, 13, 14 and 15 and have substantially the same shape (as viewed from above) as those of the terminal electrodes 12, 13, 14 and 15, are formed on the terminal electrodes 12, 13, 14 and 15, respectively. The bumps 12B, 13B, 14B and 15B, made of the same metallization material (tungsten, molybdenum, etc.), are laminated in a desired shape on the metallization material of the terminal electrodes 12, 13, 14 and 15. The metallization materials of the terminal electrodes 12, 13, 14 and 15 and the bumps 12B, 13B, 14B and 15B, and the base 1 are integrally baked, and nickel plating is formed on the metallization material, and gold plating is formed on the nickel plating. Note that only one of the terminal electrodes 14 and 15 may be set as a ground terminal electrode.

In Example 1-3, with this configuration, even if stress is generated due to a thermal expansion difference between the base 1 and the circuit substrate 4, the stress can be more efficiently reduced due to a step between the bumps 12B, 13B, 14B and 15B and the terminal electrodes 12, 13, 14 and 15. In addition, with this configuration, the conductive adhesive material D is accumulated in a gap portion between the base 1 and the circuit substrate 4 that are separated by the bumps 12B, 13B, 14B and 15B. The accumulated conductive adhesive material D can further enhance the junction strength between the base 1 and the circuit substrate 4. Also, the bumps 12B, 13B, 14B and 15B can be formed with considerable ease and low cost by laminating the same metallization material on the terminal electrodes 12, 13, 14 and 15.

Figure 14:
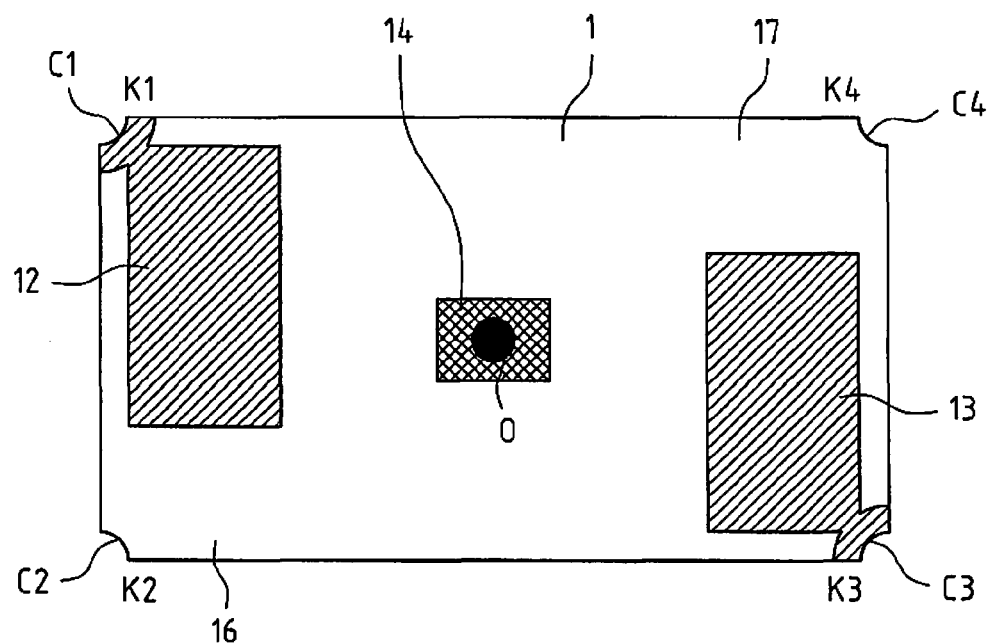
FIG. 14 is a schematic diagram of a surface mount-type crystal resonator according to Example 1.4 of the present invention as viewed from below.

Next, a surface mount-type crystal resonator according to another example (Example 1-4) of Example 1 of the present invention will be described with reference to FIG. 14. FIG. 14 is a schematic diagram showing the surface mount type crystal resonator of Example 1-4 as viewed from below. Note that, parts similar to those of Example 1 are indicated with the same reference symbols and will not be described in detail.

As shown in FIG. 14, in the crystal resonator of Example 1-4, the first terminal electrode 12 is formed eccentrically to the corner K1 of the bottom surface of the base 1, and the second terminal electrode 13 is formed eccentrically to the corner K3 diagonally opposite the corner K1.

Also, in Example 1-4, a position of the corner K2 that is another corner facing the corner K1 in the short side direction of the bottom surface of the base 1, and a position of the corner K4 that is the second diagonal position diagonally opposite the corner K2 of the bottom surface of the base 1, are caused to be the no-electrode regions 16 and 17 in which no terminal electrode is formed along the short sides of the bottom surface of the base 1.

In addition, on the bottom surface of the base 1, the first and second terminal electrodes 12 and 13 are symmetrically arranged about the center point O (as viewed from above) of the bottom surface of the base 1 (point symmetry). Also, the terminal electrodes 12 and 13 have the same shape. On the bottom surface of the base 1, the shapes of the first and second terminal electrodes 12 and 13 are symmetric about the center point O (as viewed from above) of the bottom surface of the base 1 (point symmetry). Moreover, a ground terminal electrode 14 having a smaller area (as viewed from above) than that of the first and second terminal electrodes 12 and 13 is formed at the center point O (as viewed from above) of the bottom surface of the base 1. The ground terminal electrode 14 is electrically connected to the lid 2.

In Example 1-4, with this configuration, the first terminal electrode 12 is formed at the position of the corner K1 that is the one corner position, while the second terminal electrode 13 is formed at a position of the corner K3 diagonally opposite the corner K1. Therefore, the crystal resonator is electrically and mechanically joined to the circuit substrate 4 using the conductive adhesive material D (e.g., solder, etc.) without a reduction in connectivity. Also, when the crystal resonator is electrically and mechanically joined to the circuit substrate 4 using the conductive adhesive material D, even if a thermal expansion difference occurs between the crystal resonator (the base 1) and the circuit substrate 4, stress on the crystal resonator (the base 1) can be relieved from the first and second terminal electrodes 12 and 13 toward the no-electrode regions 16 and 17. As a result, it is possible to prevent the stress from being concentrated on the conductive adhesive material D interposed between the crystal resonator and the circuit substrate 4, thereby making it difficult for a fatigue fracture to occur from the conductive adhesive material D.

In addition, the terminal electrode 14 is set as a ground terminal electrode electrically connected to the lid 2. Therefore, electromagnetic noise occurring in the external circuit substrate 4 can be captured by the lid 2 and removed via the terminal electrode (ground terminal electrode) 14. As a result, it is possible to eliminate an adverse influence of electromagnetic noise on the crystal resonator plate 3 in the crystal resonator. Note that the terminal electrode 14 has a smaller area than that of the first and second terminal electrodes 12 and 13 and is formed at the center point O (as viewed from above) of the base 1, so that the aforementioned stress reducing action is not hindered.

Example 2

Figure 15:
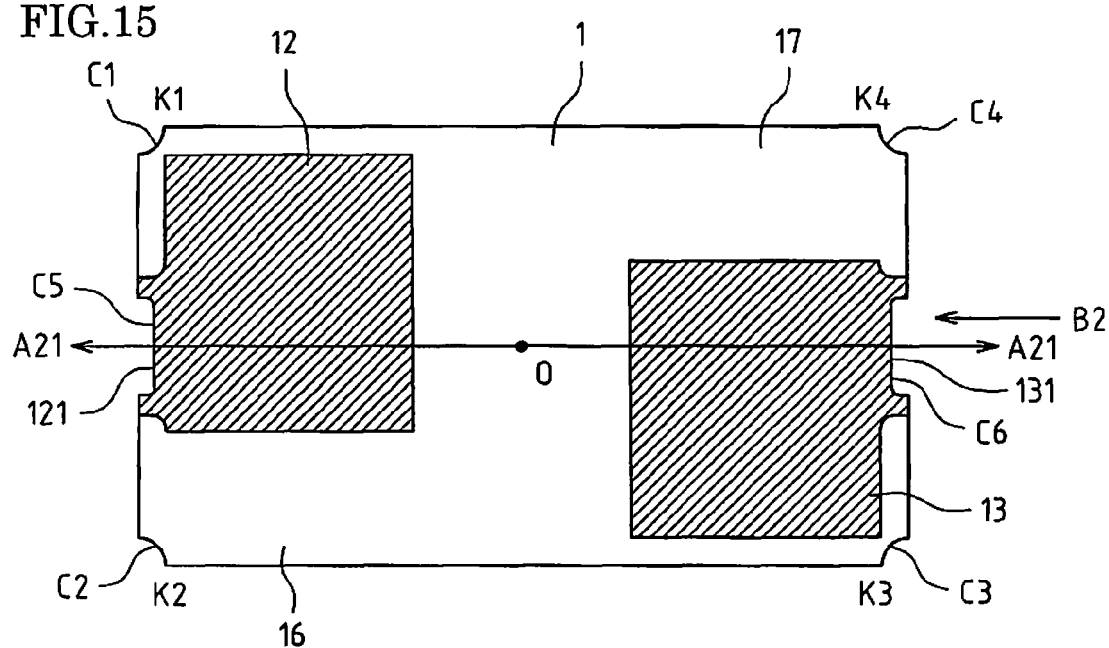
FIG. 15 is a schematic diagram of a surface mount-type crystal resonator according to Example 2 of the present invention as viewed from below.
Figure 16:
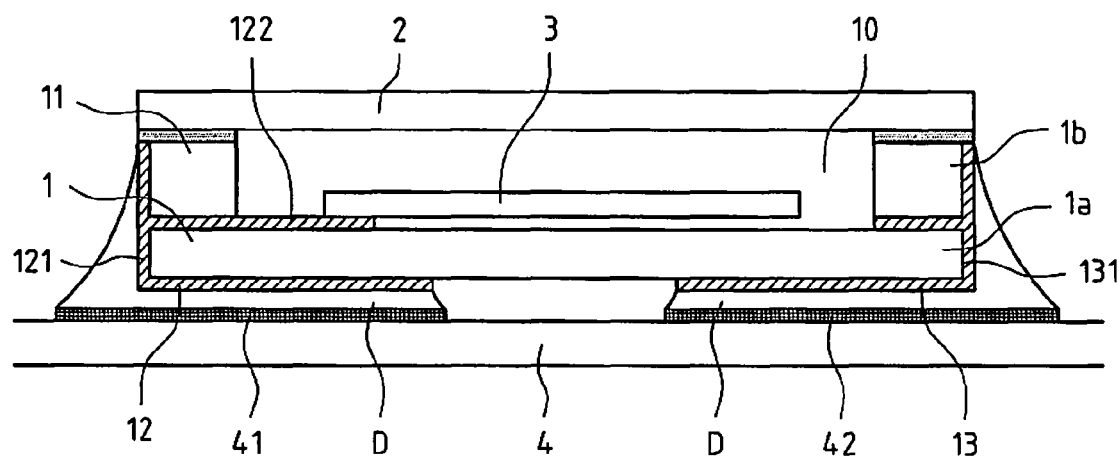
FIG. 16 is a partial cross-sectional view taken along line A21-A21 of FIG. 15, schematically showing the surface mount type crystal resonator mounted on a circuit substrate.
Figure 17:
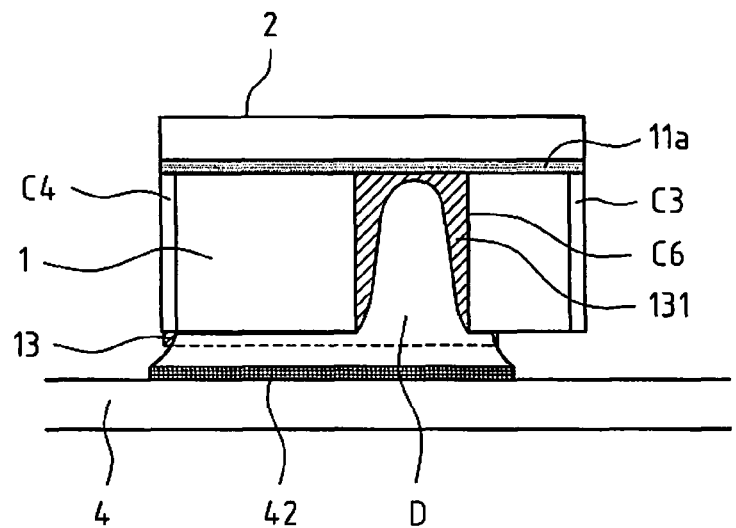
FIG. 17 is a side view schematically showing a state of a surface mount-type crystal resonator mounted on a circuit substrate as viewed in direction B2 of FIG. 15.
Figure 18:
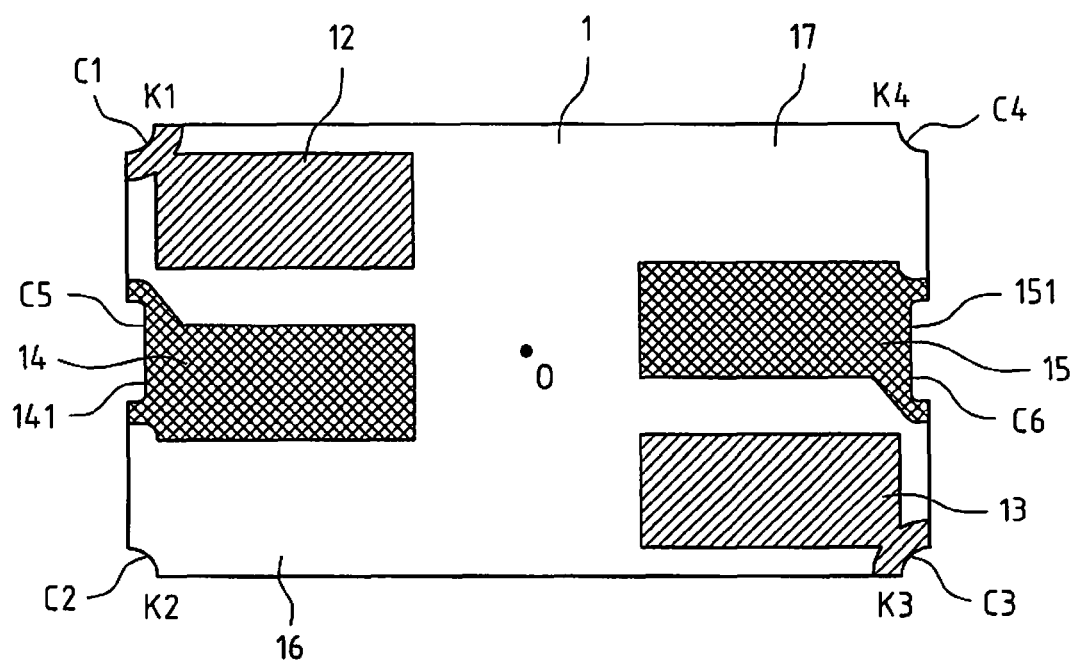
FIG. 18 is a schematic diagram of a surface mount-type crystal resonator according to a variation of Example 2 as viewed from below.
Figure 19:
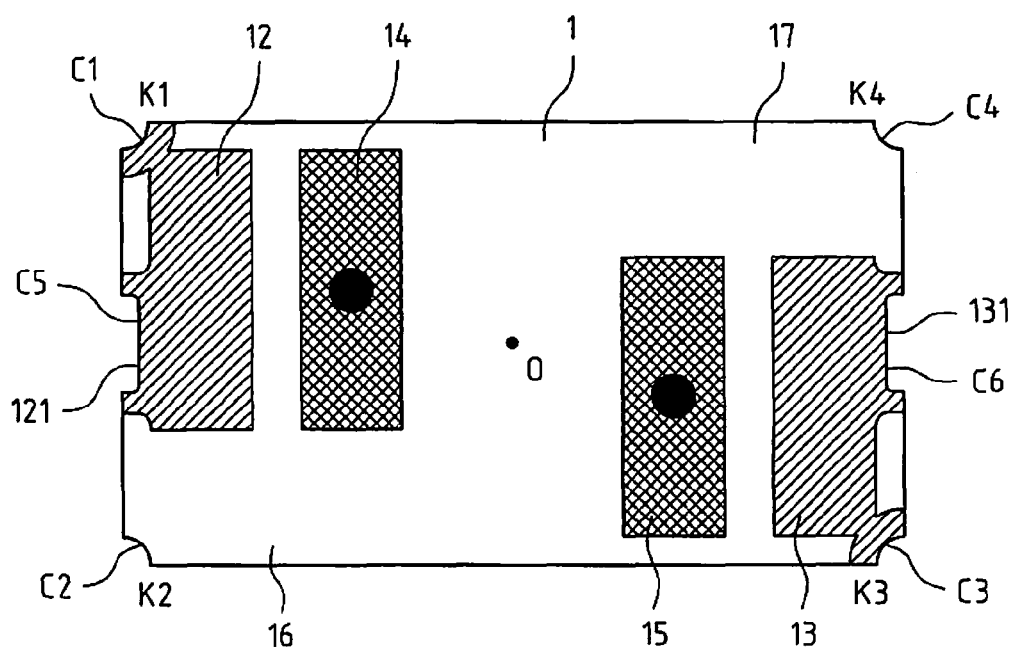
FIG. 19 is a schematic diagram of a surface mount-type crystal resonator according to a variation of Example 2 as viewed from below.
Figure 20:
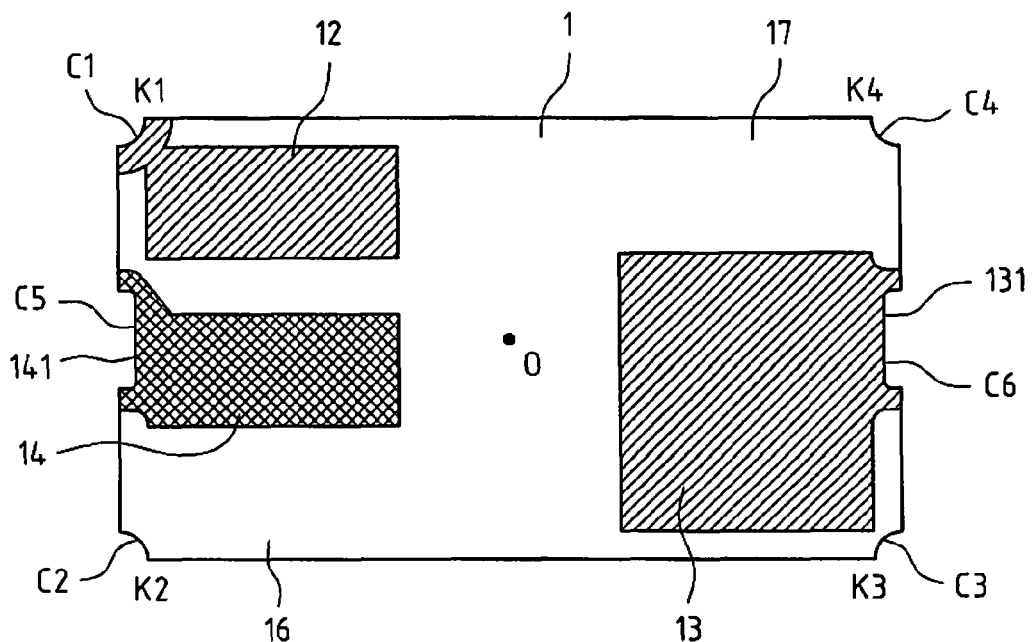
FIG. 20 is a schematic diagram of a surface mount-type crystal resonator according to a variation of Example 2 as viewed from below.

Next, a surface mount-type crystal resonator according to Example 2 of the present invention will be described with reference to the drawings. FIG. 15 is a schematic diagram of the surface mount type crystal resonator of Example 2 as viewed from below. FIG. 16 is a partial cross-sectional view taken along line A21-A21 of FIG. 15, schematically showing the surface mount type crystal resonator mounted on a circuit substrate. FIG. 17 is a schematic diagram of the surface mount type crystal resonator mounted on a circuit substrate as viewed in direction B2 of FIG. 15. FIGS. 18 to 20 are schematic diagrams of a surface mount-type crystal resonator according to a variation of Example 2 as viewed from the bottom.

Note that the surface mount type crystal resonator of Example 2 has the same configuration as those of Example 1 and its variations and the like described above, except for the configuration of electrodes including terminal electrodes and the configuration of castellations. The same parts have an operational effect similar to those of Example 1 and its variations and the like described above. Therefore, parts similar to those of Example 1 and its variations and the like described above are indicated with the same reference symbols and will not be described in detail.

As shown in FIGS. 15 and 16, the surface mount type crystal resonator of Example 2 includes a crystal resonator plate 3 that is an electronic component element, a base 1 that has a concave portion with an opening at an upper portion thereof and holds (accommodates) the crystal resonator plate 3, and a lid 2 that is joined to the opening portion of the base 1 to hermetically enclose the crystal resonator plate 3 held by the base 1.

The base 1 is in the shape of a rectangular prism and is made of an appropriate multilayer of a ceramic (e.g., alumina, etc.) and a conductive material (e.g., tungsten, molybdenum, etc.). As shown in FIG. 16, the base 1 has an accommodation portion 10 having a concave cross-section, and a bank portion 11 that is provided at a periphery of the accommodation portion 10, surrounding the accommodation portion 10. Specifically, the base 1 includes a ceramic base main body 1a in the shape of a rectangular plate (as viewed from above), and a ceramic frame 1b that has a large hollow portion at a middle thereof and has substantially the same outer size (as viewed from above) as that of the base main body 1a. The base main body 1a and the frame 1b are integrally baked.

Note that an upper surface of the bank portion 11 is flat, on which the base 1 and the lid 2 are sealed. A sealing member or a metal layer may be formed on the bank portion 11, depending on the sealing configuration. For example, the metal layer is configured by forming a nickel plating layer and a gold plating layer on an upper surface of a metallized layer made of tungsten, molybdenum or the like.

Also, circular (as viewed from above) castellations C1, C2, C3 and C4 are vertically formed at four corners K1, K2, K3 and K4 of an outer circumference (outer periphery as viewed from above) of the base 1. Specifically, the castellations C1, C2, C3 and C4 are formed, extending from a bottom surface to a top surface (upper surface) of the base 1, at the four corners K1, K2, K3 and K4 of the outer circumference (outer periphery as viewed from above) of the base 1 and on side surfaces of the base 1.

Also, castellations C5 and C6 having the same dimension and the same shape are vertically formed at middle portions of both short sides of the bottom surface of the base 1, perfectly facing each other. In Example 2, the castellations C5 and C6 are each in the shape of an oval having a width dimension W of 0.5 mm, for example. Side-surface terminal electrodes 121 and 131 that are linking electrodes are formed vertically across the castellations C5 and C6 (from the bottom surface via the side surface to the upper surface of the base 1). The side-surface terminal electrodes 121 and 131 are electrically linked (connected) to terminal electrodes 12 and 13 described below. Specifically, the side-surface terminal electrodes 121 and 131 are formed only at the castellations C5 and C6. The side-surface terminal electrodes 121 and 131 are set to have a width dimension of 0.5 mm and are extended to an upper edge portion (upper surface) of the base 1. Since the side-surface terminal electrodes 121 and 131 are thus formed only at the castellations C5 and C6, the side-surface terminal electrodes 121 and 131 themselves can be preferably easily formed, and the width dimensions thereof can be preferably easily set, but the present invention is not limited to this. The side-surface terminal electrodes 121 and 131 may be extended off the castellations C5 and C6.

The bottom surface of the base 1 is caused to be in the shape of a rectangle as viewed from above. On the bottom surface of the base 1, the two terminal electrodes 12 and 13 that are to be joined to an external circuit substrate 4 (see FIG. 16) using a conductive adhesive material D are formed. The terminal electrodes 12 and 13 function as input/output external connection terminals (described below) of the crystal resonator plate 3. The terminal electrodes 12 and 13 are extended and electrically connected to electrode pads 122 and 132 (the electrode pad 132 is not shown) formed on an inner bottom surface of the base 1 via the side-surface terminal electrodes 121 and 131 (the side-surface terminal electrode 131 is not shown) on the castellations C5 and C6. Note that the terminal electrodes 12 and 13, the side-surface terminal electrodes 121 and 131, and the electrode pads 122 and 132 are configured by integrally baking a metallization material (e.g., tungsten, molybdenum, etc.) and the base 1 into a metallized structure, forming nickel plating on the metallized structure, and forming gold plating on the nickel plating.

The crystal resonator plate 3 (an electronic component element as used herein) is mounted between the electrode pads 122 and 132. A pair of an driving electrode and a lead electrode is formed on each of the top and bottom surfaces of the crystal resonator plate 3. The pair of the driving electrode and the lead electrode is, for example, formed by laminating on the crystal resonator plate 3: chromium and gold in this stated order; chromium, gold and Chromium in this stated order; chromium, silver and chromium in this stated order; or chromium and silver in this stated order (the material firstly stated contacts the crystal resonator plate 3 in each case). These electrodes (the pair of the driving electrode and the lead electrode) can be formed by a thin film forming means (e.g., vacuum deposition, sputtering or the like). Thereafter, the lead electrodes of the crystal resonator plate 3 are conductively joined to the electrode pads 122 and 132 using a conductive adhesive material (not shown). The crystal resonator plate 3 is held by the base 1. For example, the conductive junction of the driving electrodes of the crystal resonator plate 3 and the electrode pads 122 and 123 of the base 1 can be achieved using a conductive adhesive material, such as a conductive resin adhesive, a metal bump, a brazing material or the like.

The lid 2 that hermetically seals the base 1 is configured by forming a sealing material, such as glass or the like, on a ceramic, such as alumina or the like. The lid 2 has substantially the same or slightly smaller outer shape (as viewed from above) than that of the base 1.

The crystal resonator plate 3 is placed in the accommodation portion 10 of the base 1, and is then covered with the lid 2, followed by hermetic sealing in a heating furnace or the like. Thus, a surface mount-type crystal resonator is completed. As shown in FIG. 15, the completed crystal resonator product is joined onto interconnection pads 41 and 42 of the circuit substrate 4 made of a glass epoxy material via a conductive adhesive material D, such as solder or the like.

The lid 2 may include a metal member that is obtained by forming a sealing material, such as a metal brazing material or the like, on a base metal, depending on the sealing method. In this case, the crystal resonator plate 3 can be hermetically enclosed with the lid 2 and the base 1 by means of welding (e.g., seam welding, beam irradiation or the like), brazing in a heating furnace, or the like.

The present invention is characterized by a combination of the terminal electrodes 12 and 13 formed on the bottom surface of the base 1, the castellations C5 and C6, and the side-surface terminal electrodes 121 and 131. Hereinafter, this characteristic configuration will be described in detail.

In Example 2, one terminal electrode (specifically, the first terminal electrode 12) is formed (shifted) closer to a position of the corner K1 that is one corner position on the bottom surface of the base 1. Also, one terminal electrode (specifically, the second terminal electrode 13) is formed (shifted) closer to a position of the corner K3 that is a first diagonal position diagonally opposite the corner K1 on the bottom surface of the base 1.

Also, a position of the corner K2 (another corner position as used herein) that is another corner facing the corner K1 in the short side direction of the bottom surface of the base 1, and a position of the corner K4 that is a second diagonal position diagonally opposite the corner K2 of the bottom surface of the base 1, are caused to be no-electrode regions 16 and 17 in which no terminal electrode is formed along the short sides of the bottom surface of the base 1.

In addition, on the bottom surface of the base 1, the first and second terminal electrodes 12 and 13 are symmetrically arranged about a center point O (as viewed from above) of the bottom surface of the base 1 (point symmetry). Also, the terminal electrodes 12 and 13 have the same shape.

With the aforementioned configuration, in Example 2, the first terminal electrode 12 formed at the corner K1 that is the one corner position, and the second terminal electrode 13 formed eccentrically to the corner K3 diagonally opposite the corner K1, are provided. Therefore, the crystal resonator can be electrically and mechanically joined to the circuit substrate 4 using the conductive adhesive material D (e.g., solder, etc.) without a reduction in connectivity. Also, when the crystal resonator is electrically and mechanically joined to the circuit substrate 4 using the conductive adhesive material D, a thermal expansion difference may occur between the crystal resonator (specifically, the base 1) and the circuit substrate 4. However, since the other corner position (the position of the corner K2) facing the one corner position in the short side direction of the bottom surface of the base 1 and the second diagonal position (the position of the corner K4) diagonally opposite the other corner position on the bottom surface of the base 1, are caused to be the no-electrode regions 16 and 17 in which the first and second terminal electrodes 12 and 13 are not formed, stress generated during junction of the crystal resonator (specifically, the base 1) can be relieved from the first and second terminal electrodes 12 and 13 toward the no-electrode regions 16 and 17. As a result, it is possible to prevent the stress from being concentrated on the conductive adhesive material D interposed between the crystal resonator and the circuit substrate 4, thereby making it difficult for a fatigue fracture to occur from the conductive adhesive material D.

Also, as shown in FIG. 17, uniform fillet formation of the conductive adhesive material D is promoted on the side-surface terminal electrodes 121 and 131 facing each ether. In addition, the fillet of the conductive adhesive material D enters the castellations C5 and C6, resulting in an anchoring effect. As a result, tension is generated, pulling the crystal resonator (the base 1) equally in opposite directions along the long side direction of the bottom surface, so that not only the junction strength between the crystal resonator and the circuit substrate 4 can be improved, but also a force that two-dimensionally rotates the crystal resonator (the base 1) can be suppressed.

Also, the side-surface terminal electrodes 121 and 131 are formed only vertically across the castellations C5 and C6 (from the bottom surface via the side surface to the upper edge portion of the base 1). The side-surface terminal electrodes 121 and 131 are caused to have a width dimension of 0.5 mm. The fillet of the conductive adhesive material D, such as solder or the like, that is formed (adhered) on the side-surface terminal electrodes 121 and 131, has a broad shape and is therefore robust. Therefore, it can be expected that the junction strength between the base 1 (the side-surface terminal electrodes 121 and 131) and the circuit substrate 4 (the interconnection pads 41 and 42) is improved, and the suppression of two-dimensional rotation of the crystal resonator (the base 1) is improved. In addition, the visibility of the fillet of the conductive adhesive material D, such as solder or the like, is improved, resulting in more reliable inspection. Therefore, the reliability of mounting and junction of the crystal resonator to the circuit substrate 4 can be further improved. Note that the present invention is not limited to the case where the side-surface terminal electrodes 121 and 131 are extended to the upper edge portion of the base 1, and the side-surface terminal electrodes 121 and 131 may be extended somewhere on the base 1.

It has been assumed above that the side-surface terminal electrodes 121 and 131 have a width dimension of 0.5 mm. Alternatively, if the width dimension of the side-surface terminal electrodes 121 and 131 is 0.5 mm or more and is less than the width dimension of the short side of the bottom surface of the base 1, it can be similarly expected that the fillet of the conductive adhesive material D, such as solder or the like, is broadened and the visibility is improved. Therefore, the reliability of mounting and junction of the crystal resonator package and the circuit substrate 4 can be further improved.

Also, since the first and second terminal electrodes 12 and 13 are symmetrically arranged about the center point as viewed from above (center point O) of the bottom surface of the base 1, the directionality of the first and second terminal electrodes 12 and 13 is removed. Therefore, not only the workability of mounting the crystal resonator is improved, but also stress can be efficiently reduced in a uniform manner with respect to the center point O of the base 1. As a result, it is possible to dramatically suppress the occurrence of a crack (e.g., a solder crack, etc.) in the conductive adhesive material D.

Also, the first and second terminal electrodes 12 and 13 of Example 2 are formed only on the bottom surface of the base 1, and are separated from the sides of the bottom surface of the base 1, except for the castellations C5 and C6. This is in part because, in a pre-baked ceramic green sheet in which the bases 1 are arranged in a matrix with the bases 1 being separated from each other by dicing grooves (cleavage grooves), a metallization pattern for terminal electrodes is formed without contacting the dicing groove. When the ceramic green sheet after baking is separated into the individual bases 1 at the dicing grooves, the workability of separation is prevented from being hindered by the metallization pattern for terminal electrodes that would otherwise straddle the dicing groove.

In Example 2, the first and second terminal electrodes 12 and 13 closest to the corners K1 and K3 of the bottom surface of the base 1, are configured as a two-terminal electrode that functions as the input/output external connection terminals of the crystal resonator plate 3. However, at least one of the first and second terminal electrodes 12 and 13 may also function as a functional terminal in addition to the input/output external connection terminal. Hereinafter, a specific example thereof will be described with reference to the drawings.

Specifically, as shown in FIG. 18, two terminal electrodes 12 and 14 are formed and arranged (shifted) closer to a position of the corner K1 that is one corner position of the bottom surface of the base 1 and in parallel with the short side direction of the bottom surface of the base 1. The two terminal electrodes 12 and 14 constitute a first terminal electrode group. Also, two terminal electrodes 13 and 15 are formed and arranged (shifted) closer to a position of the corner K3 that is the first diagonal position diagonally opposite the corner K1 of the bottom surface of the base 1 and in parallel with the short side direction of the bottom surface of the base 1. The terminal electrodes 13 and 15 constitute a second terminal electrode group. A position of the corner K2 (another corner position as used herein) that is another corner facing the corner K1 in the short side direction of the bottom surface of the base 1, and a position of the corner K4 that is a second diagonal position diagonally opposite the corner K2 of the bottom surface of the base 1, are caused to be no-electrode regions 16 and 17 in which no terminal electrode is formed along the short sides of the bottom surface of the base 1. In addition, on the bottom surface of the base 1, the first and second terminal electrode groups are symmetrically arranged about the center point O (as viewed from above) of the bottom surface of the base 1. The terminal electrodes 12 and 13 have the same shape, and the terminal electrodes 14 and 15 have the same shape. Moreover, on the bottom surface of the base 1, the shapes of the first and second terminal electrode groups are symmetric about the center point O (as viewed from above) of the bottom surface of the base 1 (point symmetry).

Note that the terminal electrodes 12 and 13 function as input/output external connection terminals of the crystal resonator plate 3. The terminal electrodes 14 and 15 function as ground terminal electrodes connected to the metal lid 2 (not shown) via the castellations C5 and C6.

Specifically, the castellations C5 and C6 having the same dimension and the same shape are vertically formed at middle portions of both the short sides of the bottom surface of the base 1, perfectly facing each other. In Example 2, the castellations C5 and C6 are each in the shape of an oval having a width dimension W of 0.5 mm, for example. Side-surface terminal electrodes 141 and 151 are formed vertically across the castellations C5 and C6 (from the bottom surface via the side surface to the upper surface of the base 1). The side-surface terminal electrodes 141 and 151 are electrically linked (connected) to the terminal electrodes 14 and 15. Specifically, the side-surface terminal electrodes 141 and 151 are formed only at the castellations C5 and C6. The side-surface terminal electrodes 141 and 151 are set to have a width dimension of 0.5 mm and are extended to an upper edge portion (upper surface) of the base 1. Since the side-surface terminal electrodes 141 and 151 are thus formed only at the castellations C5 and C6, the side-surface terminal electrodes 141 and 151 themselves can be preferably easily formed, and the width dimensions thereof can be preferably easily set, but the present invention is not limited to this. The side-surface terminal electrodes 141 and 151 may be extended off the castellations C5 and C6.

According to the thus configured variation of Example 2 shown in FIG. 18, in addition to the operational effect of Example 2, electromagnetic noise occurring in the external circuit substrate 4 can be captured by the metal lid 2 and removed via the terminal electrodes (ground terminal electrodes) 14 and 15. As a result, it is possible to eliminate an adverse influence of electromagnetic noise on the crystal resonator plate 3 in the crystal resonator. Note that only one of the terminal electrodes 14 and 15 may be set as a ground terminal electrode.

Also, another specific example is shown in FIG. 19. As shown in FIG. 19, in a first terminal electrode group, two terminal electrodes 12 and 14 are formed and arranged closer to the corner K1 of the bottom surface of the base 1 and in parallel with the long side direction of the bottom surface of the base 1. In a second terminal electrode group, two terminal electrodes 13 and 15 are formed and arranged closer to the corner K3 diagonally opposite the corner K1 of the bottom surface of the base 1 and in parallel with the long side direction of the bottom surface of the base 1.

Also, the terminal electrodes 12 and 13 are input/output external connection terminals connected to the crystal resonator plate 3. The terminal electrodes 14 and 15 are ground external connection terminals (ground terminal electrodes) connected to the metal lid 2 (not shown) via through holes.

Also, the terminal electrodes 12 and 13 are provided closer to the corners K1 and K3 of the base 1 than the terminal electrodes 14 and 15, which are arranged in parallel with the terminal electrodes 12 and 13, respectively. Also, the terminal electrode 12 is extended to the castellations C1 and C5, and the terminal electrode 13 is extended to the castellations C3 and C6. Note that only one of the terminal electrodes 14 and 15 may be set as a ground terminal electrode.

Also, the position of the corner K2 (another corner position as used herein) that is another corner facing the corner K1 in the short side direction of the bottom surface of the base 1, and a position of the corner K4 that is a second diagonal position diagonally opposite the corner K2 of the bottom surface of the base 1, are caused to be no-electrode regions 16 and 17 in which no terminal electrode is formed along the short sides of the bottom surface of the base 1. In addition, on the bottom surface of the base 1, the first and second terminal electrode groups are symmetrically arranged about the center point O (as viewed from above) of the bottom surface of the base 1. The terminal electrodes 12 and 13 have the same shape, and the terminal electrodes 14 and 15 have the same shape. Moreover, on the bottom surface of the base 1, the shapes of the first and second terminal electrode groups are symmetric about the center point O (as viewed from above) of the bottom surface of the base 1 (point symmetry).

Also, circular (as viewed from above) castellations C1, C2, C3 and C4 are vertically formed at four corners K1, K2, K3 and K4 of an outer circumference (outer periphery as viewed from above) of the base 1. Specifically, the castellations C1, C2, C3 and C4 are formed, extending from the bottom surface to the top surface (upper surface) of the base 1, at the four corners K1, K2, K3 and K4 of the outer circumference (outer periphery as viewed from above) of the base 1.

Moreover, castellations C5 and C6 having the same dimension and the same shape are vertically formed at middle portions of both the short sides of the bottom surface of the base 1, perfectly facing each other. In Example 2, the castellations C5 and C6 are each in the shape of an oval having a width dimension W of 0.5 mm, for example. Side-surface terminal electrodes 121 and 131 are formed vertically across the castellations C5 and C6 (from the bottom surface via the side surface to the upper surface of the base 1). The side-surface terminal electrodes 121 and 131 are electrically linked (connected) to the terminal electrodes 12 and 13. Specifically, the side-surface terminal electrodes 121 and 131 are formed only at the castellations C5 and C6. The side-surface terminal electrodes 121 and 131 are set to have a width dimension of 0.5 mm and are extended to an upper edge portion (upper surface) of the base 1. Since the side-surface terminal electrodes 121 and 131 are thus formed only at the castellations C5 and C6, the side-surface terminal electrodes 121 and 131 themselves can be preferably easily formed, and the width dimensions thereof can be preferably easily set, but the present invention is not limited to this. The side-surface terminal electrodes 121 and 131 may be extended off the castellations C5 and C6.

According to the thus configured variation of Example 2 shown in FIG. 19, in addition to the operational effect of Example 1, electromagnetic noise occurring in the external circuit substrate 4 can be captured by the metal lid 2 and removed via the terminal electrodes (ground terminal electrodes) 14 and 15. As a result, it is possible to eliminate an adverse influence of electromagnetic noise on the crystal resonator plate 3 in the crystal resonator. Note that only one of the terminal electrodes 14 and 15 may be set as a ground terminal electrode.

Also, another specific example is shown in FIG. 20. As shown in FIG. 20, circular (as viewed from above) castellations C1, C2, C3 and C4 are vertically formed at four corners K1, K2, K3 and K4 of an outer circumference (outer periphery as viewed from above) of the base 1. Also, oval castellations C5 and C6 having the same dimensions and the same shape are formed at middle portions of both the short sides of the bottom surface of the base 1, perfectly facing each other. Side-surface terminal electrodes 131 and 141 are formed at lower portions of the castellations C5 and C6 (from the bottom surface to the side surface of the base 1). The side-surface terminal electrodes 131 and 141 are electrically linked (connected) to the terminal electrodes 13 and 14. Specifically, the side-surface terminal electrodes 131 and 141 are formed only at the castellations C5 and C6.

As shown in FIG. 20, in a first terminal electrode group, the two terminal electrodes 12 and 14 are formed and arranged closer to the corner K1 of the bottom surface of the base 1 and in parallel with the long side direction of the bottom surface of the base 1. In a second terminal electrode group, the single terminal electrode 13 is formed and arranged closer to the corner K3 diagonally opposite the corner K1 of the bottom surface of the base 1. Also, the terminal electrodes 12 and 13 are input/output external connection terminals connected to the crystal resonator plate 3, and the terminal electrode 14 is a ground terminal electrode connected to the metal lid 2 (not shown) via the castellation C5.

The terminal electrode 12 is provided closer to the corner K1 of the base 1 than the terminal electrode 14 provided in parallel with the terminal electrode 12, while the terminal electrode 13 is provided close to the corner K3 of the base 1. Also, the terminal electrode 12 is extended to the castellation C1, the terminal electrode 13 is extended to the castellation C6, and the terminal electrode 14 is extended to the castellation C5.

Also, a position of the corner K2 (another corner position as used herein) that is another corner facing the corner K1 in the short side direction of the bottom surface of the base 1, and a position of the corner K4 that is a second diagonal position diagonally opposite the corner K2 of the bottom surface of the base 1, are caused to be no-electrode regions 16 and 17 in which no terminal electrode is formed along the short sides of the bottom surface of the base 1.

According to the thus configured variation of Example 2 shown in FIG. 20, in addition to the operational effect of Example 2, electromagnetic noise occurring in the external circuit substrate 4 can be captured by the metal lid 2 and removed via the terminal electrode (ground terminal electrode) 14. As a result, it is possible to eliminate an adverse influence of electromagnetic noise on the crystal resonator plate 3 in the crystal resonator.

Figure 21:
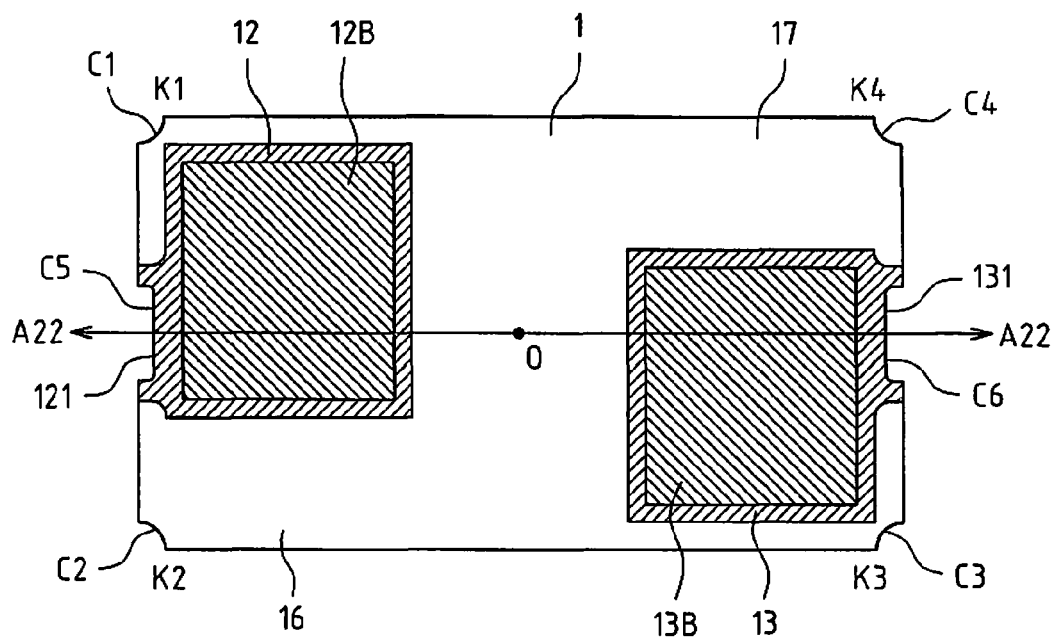
FIG. 21 is a schematic diagram of a surface mount-type crystal resonator according to Example 2-2 of the present invention as viewed from below.
Figure 22:
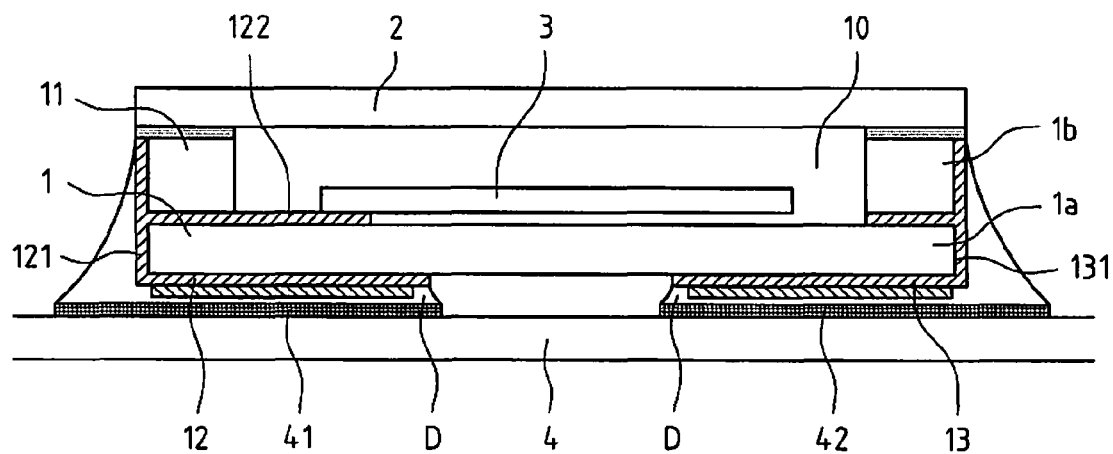
FIG. 22 is a partial cross-sectional view taken along line A22-A22 of FIG. 21, schematically showing the surface mount type crystal resonator mounted on a circuit substrate.

Next, a surface mount-type crystal resonator according to another example (Example 2-2) of Example 2 of the present invention will be described with reference to FIGS. 21 and 22. FIG. 21 is a schematic diagram showing the surface mount type crystal resonator of Example 2-2 as viewed from below. FIG. 22 is a partial cross-sectional view taken along line A22-A22 of FIG. 21, schematically showing the surface mount type crystal resonator mounted on a circuit substrate. Note that parts similar to those of Example 2 are indicated with the same reference symbols and will not be described in detail.

As shown in FIG. 21, in the crystal resonator according to Example 2-2, the first terminal electrode 12 is formed eccentrically to the corner K1 of the bottom surface of the base 1. The second terminal electrode 13 is formed eccentrically to the corner K3 diagonally opposite the corner K1.

In addition, bumps 12B and 13B that are slightly smaller than the terminal electrodes 12 and 13 and have substantially the same shape (as viewed from above) as that of the terminal electrodes 12 and 13, are formed on the terminal electrodes 12 and 13, respectively. The bumps 1213 and 13B made of the same metallization material (tungsten, molybdenum, etc.) are laminated in a desired shape on the metallization material of the terminal electrodes 12 and 13. The metallization materials of the terminal electrodes 12 and 13 and the bumps 12B and 1313, and the base 1 are integrally baked, so that nickel plating is formed on the metallization material, and gold plating is formed on the nickel plating.

In Example 2-2, with this configuration, even if stress is generated due to a thermal expansion difference between the base 1 and the circuit substrate 4, the stress can be more efficiently reduced due to a step between the bumps 12B and 13B and the terminal electrodes 12 and 13. In addition, with this configuration, the conductive adhesive material D is accumulated in a gap portion between the base 1 and the circuit substrate 4 that are separated by the bumps 12B and 13B. The accumulated conductive adhesive material D can further enhance the junction strength between the base 1 and the circuit substrate 4. Also, the bumps 12B and 13B can be formed with considerable ease and low cost by laminating the same metallization material on the terminal electrodes 12 and 13.

In Example 2 and its variations, and Example 2-2 described above, the castellations (specifically, the castellations C5 and C6) and the side-surface terminal electrodes (specifically, any of the side-surface terminal electrodes 121, 131, 141 and 151) that are formed at the middle portions of both the short sides of the bottom surface of the base 1, have the same dimensions and the same shape, and perfectly face each other, have been described. Alternatively, a part of the castellation C5 (including a side-surface terminal electrode) and a part of the castellation C6 (including a side-surface terminal electrode) may face each other in the vicinity of the middle portions of both the short sides of the bottom surface of the base 1, instead of the castellations C5 and C6 perfectly facing each other. Alternatively, castellations C5 and C6 (including side-surface terminal electrodes) having different dimensions or different shapes may be combined.

Also, in Example 2 and its variations, and Example 2-2 described above, the castellations C5 and C6 (including side-surface terminal electrodes) are formed on the short sides of the base 1 (the bottom surface of the base 1), the present invention is not limited to this. The castellations or side-surface terminal electrodes may be formed on the long sides of the base 1 (the bottom surface of the base 1). Thus, by forming at least one castellation or side-surface terminal electrode on any of the side portions of the base 1, fillet formation of a conductive adhesive material, such as solder or the like, on the side-surface terminal electrode can be promoted, so that the fillet of the conductive adhesive material (e.g., solder, etc.) enters the castellation, resulting in an anchoring effect. As a result, not only the junction strength of the crystal resonator to the circuit substrate is improved, but also a force that two-dimensionally rotates the crystal resonator package (specifically, the base 1) (an electronic component package) is prevented by the fillet of the conductive adhesive material (e.g., solder, etc.)

Figure 23:
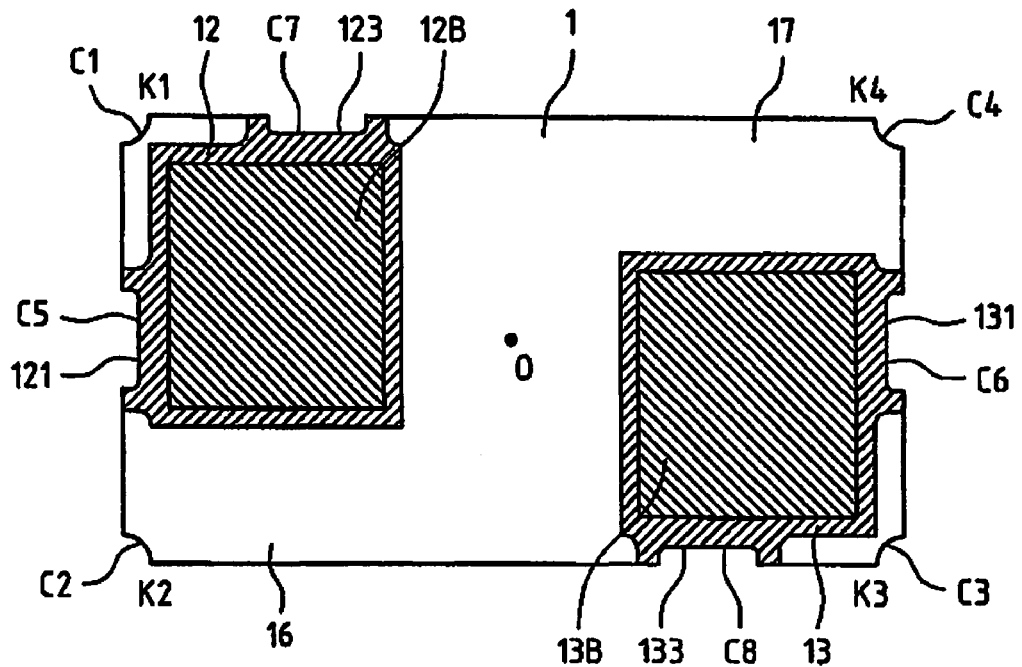
FIG. 23 is a schematic diagram of a surface mount-type crystal resonator according to a variation of Example 2.2 as viewed from below.

Specifically, an example in which a castellation or a side-surface terminal electrode is formed on a long side of the base 1 (the bottom surface of the base 1) is shown in FIG. 23.

In the example of FIG. 23, castellations C7 and C8 and side-surface terminal electrodes 123 and 133 are formed on the long sides of the base 1 (the bottom surface of the base 1).

In the example of FIG. 23, the castellations C7 and C8 having the same dimension and the same shape are vertically formed on both the long sides of the bottom surface of the base 1 and closer to the corners K1 and K3. The side-surface terminal electrodes 123 and 133 are extended vertically across the castellations C7 and C8 (from the bottom surface via the side surface to the upper surface of the base 1). The terminal electrodes 12 and 13 are extended to the castellations C7 and C8, respectively. The terminal electrodes 12 and 13 are electrically linked (connected) not only to the side-surface terminal electrodes 121 and 131 formed on the castellations C5 and C6, but also to the side-surface terminal electrodes 123 and 133.

In this case, in addition to the operational effects of Example 2 and its variations, and Example 2-2 described above, not only can the strength of the junction to the circuit substrate 4 be further improved, but also a force that two-dimensionally rotates the crystal resonator package (specifically, the base 1) can be further suppressed.

Note that, in the example of FIG. 23, the castellations C7 and C8 are formed eccentrically to the corners K1 and K3 on both the long sides of the bottom surface of the base 1, the present invention is not limited to this. In particular, castellations having the same shape may be preferably formed at middle portions of both the long sides of the base 1, facing each other. With this configuration, uniform fillet formation of the conductive adhesive material D is promoted on the side-surface terminal electrodes formed on the facing castellations. In addition, the fillet of the conductive adhesive material D enters the castellations, resulting in an anchoring effect. As a result, tension is generated, pulling the crystal resonator package equally in opposite directions along the short side direction of the bottom surface, so that a force that two-dimensionally rotates the crystal resonator package (the base 1) can be further suppressed.

Also, in Example 2-2 of FIGS. 21 and 22 described above, bumps 12B and 13B that are slightly smaller than the terminal electrodes 12 and 13 and have substantially the same shape (as viewed from above) as that of the terminal electrodes 12 and 13, are formed on the terminal electrodes 12 and 13, respectively. The shapes of the bumps 12B and 13B are not limited to these. For example, bumps 128 and 138 having shapes shown in FIGS. 24, 25, 26 and 27 may be employed.

Figure 24:
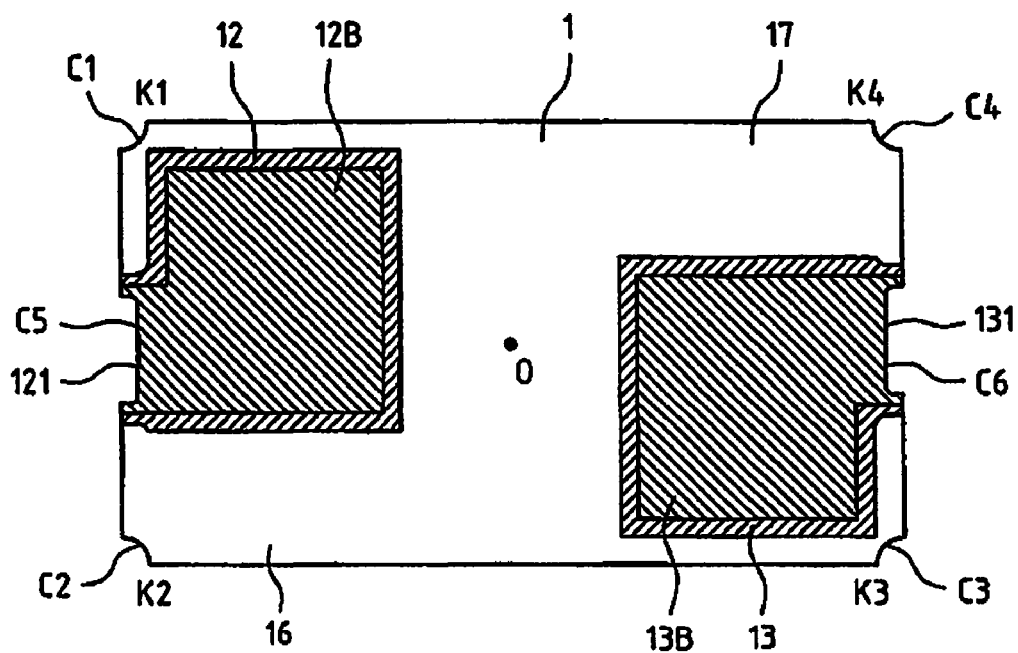
FIG. 24 is a schematic diagram of a surface mount-type crystal resonator according to a variation of Example 2.2 as viewed from below.

The bumps 12B and 13B of FIG. 24 are extended along with the terminal electrodes 12 and 13 to the castellations C5 and C6, respectively, so that the bumps 12B and 13B are electrically linked (connected) to the side-surface terminal electrodes 121 and 131 formed on the castellations C5 and C6, respectively. Thus, the bumps 12B and 13B are electrically linked to the side-surface terminal electrodes 121 and 131 formed on the castellations C5 and C6, so that the conductive adhesive material D is suppressed from escaping toward the inside of the base 1, and therefore, the fillet can be easily formed, resulting in an improvement in the strength of the junction between the base 1 and the circuit substrate 4.

Figure 25:
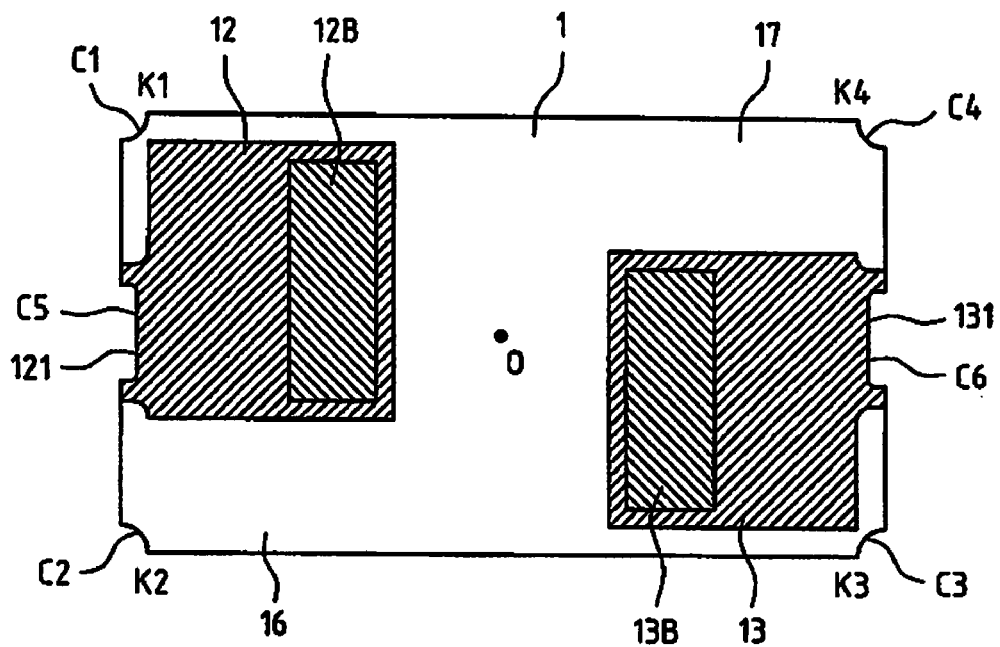
FIG. 25 is a schematic diagram of a surface mount-type crystal resonator according to a variation of Example 2.2 as viewed from below.

The bumps 12B and 13B of FIG. 25 are formed on the terminal electrode 12 that is a first terminal electrode and on the terminal electrode 13 that is a second terminal electrode. The bump 12B formed on the terminal electrode 12 and the bump 13B formed on the terminal electrode 13 are provided close to each other in the long side direction of the bottom surface of the base 1.

As shown in FIG. 25, since the bump 12B formed on the terminal electrode 12 and the bump 13B formed on the terminal electrode 13 are provided close to each other in the long side direction of the bottom surface of the base 1, when the crystal resonator package is joined to the circuit substrate 4 via the conductive adhesive material D, stress generated in the circuit substrate 4 due to a difference in thermal expansion coefficient between the crystal resonator package (specifically, the base 1) and the circuit substrate 4 is relieved in a plane direction (by expansion or contraction), so that the stress can be reduced.

Figure 26:
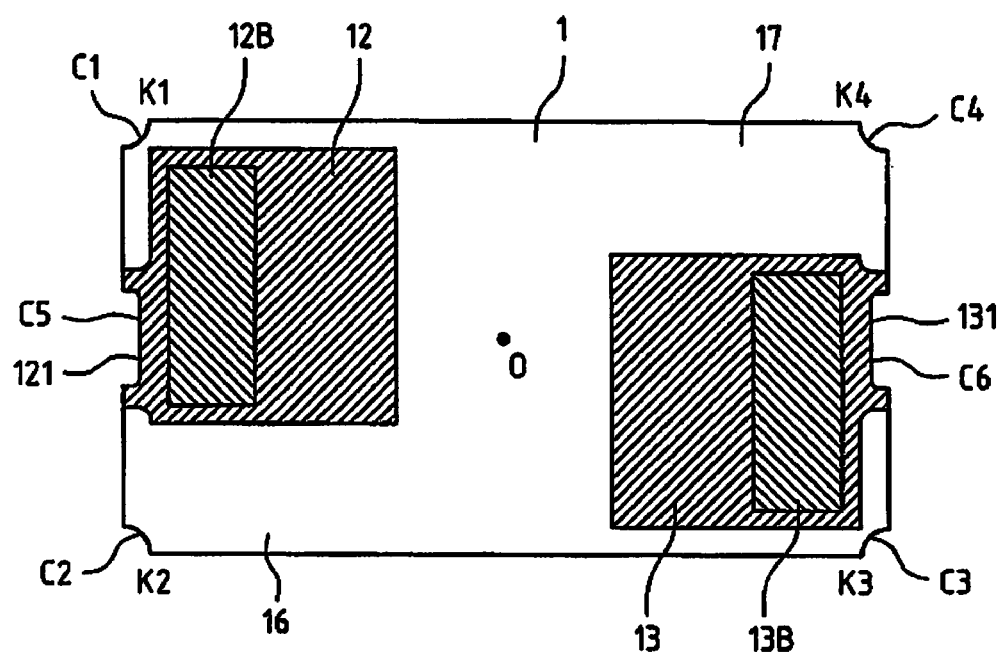
FIG. 26 is a schematic diagram of a surface mount-type crystal resonator according to a variation of Example 2.2 as viewed from below.

The bumps 12B and 13B of FIG. 26 are formed on the terminal electrode 12 that is a first terminal electrode and on the terminal electrode 13 that is a second terminal electrode. The bump 12B formed on the terminal electrode 12 and the bump 13B formed on the terminal electrode 13 are separated from each other in the long side direction of the bottom surface of the base 1.

As shown in FIG. 26, since the bump 12B formed on the terminal electrode 12 and the bump 13B formed on the terminal electrode 13 are separated from each other in the long side direction of the bottom surface of the base 1, when the crystal resonator package is joined to the circuit substrate 4 via the conductive adhesive material D, stress generated in the circuit substrate 4 due to a difference in thermal expansion coefficient between the crystal resonator package (specifically, the base 1) and the circuit substrate 4 can be relieved in a thickness direction, so that the stress can be reduced.

Figure 27:
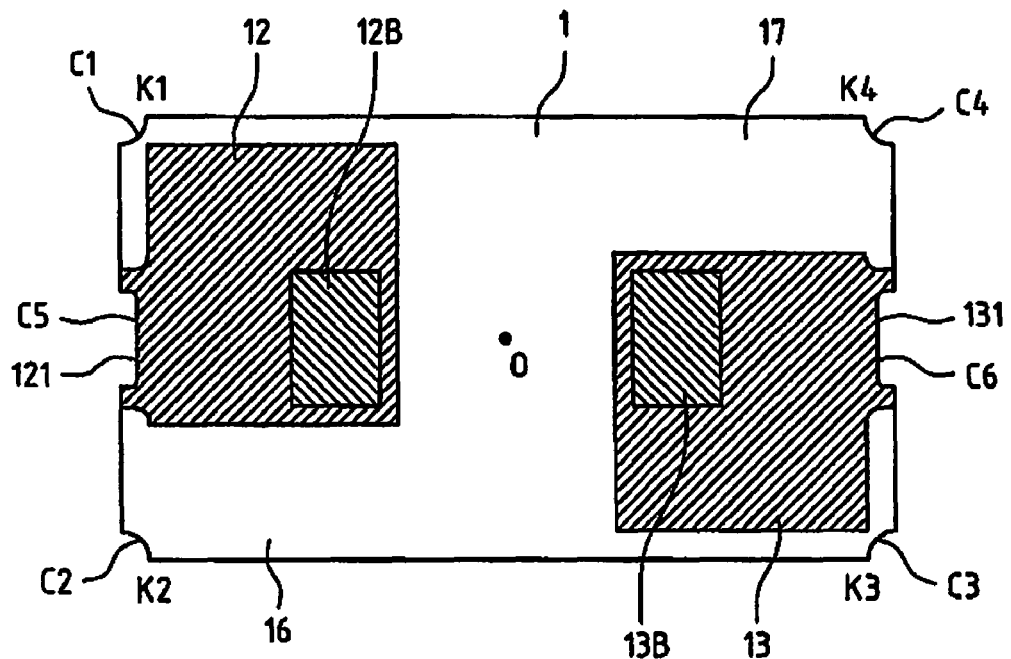
FIG. 27 is a schematic diagram of a surface mount-type crystal resonator according to a variation of Example 2-2 as viewed from below.

The bumps 12B and 13B of FIG. 27 are formed on the terminal electrode 12 that is a first terminal electrode and on the terminal electrode 13 that is a second terminal electrode. The bump 12B formed on the terminal electrode 12 and the bump 13B formed on the terminal electrode 13 are provided close to each other in the long side direction of the bottom surface of the base 1, perfectly facing each other.

As shown in FIG. 27, the bump 12B formed on the terminal electrode 12 and the bump 13B formed on the terminal electrode 13 are provided close to each other in the long side direction of the bottom surface of the base 1, perfectly facing each other. Therefore, when the crystal resonator package is joined to the circuit substrate 4 via the conductive adhesive material D, stress generated in the circuit substrate 4 due to a difference in thermal expansion coefficient between the crystal resonator package (specifically, the base 1) and the circuit substrate 4 can be relieved in a plane direction (by expansion or contraction), so that the stress can be reduced. Specifically, the junction regions of the terminal electrodes 12 and 13 are caused to be uniform, thereby preventing a variation in joined state (mounted state) to the circuit substrate 4. As a result, when the base 1 is joined to the circuit substrate 4, unnecessary expansion and contraction stress does not occur in the long or short side direction of the base 1. Also, in the example of FIG. 27, the bumps 12B and 13B are caused to be smaller than those of the example of FIG. 25, so that stress generated in the circuit substrate 4 due to a difference in thermal expansion coefficient between the crystal resonator package (specifically; the base 1) and the circuit substrate 4 can be relieved in more directions, so that the stress can be efficiently reduced.

Figure 28:
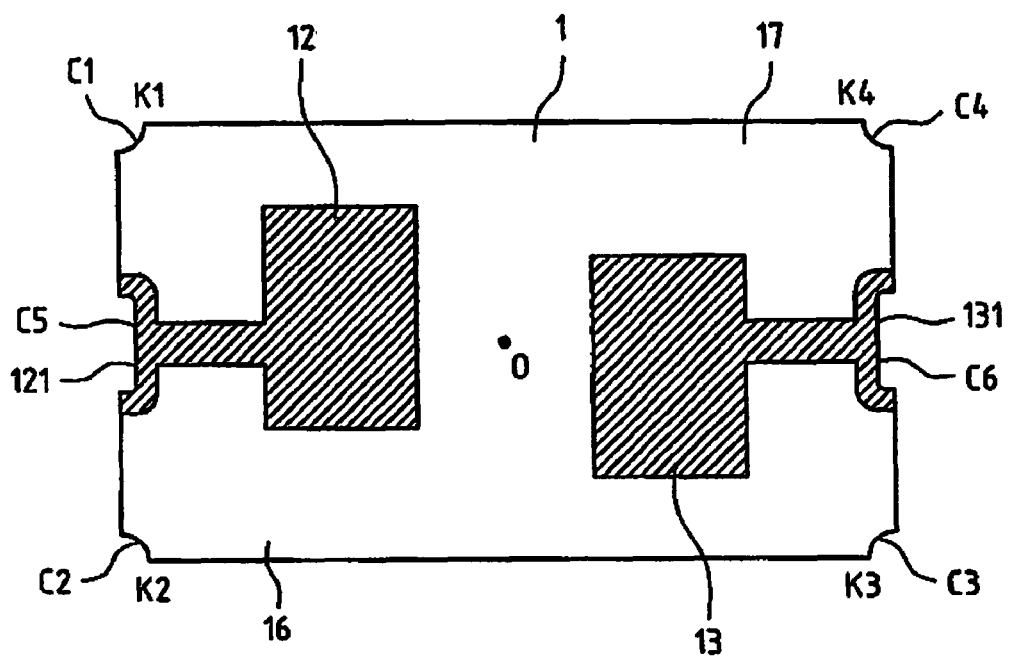
FIG. 28 is a schematic diagram of a surface mount-type crystal resonator according to a variation of Example 2 as viewed from below.

Also, although, in Examples 2 and 2-2 and their variations, the length of an electrode extended from a terminal electrode to a side-surface terminal electrode formed on a castellation is set to be short, the present invention is not limited to this. As shown in FIG. 28, the length of an electrode extended from a terminal electrode to a side-surface terminal electrode formed on a castellation may be set to be long. Also, in addition to the example of FIG. 28, a via hole may be formed in the bottom surface of the base 1, and an electrode may be extended from the terminal electrodes 12 and 13 to the via hole.

In FIG. 28, the terminal electrode (first terminal electrode) 12 and the terminal electrode (second terminal electrode) 13 are provided close to each other in the vicinity of the middle of the bottom surface of the base 1 in the long side direction of the bottom surface, perfectly facing each other. Since the terminal electrode 12 and the terminal electrode 13 are thus formed in the vicinity of the middle of the bottom surface of the base 1, when the crystal resonator package is joined to the circuit substrate 4 via the conductive adhesive material D, stress generated in the circuit substrate 4 due to a difference in thermal expansion coefficient between the crystal resonator package (specifically, the base 1) and the circuit substrate 4 can be relieved in a plane direction (by expansion or contraction), so that the stress can be reduced. Specifically, the junction regions of the terminal electrodes 12 and 13 are formed uniformly, thereby preventing variation in their joined state (mounted state), joined to the circuit substrate 4. As a result, when the base 1 is joined to the circuit substrate 4, unnecessary expansion and contraction stress does not occur in the long or short side direction of the base 1. Also, in the example of FIG. 28, the areas (as viewed from above) of the terminal electrodes 12 and 13 are caused to be smaller than those of the other examples described above. Therefore, stress generated in the circuit substrate 4 due to a difference in thermal expansion coefficient between the crystal resonator package (specifically, the base 1) and the circuit substrate 4 can be relieved in more directions, so that the stress can be efficiently reduced.

Example 3

Figure 29:
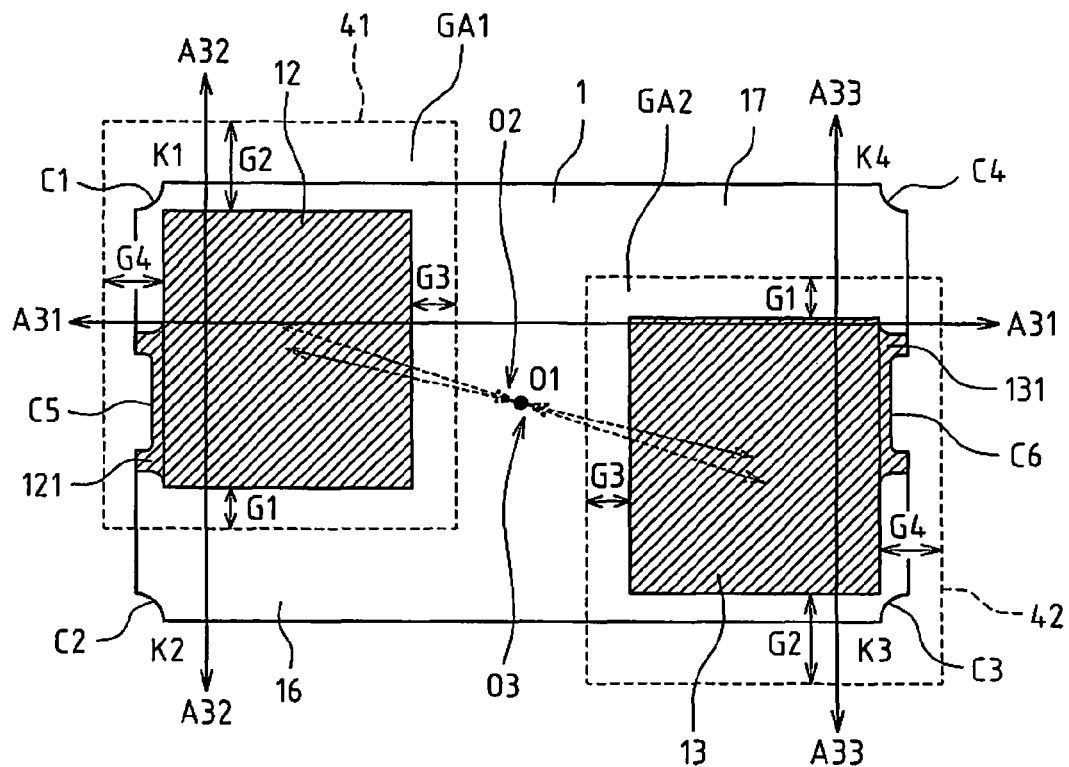
FIG. 29 is a schematic diagram of a surface mount-type crystal resonator according to Example 3 of the present invention as viewed from below.
Figure 30:
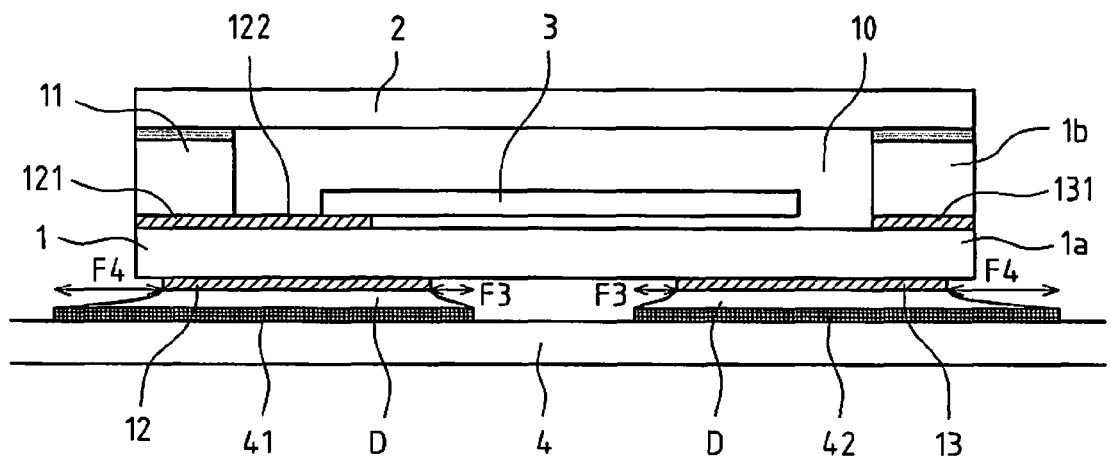
FIG. 30 is a partial cross-sectional view taken along line A31-A31 of FIG. 29, schematically showing the surface mount type crystal resonator mounted on a circuit substrate.
Figure 31:
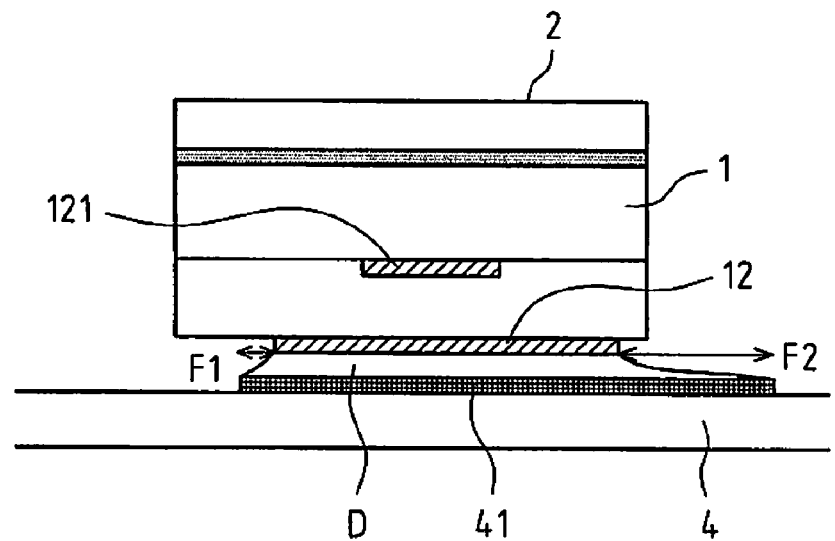
FIG. 31 is a partial cross-sectional view taken along line A32-A32 of FIG. 29, schematically showing the surface mount type crystal resonator mounted on the circuit substrate.
Figure 32:
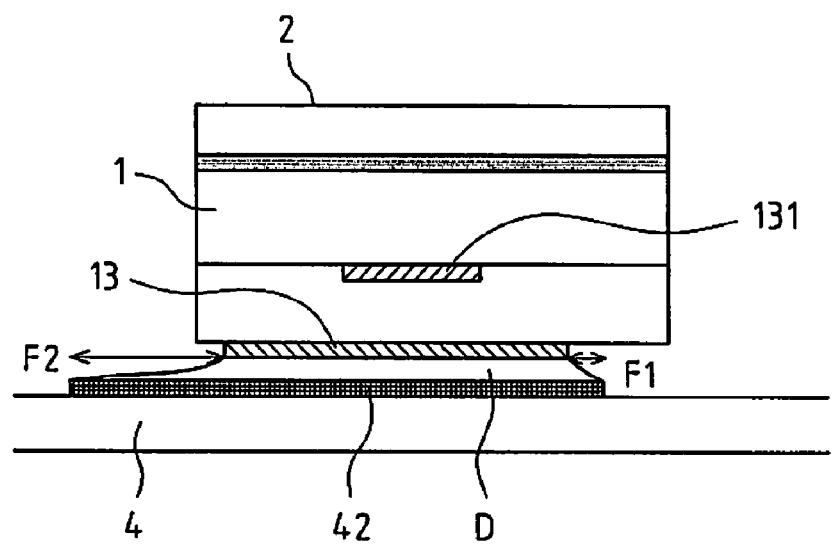
FIG. 32 is a partial cross-sectional view taken along line A33-A33 of FIG. 29, schematically showing the surface mount type crystal resonator mounted on the circuit substrate.

Next, a surface mount-type crystal resonator according to Example 3 of the present invention will be described with reference to the drawings. FIG. 29 is a schematic diagram of the surface mount type crystal resonator of Example 3 as viewed from below. FIG. 30 is a partial cross-sectional view taken along line A31-A31 of FIG. 29, schematically showing the surface mount type crystal resonator mounted on a circuit substrate. FIG. 31 is a partial cross-sectional view taken along line A32-A32 of FIG. 29, schematically showing the surface mount type crystal resonator mounted on the circuit substrate. FIG. 32 is a partial cross-sectional view taken along line A33-A33 of FIG. 29, schematically showing the surface mount type crystal resonator mounted on the circuit substrate.

Note that the surface mount type crystal resonator of Example 3 has the same configuration as those of Examples 1 and 2 and their variations and the like described above, except for the configuration of electrodes including terminal electrodes and the configuration of castellations. The same parts have an operational effect similar to those of Examples 1 and 2 and their variations and the like described above. Therefore, parts similar to those of Examples 1 and 2 and their variations and the like described above are indicated with the same reference symbols and will not be described in detail.

As shown in FIGS. 29 to 32, the surface mount type crystal resonator of Example 3 includes a crystal resonator plate 3 that is an electronic component element, a base 1 that has a concave portion with an opening at an upper portion thereof and holds (accommodates) the crystal resonator plate 3, and a lid 2 that is joined to the opening portion of the base 1 to hermetically enclose the crystal resonator plate 3 held by the base 1.

The base 1 is in the shape of a rectangular prism and is made of an appropriate multilayer of a ceramic (e.g., alumina, etc.) and a conductive material (e.g., tungsten, molybdenum, etc.). As shown in FIG. 30, the base 1 has an accommodation portion 10 having a concave cross-section, and a bank portion 11 that is provided at a periphery of the accommodation portion 10, surrounding the accommodation portion 10. Specifically, the base 1 includes a ceramic base main body 1*a* in the shape of a rectangular plate (as viewed from above), and a ceramic frame 1b that has a large hollow portion at a middle thereof and has substantially the same outer size (as viewed from above) as that of the base main body 1a. The base main body 1a and the frame 1b are integrally baked.

Note that an upper surface of the bank portion 11 is flat, on which the base 1 and the lid 2 are sealed. A sealing member or a metal layer may be formed on the bank portion 11, depending on the sealing configuration. For example, the metal layer is configured by forming a nickel plating layer and a gold plating layer on an upper surface of a metallized layer made of tungsten, molybdenum or the like.

Also, circular (as viewed from above) castellations C1, C2, C3 and C4 are vertically formed at four corners K1, K2, K3 and K4 of an outer circumference (outer periphery as viewed from above) of the base 1. Specifically, the castellations C1, C2, C3 and C4 are formed, extending from a bottom surface to a top surface (upper surface) of the base 1, at the four corners K1, K2, K3 and K4 of the outer circumference (outer periphery as viewed from above) of the base 1 and on side surfaces of the base 1.

Also, castellations C5 and C6 having the same dimension and the same shape are vertically formed at middle portions of both short sides of the bottom surface of the base 1, perfectly facing each other. In Example 3, the castellations C5 and C6 are each in the shape of an oval having a width dimension W of 0.5 mm, for example. Side-surface terminal electrodes 121 and 131 that are linking electrodes are formed vertically across the castellations C5 and C6 (from the bottom surface via the side surface to the upper surface of the base 1). The side-surface terminal electrodes 121 and 131 are electrically linked (connected) to terminal electrodes 12 and 13 described below. Specifically, the side-surface terminal electrodes 121 and 131 are formed only at the castellations C5 and C6. The side-surface terminal electrodes 121 and 131 are set to have a width dimension of 0.5 mm and are extended to an upper edge portion (upper surface) of the base 1. Since the side-surface terminal electrodes 121 and 131 are thus formed only at the castellations C5 and C6, the side-surface terminal electrodes 121 and 131 themselves can be preferably easily formed, and the width dimensions thereof can be preferably easily set, but the present invention is not limited to this. The side-surface terminal electrodes 121 and 131 may be extended off the castellations C5 and C6.

The bottom surface of the base 1 is caused to be in the shape of a rectangle as viewed from above. On the bottom surface of the base 1, the two terminal electrodes 12 and 13 are formed that are to be joined to an external circuit substrate 4 (see FIG. 30) using a conductive adhesive material D. The terminal electrodes 12 and 13 function as input/output external connection terminals (described below) of the crystal resonator plate 3. The terminal electrodes 12 and 13 are extended and electrically connected to electrode pads 122 and 132 (the electrode pad 132 is not shown) formed on an inner bottom surface of the base 1 via the side-surface terminal electrodes 121 and 131 (the side-surface terminal electrode 131 is not shown) on the castellations C5 and C6. Note that the terminal electrodes 12 and 13, the side-surface terminal electrodes 121 and 131, and the electrode pads 122 and 132 are configured by integrally baking a metallization material (e.g., tungsten, molybdenum, etc.) and the base 1 into a metallized structure, forming nickel plating on the metallized structure, and forming gold plating on the nickel plating.

The crystal resonator plate 3 (electronic component element as used herein) is mounted between the electrode pads 122 and 132. A pair of an driving electrode and a lead electrode is formed on each of the top and bottom surfaces of the crystal resonator plate 3. The pair of the driving electrode and the lead electrode is, for example, formed by laminating on the crystal resonator plate 3: chromium and gold in this stated order; chromium, gold and chromium in this stated order; chromium, silver and chromium in this stated order; or chromium and silver in this stated order (the material firstly stated contacts the crystal resonator plate 3 in each case). These electrodes (the pair of the driving electrode and the lead electrode) can be formed by a thin film forming means (e.g., vacuum deposition, sputtering or the like). Thereafter, the lead electrodes of the crystal resonator plate 3 are conductively joined to the electrode pads 122 and 132 using a conductive adhesive material (not shown). The crystal resonator plate 3 is held by the base 1. For example, the conductive junction of the driving electrodes of the crystal resonator plate 3 and the electrode pads 122 and 123 of the base 1 can be achieved using a conductive adhesive material, such as a conductive resin adhesive, a metal bump, a brazing material or the like.

The lid 2 that hermetically seals the base 1 is configured by forming a sealing material, such as glass or the like, on a ceramic, such as alumina or the like. The lid 2 has substantially the same or slightly smaller outer shape (as viewed from above) than that of the base 1.

The crystal resonator plate 3 is placed in the accommodation portion 10 of the base 1, and is then covered with the lid 2, followed by hermetic sealing in a heating furnace or the like. Thus, a surface mount-type crystal resonator is completed. As shown in FIGS. 29 and 30, the completed crystal resonator product is joined onto interconnection pads 41 and 42 of the circuit substrate 4 made of a glass epoxy material via the conductive adhesive material D, such as solder or the like.

The lid 2 may include a metal member that is obtained by forming a sealing material, such as a metal brazing material or the like, on a base metal, depending on the sealing method. In this case, the crystal resonator plate 3 can be hermetically enclosed with the lid 2 and the base 1 by means of welding (e.g., seam welding, beam irradiation or the like), brazing in a heating furnace, or the like.

The present invention is characterized by a combination of the terminal electrodes 12 and 13 symmetrically formed about a center position O1 of the bottom surface of the base 1, and the definition of the smallest gap dimensions G1 to G4 from edge portions of the terminal electrodes 12 and 13 to edge portions of the interconnection pads 41 and 42 when the terminal electrodes 12 and 13 of the base 1 are overlaid on and joined to the interconnection pads 41 and 42 of the circuit substrate 4. Hereinafter, this characteristic configuration will be described in detail.

In Example 3, one rectangular terminal electrode (specifically, the first terminal electrode 12) is formed (shifted) closer to a position of the corner K1 that is one corner position on the bottom surface of the base 1. Also, one rectangular terminal electrode (specifically, the second terminal electrode 13) is formed (shifted) closer to a position of the corner K3 that is a first diagonal position diagonally opposite the corner K1 on the bottom surface of the base 1.

Also, a position of the corner K2 (another corner position as used herein) that is another corner facing the corner K1 in the short side direction of the bottom surface of the base 1, and a position of the corner K4 that is a second diagonal position diagonally opposite the corner K2 of the bottom surface of the base 1, are caused to be no-electrode regions 16 and 17 in which no terminal electrode is formed along the short sides of the bottom surface of the base 1.

In addition, on the bottom surface of the base 1, the first and second terminal electrodes 12 and 13 are symmetrically arranged about the center point O1 (as viewed from above) of the bottom surface of the base 1 (point symmetry). Also, the terminal electrodes 12 and 13 have the same shape.

Also, when the base 1 is joined to the circuit substrate 4 while the first and second terminal electrodes 12 and 13 of the base 1 are overlaid on the interconnection pads 41 and 42 of the circuit substrate 4, smallest gap dimensions G1 from edge portions closer to the no-electrode regions 16 and 17 of the first and second terminal electrodes 12 and 13 to edge portions of the interconnection pads 41 and 42, are caused to be the same. Specifically, when the first and second terminal electrodes 12 and 13 are overlaid on and joined to the interconnection pads 41 and 42, a smallest gap dimension from an edge portion (plan-view-near-no-electrode-region edge portion as used herein) closer to the no-electrode region 16 of the first terminal electrode 12 in the short side direction of the bottom surface of the base 1 to an edge portion as viewed from above of the interconnection pad 41, and a smallest gap dimension from an edge portion (plan-view-near-no-electrode-region edge portion as used herein) closer to the no-electrode region 17 of the second terminal electrode 13 in the short side direction of the bottom surface of the base 1 to an edge portion as viewed from above of the interconnection pad 42, have the same smallest gap dimension G1.

Also, when the base 1 is joined to the circuit substrate 4 while the first and second terminal electrodes 12 and 13 of the base 1 are overlaid on the interconnection pads 41 and 42 of the circuit substrate 4, smallest gap dimensions G2 from edge portions facing the edge portions closer to the no-electrode regions 16 and 17 of the first and second terminal electrodes 12 and 13 to edge portions of the interconnection pads 41 and 42, are caused to be the same. Specifically, when the first and second terminal electrodes 12 and 13 are overlaid on and joined to the interconnection pads 41 and 42, a smallest gap dimension from an edge portion (plan-view-near-no-electrode-region edge portion as used herein) facing the edge portion closer to the no-electrode region 16 of the first terminal electrode 12 in the short side direction of the bottom surface of the base 1 to an edge portion as viewed from above of the interconnection pad 41, and a smallest gap dimension from an edge portion (plan-view-near-no-electrode-region edge portion as used herein) facing the edge portion closer to the no-electrode region 17 of the second terminal electrode 13 in the short side direction of the bottom surface of the base 1 to an edge portion as viewed from above of the interconnection pad 42, have the same smallest gap dimension G2.

Also, when the base 1 is joined to the circuit substrate 4 while the first and second terminal electrodes 12 and 13 of the base 1 are overlaid on the interconnection pads 41 and 42 of the circuit substrate 4, smallest gap dimensions G3 from edge portions closer to the center point O1 of the base 1 of the first and second terminal electrodes 12 and 13 to edge portions of the interconnection pads 41 and 42, are caused to be the same. Specifically, when the first and second terminal electrodes 12 and 13 are overlaid on and joined to the interconnection pads 41 and 42, a smallest gap dimension from an edge portion (plan-view-near-no-electrode-region edge portion as used herein) facing an edge portion closer to the no-electrode region 17 of the first terminal electrode 12 in the long side direction of the bottom surface of the base 1 to an edge portion as viewed from above of the interconnection pad 41, and a smallest gap dimension from an edge portion (plan-view-near-no-electrode-region edge portion as used herein) facing an edge portion closer to the no-electrode region 16 of the second terminal electrode 13 in the long side direction of the bottom surface of the base 1 to an edge portion as viewed from above of the interconnection pad 42, have the same smallest gap dimension G3.

Also, the smallest gap dimensions G1 and G3 are set to be equal to each other. In this state, the terminal electrodes 12 and 13 of the base 1 are positioned with respect to the interconnection pads 41 and 42 of the circuit substrate 4, and the base 1 is joined to the circuit substrate 4 via the conductive adhesive material D. In this case, for example, a middle point O2 between the centers of the interconnection pads 41 and 42 of the circuit substrate 4, and a middle point O3 between the terminal electrodes 12 and 13 of the base coincide with each other (the same position).

With the aforementioned configuration, in Example 3, the first terminal electrode 12 formed at the corner K1 that is one corner position, and the second terminal electrode 13 formed eccentrically to the corner K3 diagonally opposite the corner K1, are provided. Therefore, the crystal resonator can be electrically and mechanically joined to the circuit substrate 4 using the conductive adhesive material D (e.g., solder, etc.) without a reduction in connectivity. Also, when the crystal resonator is electrically and mechanically joined to the circuit substrate 4 using the conductive adhesive material D, a thermal expansion difference may occur between the crystal resonator (specifically, the base 1) and the circuit substrate 4. However, since another corner position (the position of the corner K2) facing the one corner position in the short side direction of the bottom surface of the base 1 and a second diagonal position (the position of the corner K4) diagonally opposite the other corner position on the bottom surface of the base 1, are caused to be no-electrode regions 16 and 17 in which the first and second terminal electrodes 12 and 13 are not formed, stress generated during junction of the crystal resonator (specifically, the base 1) can be relieved from the first and second terminal electrodes 12 and 13 toward the no-electrode regions 16 and 17. As a result, it is possible to prevent the stress from being concentrated on the conductive adhesive material D interposed between the crystal resonator and the circuit substrate 4, thereby making it difficult for a fatigue fracture to occur from the conductive adhesive material D.

Also, since the first and second terminal electrodes 12 and 13 are symmetrically arranged about the center point O1 of the bottom surface of the base 1, the directionality of the first and second terminal electrodes 12 and 13 is removed, so that not only the workability of mounting the crystal resonator is improved, but also stress can be efficiently reduced in a uniform manner with respect to the center point O1 of the base. As a result, it is possible to dramatically suppress the occurrence of a crack (e.g., a solder crack, etc.).

Also, the first and second terminal electrodes 12 and 13 of Example 3 are formed only on the bottom surface of the base 1, and are separated from the sides of the bottom surface of the base 1, except for the castellations C5 and C6. This is in part because, in a pre-baked ceramic green sheet in which the bases 1 are arranged in a matrix with the bases 1 being separated from each other by dicing grooves (cleavage grooves), a metallization pattern for terminal electrodes is formed without contacting the dicing groove. When the ceramic green sheet after baking is separated into the individual bases 1 at the dicing grooves, the workability of separation is prevented from being hindered by the metallization pattern for terminal electrodes that would otherwise straddle the dicing groove.

Also, in Example 3, as shown in FIGS. 29, 31 and 32, fillets of the conductive adhesive material D that are formed from edge portions closer to the no-electrode regions 16 and 17 of the first and second terminal electrodes 12 and 13 to edge portions of the interconnection pads 41 and 42, have substantially the same dimensions (width dimension F1). Specifically, for the smallest gap dimensions G1, G2 and G3, the gap dimension between the first terminal electrode 12 and the interconnection pad 41 and the gap dimension between the second terminal electrode 13 and the interconnection pad 42 are caused to be the same. Therefore, a fillet of the conductive adhesive material D formed from an edge portion closer to the no-electrode region 16 of the first terminal electrode 12 in the short side direction of the bottom surface of the base 1 to an edge portion as viewed from above of the interconnection pad 41, and a fillet of the conductive adhesive material D formed from an edge portion closer to the no-electrode region 17 of the second terminal electrode 13 in the short side direction of the bottom surface of the base 1 to an edge portion as viewed from above of the interconnection pad 42, have the same width dimension F1.

Also, similarly, as shown in FIGS. 29, 31 and 32, fillets of the conductive adhesive material D that are formed from edge portions facing the edge portions closer to the no-electrode regions 16 and 17 of the first and second terminal electrodes 12 and 13 to edge portions of the interconnection pads 41 and 42, have substantially the same dimension (width dimension F2). Specifically, a fillet of the conductive adhesive material D formed from an edge portion (edge portion near the one corner in a plan view as used herein) facing the edge portion closer to the no-electrode region 16 of the first terminal electrode 12 in the short side direction of the bottom surface of the base 1 to an edge portion as viewed from above of the interconnection pad 41, and a fillet of the conductive adhesive material D formed from an edge portion (plan-view-near-corner edge portion) of the corner K3 that is a first diagonal position facing the edge portion closer to the no-electrode region 17 of the second terminal electrode 13 in the short side direction of the bottom surface of the base 1 to the edge portion as viewed from above of the interconnection pad 42, have the same width dimension F2.

Also, similarly, as shown in FIGS. 29 and 30, fillets of the conductive adhesive material D formed from edge portions closer to the center O1 of the bottom surface of the base 1 of the first and second terminal electrodes 12 and 13 to edge portions of the interconnection pads 41 and 42, have substantially the same width dimensions F3. Specifically, a fillet of the conductive adhesive material D formed from an edge portion (plan-view-near-no-electrode-region edge portion as used herein) facing the edge portion closer to the no-electrode region 17 of the first terminal electrode 12 in the long side direction of the bottom surface of the base 1 to an edge portion as viewed from above of the interconnection pad 41, and a fillet of the conductive adhesive material D formed from an edge portion (plan-view-near-no-electrode-region edge portion as used herein) closer to the no-electrode region 16 of the second terminal electrode 13 in the long side direction of the bottom surface of the base 1 to an edge portion as viewed from above of the interconnection pad 42, have the same width dimension F3. Also, the smallest gap dimensions G1 and G3 are the same.

As described above, the smallest gap dimensions G1 and G3 are the same, the width dimensions F1 and F3 of the fillets of the conductive adhesive material D are the same. Therefore, tension forces caused by the fillets of the conductive adhesive material D are balanced, so that a force that two-dimensionally rotates the crystal resonator (the base 1) can be suppressed. In particular, by setting the gap dimensions G1 and G3 to be the same, the force that two-dimensionally rotates from the first and second terminal electrodes 12 and 13 toward the no-electrode regions 16 and 17, is effectively suppressed.

Therefore, not only the adverse influence of a crack (e.g., a solder crack) or the like in the conductive adhesive material D is suppressed, but also the crystal resonator package (specifically, the base 1) is prevented from being two-dimensionally rotated when it is mounted. Therefore, the reliability of mounting and junction of the crystal resonator package to the circuit substrate 4 can be improved.

Note that, in Example 3, in addition to the gap dimensions G1, G2 and G3, smallest gap dimensions G4 from edge portions facing the edge portions closer to the center point O1 of the bottom surface of the base 1 of the first and second terminal electrodes 12 and 13 to edge portions of the interconnection pads 41 and 42 when the base 1 is joined to the circuit substrate 4 while the first and second terminal electrodes 12 and 13 of the base 1 are overlaid on the interconnection pads 41 and 42 of the circuit substrate 4, are the same. Specifically, when the first and second terminal electrodes 12 and 13 are overlaid on and joined to the interconnection pads 41 and 42, a smallest gap dimension from an edge portion (plan-view-near-no-electrode-region edge portion as used herein) facing the edge portion closer the no-electrode region 17 of the first terminal electrode 12 in the long side direction of the bottom surface of the base 1 to an edge portion as viewed from above of the interconnection pad 41, and a smallest gap dimension from an edge portion (plan-view-near-no-electrode-region edge portion as used herein) facing the edge portion closer to the no-electrode region 16 of the second terminal electrode 13 in the long side direction of the bottom surface of the base 1 to an edge portion as viewed from above of the interconnection pad 42, have the same smallest gap dimension G4.

In Example 3, the smallest gap dimension G4 is thus set. Therefore, as shown in FIGS. 29 and 30, fillets of the conductive adhesive material D formed from edge portions facing the edge portions closer to the no-electrode regions 16 and 17 of the first and second terminal electrodes 12 and 13 to edge portions of the interconnection pads 41 and 42, have substantially the same dimension F4. Specifically, a fillet of the conductive adhesive material formed from an edge portion (edge portion near the one corner in a plan view as used herein) facing the edge portion closer to the no-electrode region 17 of the first terminal electrode 12 in the long side direction of the bottom surface of the base 1 to an edge portion as viewed from above of the interconnection pad 41, and a fillet of the conductive adhesive material D formed from an edge portion (plan-view-near-corner edge portion as used herein) of the corner K3 that is a first diagonal position facing the edge portion closer to the no-electrode region 16 of the second terminal electrode 13 in the long side direction of the bottom surface of the base 1 to an edge portion as viewed from above of the interconnection pad 42, have the same width dimension F4. Also, the smallest gap dimensions G2 and G4 have the same dimension as each other.

Since the smallest gap dimension G4 is thus set, tension forces caused by the fillets of the conductive adhesive material D (e.g., solder, etc.) are balanced, so that the crystal resonator (the base 1) is prevented from being displaced in the long side direction. Therefore, the force that two-dimensionally rotates the crystal resonator (the base 1) due to the displacement can also be suppressed. As a result, the force that two-dimensionally rotates the crystal resonator (the base 1) can be further suppressed.

Also, as described above, the smallest gap dimensions G2 and G4 are the same as each other. Therefore, the fillet width dimensions F2 and F4 of the conductive adhesive material D are the same as each other. The fillets of the conductive adhesive material D have substantially the same tension force, so that a force that two-dimensionally rotates the crystal resonator package (specifically, the base 1) is not generated.

Moreover, as described above, in Example 3, in addition to the gap dimensions G1, G2, G3 and G4, a circumferential gap region (GA1) from the edge portions of the first terminal electrode 12 to the edge portions of the interconnection pad 41, and a circumferential gap region (GA2) from the edge portions of the second terminal electrode 13 to the edge portions of the interconnection pad 42 are preferably symmetrically arranged about the center point O1 (as viewed from the top) of the bottom surface of the base 1.

In this case, the fillets of the conductive adhesive material D formed in the first and second terminal electrodes 12 and 13 have substantially the same shape as each other. Moreover, the fillets of the conductive adhesive material D formed in the first and second terminal electrodes 12 and 13 are symmetrically formed about the center point O1 of the bottom surface of the base 1. Therefore, the fillets of the conductive adhesive material D have substantially the same tension force, so that a force that two-dimensionally rotates the crystal resonator (the base 1) is not generated.

Figure 33:
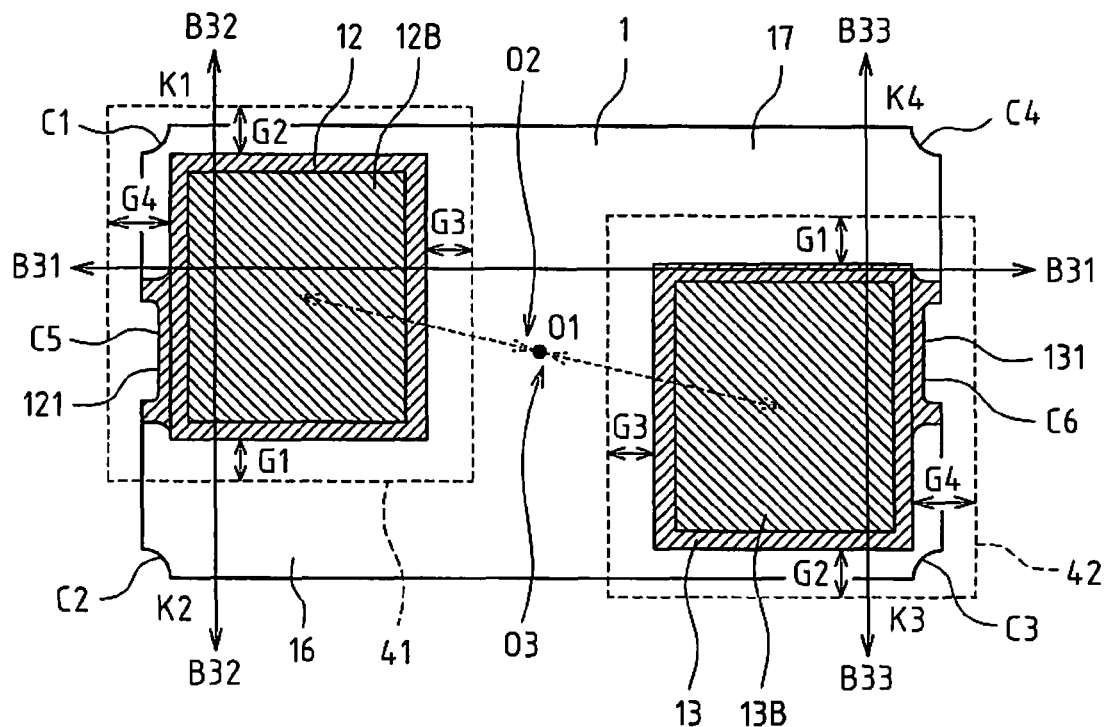
FIG. 33 is a schematic diagram of a surface mount-type crystal resonator according to Example 3-2 of the present invention as viewed from below.
Figure 34:
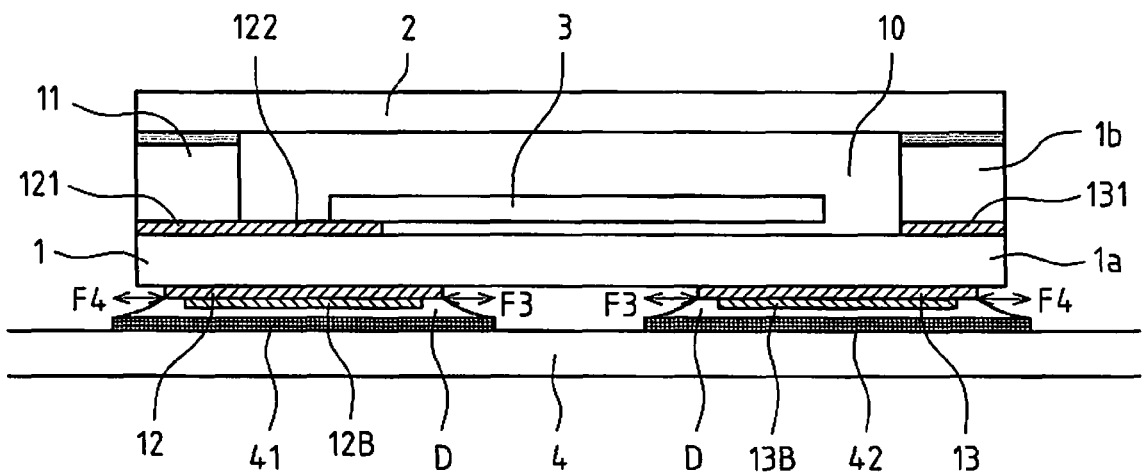
FIG. 34 is a partial cross-sectional view taken along line B31-B31 of FIG. 33, schematically showing the surface mount type crystal resonator mounted on a circuit substrate.
Figure 35:
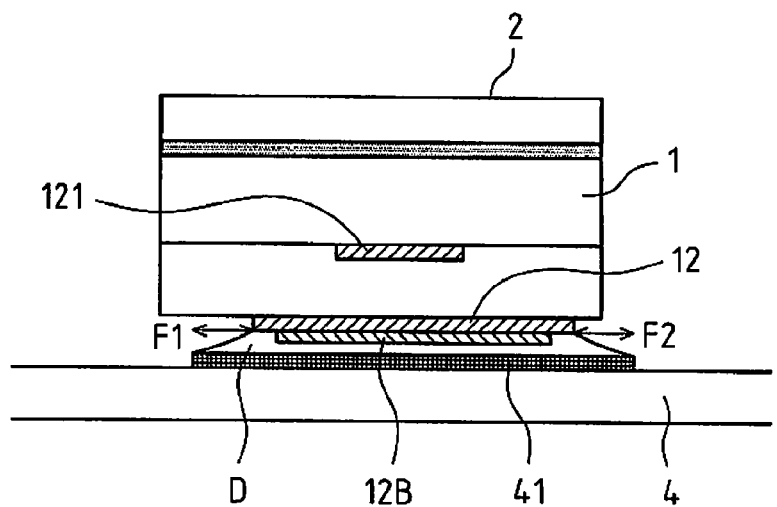
FIG. 35 is a partial cross-sectional view taken along line B32-B32 of FIG. 33, schematically showing the surface mount type crystal resonator mounted on the circuit substrate.
Figure 36:
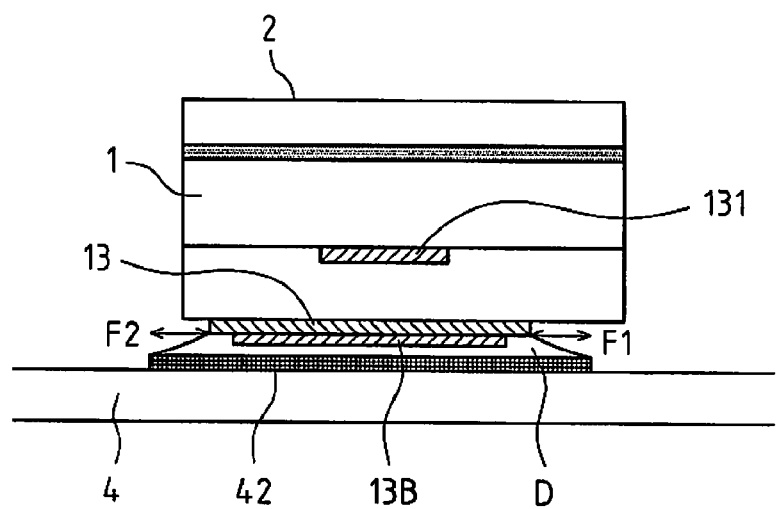
FIG. 36 is a partial cross-sectional view taken along line B33-B33 of FIG. 33, schematically showing the surface mount type crystal resonator mounted on a circuit substrate.

Next, a surface mount-type crystal resonator according to another example (Example 3.2) of Example 3 of the present invention will be described with reference to FIGS. 33 to 36. FIG. 33 is a schematic diagram showing the surface mount type crystal resonator of Example 3-2 as viewed from below. FIG. 34 is a partial cross-sectional view taken along line B31-B31 of FIG. 33, schematically showing the surface mount type crystal resonator mounted on a circuit substrate. FIG. 35 is a partial cross-sectional view taken along line B32-B32 of FIG. 33, schematically showing the surface mount type crystal resonator mounted on the circuit substrate. FIG. 36 is a partial cross-sectional view taken along line B33-B33 of FIG. 33, schematically showing the surface mount type crystal resonator mounted on the circuit substrate. Note that parts similar to those of Example 3 are indicated with the same reference symbols and will not be described in detail.

As shown in FIG. 33, in the crystal resonator according to Example 3-2, a first terminal electrode 12 is formed eccentrically to a corner K1 of a bottom surface of a base 1. A second terminal electrode 13 is formed eccentrically to a corner K3 diagonally opposite the corner K1.

In addition, bumps 12B and 13B that are slightly smaller than the terminal electrodes 12 and 13 and have substantially the same shape (as viewed from above) as that of the terminal electrodes 12 and 13, are formed on the terminal electrodes 12 and 13, respectively. The bumps 12B and 13B made of the same metallization material (tungsten, molybdenum, etc.) as that of the terminal electrodes 12 and 13 are laminated in a desired shape on the metallization material of the terminal electrodes 12 and 13. The terminal electrodes 12 and 13 and the bumps 12B and 13B are formed by integrally baking the metallization materials for them and the base 1, and forming nickel plating on the metallization materials, and forming gold plating on the nickel plating.

In Example 3-2, with this configuration, even if stress is generated due to a thermal expansion difference between the base 1 and the circuit substrate 4, the stress can be more efficiently reduced due to a step between the bumps 12B and 13B and the terminal electrodes 12 and 13. In addition, with this configuration, the conductive adhesive material D is accumulated in a gap portion between the base 1 and the circuit substrate 4 that are separated by the bumps 12B and 13B. The accumulated conductive adhesive material D can further enhance the junction strength between the base 1 and the circuit substrate 4. Also, the bumps 12B and 138 can be formed with considerable ease and low cost by laminating the same metallization material on the terminal electrodes 12 and 13.

Also, in Example 3.2, as shown in FIGS. 34 to 36, the smallest gap dimensions G1, G2 and G3 of the first and second terminal electrodes 12 and 13 and the interconnection pads 41 and 42 are caused to be the same as each other. Moreover, not only the smallest gap dimensions G1 and G3 are caused to be the same as each other, but also the smallest gap dimensions G1, G2, G3 and G4 are all the same as each other.

Since the smallest gap dimensions G1, G2, G3 and G4 are thus all set to be the same, the fillet width dimensions F1, F2, F3 and F4 are caused to be all substantially the same for the first and second terminal electrodes 12 and 13. Therefore, the tension forces on the fillets of the conductive adhesive material D in the first and second terminal electrodes 12 and 13 are balanced in the same manner in the short side direction and in the long side direction of the crystal resonator (the base 1). Therefore, the force that two-dimensionally rotates the crystal resonator (the base 1) is not generated.

Also, in Examples 3 and 3-2 above, it has been described that, in addition to the gap dimensions G1, G2, G3 and G4, the circumferential gap region (GA1) from the edge portions of the first terminal electrode 12 to the edge portions of the interconnection pad 41, and the circumferential gap region (GA2) from the edge portions of the second terminal electrode 13 to the edge portions of the interconnection pad 42 are symmetrically arranged about the center point O1 (as viewed from above) of the bottom surface of the base 1. The present invention is not limited to this.

Moreover, although a surface mount-type crystal resonator has been described in the aforementioned examples, the present invention is applicable to other surface mount type electronic component packages used for an electronic apparatus or the like, such as a crystal filter, a crystal oscillator and the like. Note that when the electronic component package of the present invention is applied to a crystal filter, the ground terminal electrode may be used as a ground electrode for the filter. When the electronic component package of the present invention is applied to a crystal oscillator, the ground terminal electrode may be used as a member electrically connected to the metal lid, or when an IC is used as an electronic component element, it may be used as a ground terminal electrode for the IC.

The present invention can be embodied and practiced in other different forms without departing from the spirit and essential characteristics thereof. Therefore, the above-described embodiments are considered in all respects as illustrative and not restrictive. The scope of the invention is indicated by the appended claims rather than by the foregoing description. All variations and modifications falling within the equivalency range of the appended claims are intended to be embraced therein.

This application claims priority from Patent Application No. 2007-216869 filed in Japan on Aug. 23, 2007, Patent Application No. 2007-238742 filed in Japan on Sep. 14, 2007, and Patent Application No. 2007-246280 filed in Japan on Sep. 21, 2007, which are hereby incorporated by reference in its entirety. All documents cited herein are also specifically incorporated by reference in their entirety.

INDUSTRIAL APPLICABILITY

The present invention is applicable to a package for a surface mount type electronic component used for an electronic apparatus or the like, such as a surface mount-type crystal resonator, crystal filter, crystal oscillator or the like.

The invention claimed is:

1. A base of an electronic component package for holding an electronic component element, wherein
the base has a bottom surface having a rectangular shape as viewed from above, and on the bottom surface, a plurality of terminal electrodes that are to be joined to an external circuit substrate using a conductive adhesive material are formed;
a first terminal electrode group including two or more of the terminal electrodes formed in parallel is formed eccentrically to one corner position of the bottom surface;
a second terminal electrode including one of the terminal electrodes or a second terminal electrode group including two or more of the terminal electrodes formed in parallel is formed eccentrically to a first diagonal position diagonally opposite the one corner position of the bottom surface;
another corner position facing the one corner position in a short side direction of the bottom surface, and a second diagonal position diagonally opposite the other corner position of the bottom surface, are no-electrode regions in which none of the terminal electrodes is formed; and
at least one of the plurality of terminal electrodes is a ground terminal electrode.

2. An electronic component package, wherein
the electronic component package has the base for holding the electronic component element according to claim 1, and a metal lid for hermetically enclosing the electronic component element, and
the ground terminal electrode is electrically connected to the metal lid.

3. The electronic component package according to claim 2, wherein
when the first and second terminal electrode groups are formed:
in the first terminal electrode group, the terminal electrode closest to the one corner position has a larger area or a broader width than those of the other terminal electrodes; and
in the second terminal electrode group, the terminal electrode closest to the first diagonal position has a larger area or a broader width than those of the other terminal electrodes, and
when the first terminal electrode group and the second terminal electrode are formed:
in the first terminal electrode group, the terminal electrode closest to the one corner position has a larger area or a broader width than those of the other terminal electrodes.

4. The electronic component package according to claim 2, wherein
when the first terminal electrode group and the second terminal electrode group are formed:
in the first terminal electrode group, one of the terminal electrodes has a larger area or a broader width than those of the other terminal electrodes, and is electrically connected to the electronic component element; and
in the second terminal electrode group, one of the terminal electrodes has a larger area or a broader width than those of the other terminal electrodes, and is electrically connected to the electronic component element; and
when the first terminal electrode group and the second terminal electrode are formed:
in the first terminal electrode group, one of the terminal electrodes has a larger area or a broader width than those of the other terminal electrodes, and is electrically connected to the electronic component element.

5. The electronic component package according to claim 2, wherein
in the first and second terminal electrode groups, a gap dimension between the adjacent terminal electrodes is set to 0.1 mm or more, and
a dimension in the short side direction of the bottom surface of the base of the no-electrode region is set to 15% to 40% of a dimension in the short side direction of the bottom surface of the base.

6. The electronic component package according to claim 2, wherein
a bump made of the same metallization material is formed on a part of a terminal electrode.

7. The electronic component package according to claim 6, wherein
a bump is formed on the first terminal electrode or the first terminal electrode group,
a bump is formed on the second terminal electrode or the second terminal electrode group, and
the bump formed on the first terminal electrode or the first terminal electrode group, and the bump formed on the second terminal electrode or the second terminal electrode group, are separated in a long side direction of the bottom surface of the base.

8. The electronic component package according to claim 6, wherein
a bump is formed on the first terminal electrode or the first terminal electrode group,
a bump is formed on the second terminal electrode or the second terminal electrode group, and
the bump formed on the first terminal electrode or the first terminal electrode group, and the bump formed on the second terminal electrode or the second terminal electrode group, are provided close to each other in a long side direction of the bottom surface of the base.

9. A base of an electronic component package for holding an electronic component element as described in claim 1, wherein
a first terminal electrode including one of the terminal electrodes or a first terminal electrode group including two or more of the terminal electrodes formed in parallel is formed eccentrically to one corner position of the bottom surface;
a castellation is formed from at least a side surface to the bottom surface of the base, and
a side-surface terminal electrode connected to the terminal electrode is formed on the castellation.

10. A base of an electronic component package for holding an electronic component element, wherein
the base has a bottom surface having a rectangular shape as viewed from above, and on the bottom surface, a plurality of terminal electrodes that are to be joined to an external circuit substrate using a conductive adhesive material are formed;
a first terminal electrode including one of the terminal electrodes is formed eccentrically to one corner position of the bottom surface;
a second terminal electrode including one of the terminal electrodes is formed eccentrically to a first diagonal position diagonally opposite the one corner position of the bottom surface;

another corner position facing the one corner position in a short side direction of the bottom surface and a second diagonal position diagonally opposite the other corner position of the bottom surface are no-electrode regions in which none of the terminal electrodes is formed; and a ground terminal electrode is formed at a center point as viewed from above of the bottom surface, and an area of the ground terminal electrode is smaller than an area of the first terminal electrode and an area of the second terminal electrode.

11. An electronic component package, wherein the electronic component package has the base for holding the electronic component element according to claim 10, and a metal lid for hermetically enclosing the electronic component element, and the ground terminal electrode is electrically connected to the metal lid.

12. A base of an electronic component package for holding an electronic component element, wherein the base has a bottom surface having a rectangular shape as viewed from above;

and on the bottom surface, a plurality of terminal electrodes that are to be joined to an external circuit substrate using a conductive adhesive material are formed;

a first terminal electrode including one of the terminal electrodes or a first terminal electrode group including two or more of the terminal electrodes formed in parallel is formed eccentrically to one corner position of the bottom surface;

a second terminal electrode including one of the terminal electrodes or a second terminal electrode group including two or more of the terminal electrodes formed in parallel is formed eccentrically to a first diagonal position diagonally opposite the one corner position of the bottom surface;

another corner position facing the one corner position in a short side direction of the bottom surface, and a second diagonal position diagonally opposite the other corner position of the bottom surface, are no-electrode regions in which none of the terminal electrodes is formed, and a castellation is formed at least at middle portions of both short sides of the bottom surface of the base, and a side-surface terminal electrode connected to the terminal electrode is formed on the castellation.

13. An electronic component package, wherein the electronic component package has the base for holding the electronic component element according to claim 12, and a lid for hermetically enclosing the electronic component element.

14. The electronic component package according to claim 13, wherein at least the castellation is formed at both long sides of the bottom surface of the base.

15. The electronic component package according to claim 13, wherein the side-surface terminal electrode is extended to an upper edge portion of the base.

16. A junction structure between an electronic component package and a circuit substrate, wherein a rectangular interconnection pad is formed on the circuit substrate, the electronic component package has a base for holding an electronic component element, and a lid for hermetically enclosing the electronic component element, the base has a bottom surface having a rectangular shape as viewed from above, a plurality of rectangular terminal electrodes that are to be joined to the interconnection pad on the circuit substrate using a conductive adhesive material are formed on the bottom surface of the base, a first terminal electrode including one of the terminal electrodes is formed eccentrically to one corner position of the bottom surface of the base, a second terminal electrode including one of the terminal electrodes is formed eccentrically to a first diagonal position diagonally opposite the one corner position of the bottom surface of the base, the first terminal electrode and the second terminal electrode are symmetrically formed about a center point as viewed from above of the bottom surface of the base, another corner position facing the one corner position in a short side direction of the bottom surface of the base, and a second diagonal position diagonally opposite the other corner position of the bottom surface of the base, are no-electrode regions in which none of the terminal electrodes is formed, when the terminal electrode is overlaid on and joined to the interconnection pad, a smallest gap dimension from an edge portion near the no-electrode region in a plan view of the first terminal electrode in the short side direction of the bottom surface of the base to an edge portion as viewed from above of the interconnection pad, and a smallest gap dimension from an edge portion near the no-electrode region in a plan view of the second terminal electrode in the short side direction of the bottom surface of the base to an edge portion as viewed from above of the interconnection pad, are a same smallest gap dimension G1, when the terminal electrode is overlaid on and joined to the interconnection pad, a smallest gap dimension from an edge portion near the one corner in a plan view of the first terminal electrode in the short side direction of the bottom surface of the base to an edge portion as viewed from above of the interconnection pad, and a smallest gap dimension from an edge portion near the one corner in a plan view of the second terminal electrode in the short side direction of the bottom surface of the base to an edge portion as viewed from above of the interconnection pad, are a same smallest gap dimension G2, when the terminal electrode is overlaid on and joined to the interconnection pad, a smallest gap dimension from an edge portion near the no-electrode region in a plan view of the first terminal electrode in a long side direction of the bottom surface of the base to an edge portion as viewed from above of the interconnection pad, and a smallest gap dimension from an edge portion near the no-electrode region in a plan view of the second terminal electrode in the long side direction of the bottom surface of the base to an edge portion as viewed from above of the interconnection pad, are a same smallest gap dimension G3, and the smallest gap dimension G1 and the smallest gap dimension G3 are the same.

17. The junction structure between the electronic component package and the circuit substrate according to claim 16, wherein when the terminal electrode is overlaid on and joined to the interconnection pad, a smallest gap dimension from an edge portion near the one corner in a plan view of the first terminal electrode in the long side direction of the bottom surface of the base to an edge portion as viewed from above of the interconnection pad, and a smallest gap dimension from a an edge portion near the one corner in a plan view of the second terminal electrode in the long side direction of the bottom surface of the base to an edge portion as viewed from above of the interconnection pad, are a same smallest gap dimension G4.

18. The junction structure between the electronic component package and the circuit substrate according to claim 16, wherein
a bump made of the same metallization material is formed on a part of the terminal electrodes.

19. A base of an electronic component package for holding an electronic component element, wherein
the base has a bottom surface having a rectangular shape as viewed from above, and on the bottom surface, a plurality of terminal electrodes that are to be joined to an external circuit substrate using a conductive adhesive material are formed,
a first terminal electrode including one of the terminal electrodes is formed eccentrically to one corner position of the bottom surface,
a second terminal electrode including one of the terminal electrodes is formed eccentrically to a first diagonal position diagonally opposite the one corner position of the bottom surface,
another corner position facing the one corner position in a short side direction of the bottom surface, and a second diagonal position diagonally opposite the other corner position of the bottom surface, are no-electrode regions in which none of the terminal electrodes is formed, and
a division line along a side direction of the bottom surface is provided, and at least one of the first and second terminal electrodes is divided by the division line.

20. An electronic component package, wherein
the electronic component package has the base for holding the electronic component element according to claim 19, and a lid for hermetically enclosing the electronic component element.

21. The electronic component package according to claim 20, wherein
the first and second terminal electrodes are each divided by the division line, and
division electrodes obtained by dividing the first and second terminal electrodes by the division line and closer to the no-electrode regions are provided at middle portions of both short sides of the bottom surface of the base, facing each other.

22. The electronic component package according to claim 20, wherein
the division electrodes are ground terminal electrodes electrically connected to the lid.

* * * * *